US009502224B2

(12) United States Patent
Miyashita et al.

(10) Patent No.: US 9,502,224 B2
(45) Date of Patent: Nov. 22, 2016

(54) MAGNETRON SPUTTERING TARGET AND METHOD FOR MANUFACTURING THE SAME

(71) Applicant: TANAKA KIKINZOKU KOGYO K.K., Tokyo (JP)

(72) Inventors: Takanobu Miyashita, Tsukuba (JP); Yasuyuki Goto, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 0 days.

(21) Appl. No.: 14/357,852

(22) PCT Filed: Oct. 12, 2012

(86) PCT No.: PCT/JP2012/076395
§ 371 (c)(1),
(2) Date: May 13, 2014

(87) PCT Pub. No.: WO2013/073323
PCT Pub. Date: May 23, 2013

(65) Prior Publication Data
US 2014/0311901 A1    Oct. 23, 2014

(30) Foreign Application Priority Data
Nov. 17, 2011   (JP) .................................. 2011-252103

(51) Int. Cl.
*C23C 14/34* (2006.01)
*H01J 37/34* (2006.01)
(Continued)

(52) U.S. Cl.
CPC ............. *H01J 37/3429* (2013.01); *B22F 3/00* (2013.01); *B22F 3/14* (2013.01); *C22C 1/04* (2013.01);
(Continued)

(58) Field of Classification Search
CPC ........... C23C 14/3407; C23C 14/3414; H01J 37/3429; H01J 37/3426; B22F 3/00; B22F 3/14; C22C 1/04; C22C 1/0433; C22C 1/05; C22C 5/04; C22C 19/07; C22C 27/06; H01F 41/183
USPC ..................................... 204/298.13
See application file for complete search history.

(56) References Cited

U.S. PATENT DOCUMENTS 6,797,137 B2 *  9/2004  Sandlin et al. .......... 204/298.13
2003/0228718 A1 * 12/2003  Murti .................. H01L 51/0545
                                                              438/99
(Continued)

FOREIGN PATENT DOCUMENTS

JP    A-2008-163438    7/2008
JP    A-2009-132975    6/2009
(Continued)

OTHER PUBLICATIONS

Translation to Igarashi (JP 2011-175725) published Sep. 2011.*
(Continued)

*Primary Examiner* — John Brayton
(74) *Attorney, Agent, or Firm* — Oliff PLC

(57) ABSTRACT

Provided is a magnetron sputtering target having a ferromagnetic metal element. This magnetron sputtering target includes: a magnetic phase containing the ferromagnetic metal element; a plurality of non-magnetic phases that each contain the ferromagnetic metal element and that are different in constituent elements or a content ratio of constituent elements; and an oxide phase. At least one of the plurality of non-magnetic phases is more finely interdispersed with the oxide phase than the magnetic phase.

38 Claims, 18 Drawing Sheets

(51) Int. Cl.
    *B22F 3/00*     (2006.01)
    *C22C 1/04*     (2006.01)
    *C22C 1/05*     (2006.01)
    *C22C 5/04*     (2006.01)
    *C22C 19/07*     (2006.01)
    *C22C 27/06*     (2006.01)
    *G11B 5/851*     (2006.01)
    *B22F 3/14*     (2006.01)
    *H01F 41/18*     (2006.01)

(52) U.S. Cl.
    CPC ............... *C22C 1/0433* (2013.01); *C22C 1/05* (2013.01); *C22C 5/04* (2013.01); *C22C 19/07* (2013.01); *C22C 27/06* (2013.01); *C23C 14/3414* (2013.01); *G11B 5/851* (2013.01); *H01F 41/183* (2013.01); *H01J 37/3426* (2013.01)

(56) References Cited

U.S. PATENT DOCUMENTS

| | | | |
|---|---|---|---|
| 2005/0277002 A1* | 12/2005 | Ziani et al. | 428/846 |
| 2007/0189916 A1* | 8/2007 | Zhang | 419/66 |
| 2008/0202916 A1* | 8/2008 | Chung | C23C 14/3414 204/192.1 |
| 2009/0173627 A1* | 7/2009 | Suzuki | 204/298.13 |
| 2009/0308740 A1 | 12/2009 | Kato et al. | |
| 2011/0247930 A1* | 10/2011 | Sato | 204/298.13 |
| 2013/0213804 A1* | 8/2013 | Arakawa | G11B 5/851 204/298.13 |

FOREIGN PATENT DOCUMENTS

| | | | |
|---|---|---|---|
| JP | A-2009-293102 | | 12/2009 |
| JP | B1-4422203 | | 2/2010 |
| JP | 4499183 B2 | | 7/2010 |
| JP | 4673453 B1 | | 4/2011 |
| JP | 2011175725 A | * | 9/2011 |
| JP | A-2012-036452 | | 2/2012 |
| TW | 200837209 A | | 9/2008 |
| TW | 201111535 A | | 4/2011 |
| TW | 201125997 A | | 8/2011 |
| WO | PCT/JP2011/079057 | * | 6/2012 |

OTHER PUBLICATIONS

Dec. 25, 2012 International Search Report issued in International Application No. PCT/JP2012/076395.

Jul. 30, 2015 Information Offer Form issued in Japanese Application No. 2011-252103.

* cited by examiner

MAGNETRON SPUTTERING TARGET AND METHOD FOR MANUFACTURING THE SAME

TECHNICAL FIELD

The present invention relates to a magnetron sputtering target containing a ferromagnetic metal element and to a method for manufacturing the same.

BACKGROUND ART

In magnetron sputtering, magnets are disposed on the rear side of a target, and leakage magnetic flux flowing toward the front side of the target causes plasma to be concentrated at high density. This allows stable high-rate sputtering.

Therefore, the target used for magnetron sputtering is required to allow a large amount of leakage magnetic flux to flow toward the front side of the target.

For example, Patent Literature 1 discloses a magnetron sputtering target containing Co. More specifically, this magnetron sputtering target includes a magnetic phase containing Co, a non-magnetic phase containing Co, and an oxide phase, and the magnetic phase, the non-magnetic phase, and the oxide phase are dispersed in each other. The magnetic phase contains Co and Cr as main components, and the ratio of the amount of Co contained in the magnetic phase is not less than 76 at % and not more than 80 at %. Patent Literature 1 discloses another magnetron sputtering target containing Co. More specifically, this magnetron sputtering target includes a magnetic phase containing Co and a non-magnetic phase containing Co, and the magnetic phase and the non-magnetic phase are dispersed in each other. The non-magnetic phase is a Pt—Co alloy phase containing Pt as a main component, and the ratio of the amount of Co contained in the Pt—Co alloy phase is more than 0 at % and not more than 13 at %.

These magnetron sputtering targets allow an increased amount of leakage magnetic flux to flow from the surfaces of the targets during magnetron sputtering without reducing the amount of Co, or a ferromagnetic metal element, contained in the targets, so that magnetron sputtering can be performed favorably.

CITATION LIST

Patent Literature

Patent Literature 1: Japanese Patent No. 4422203

SUMMARY OF INVENTION

Technical Problem

However, there is a need to further increase the amount of leakage magnetic flux during magnetron sputtering without reducing the amount of the ferromagnetic metal element contained in the target.

The present invention has been made in view of the foregoing circumstances, and it is an object to provide a magnetron sputtering target that allows an increased amount of leakage magnetic flux to flow during magnetron sputtering as compared to that in conventional targets, without reducing the amount of the ferromagnetic metal element contained in the target, as well as to provide a method for manufacturing the magnetron sputtering target.

Solution to Problem

The above object of the present invention is achieved by providing a magnetron sputtering target having a ferromagnetic metal element, the magnetron sputtering target comprising: a magnetic phase containing the ferromagnetic metal element; a plurality of non-magnetic phases that each contain the ferromagnetic metal element and that are different in constituent elements or a content ratio of constituent elements; and an oxide phase, wherein at least one of the plurality of non-magnetic phases is more finely interdispersed with the oxide phase than the magnetic phase.

Herein, the "magnetic phase" is a phase with magnetism (except for phases with magnetism sufficiently lower than the magnetism of ordinary magnetic substances), and the "non-magnetic phase" is a concept including not only phases with no magnetism but also phases with magnetism sufficiently lower than the magnetism of ordinary magnetic substances.

In the present invention, there are disposed the plurality of non-magnetic phases that each contain the ferromagnetic metal element and that are different in constituent elements or the content ratio of constituent elements. Therefore, the volume fraction of the magnetic phase containing the ferromagnetic metal element relative to the whole target can be reduced compared with that of the conventional target, while the amount of the ferromagnetic metal element in the whole target is maintained at a certain level. Thus, the magnetism of the whole target can be reduced compared with that of the conventional target. Accordingly, the amount of the leakage magnetic flux from the target surface during magnetron sputtering can be increased compared with that of the conventional target, without reducing the content of the ferromagnetic metal element contained in the target. Thus, magnetron sputtering can be favorably performed.

Here, "at least one of the plurality of non-magnetic phases is more finely interdispersed with the oxide phase than the magnetic phase" means that the average size of the at least one non-magnetic phase, which is interdispersed with the oxide phase, of the plurality of non-magnetic phases is smaller than the average size of the magnetic phase.

According to the present invention, at least one of the plurality of non-magnetic phases is more finely interdispersed with the oxide phase than the magnetic phase. Therefore, even when the size of the magnetic phase is made relatively larger (even when the average size of the magnetic phase is set to fall in the range of, for example, 40 μm or larger and 80 μm or smaller), the oxides are inhibited from aggregating to generate a large oxide phase. Accordingly, failure such as nodules and particles during sputtering is unlikely to generate.

Furthermore, when one of the plurality of non-magnetic phases is more finely interdispersed with the oxide phase than other non-magnetic phases, the sizes of other non-magnetic phases can be increased to some extent. Therefore, there is a possibility that the amount of the leakage magnetic flux from the target surface can be further increased. Here, "one of the plurality of non-magnetic phases is more finely interdispersed with the oxide phase than other non-magnetic phases" means that the average size of the one non-magnetic phase of the plurality of non-magnetic phases is smaller than the average sizes of other non-magnetic phases.

The average size of the magnetic phase is preferably 40 μm or larger and 80 μm or smaller, from the viewpoint of further increasing the amount of the leakage magnetic flux from the target surface.

The plurality of non-magnetic phases may be, for example, two non-magnetic phases.

The ferromagnetic metal element is, for example, Co. In this case, when magnetron sputtering is performed using the target, a magnetic recording medium having high magnetic recording characteristics can be easily obtained.

The magnetic phase may be, for example, a Co—Cr alloy phase containing Co and Cr as main components. In this case, the ratio of the amount of Co contained in the magnetic phase is preferably 85 at % or more, from the viewpoint of increasing the amount of leakage magnetic flux from the surface of the target by increasing the volume fraction of the non-magnetic phases relative to the total volume of the target to reduce the volume fraction of the magnetic phase. Moreover, from the above-described point of view, the magnetic phase is more preferably a phase composed only of Co.

Preferably, at least one of the non-magnetic phases is a Co—Cr alloy phase in which the ratio of the amount of Co is more than 0 at % and 75 at % or less or a Co—Cr—Pt alloy phase in which the ratio of the amount of Co is more than 0 at % and 73 at % or less. Preferably, at least one of the non-magnetic phases is a Co—Pt alloy phase in which the ratio of the amount of Co is more than 0 at % and 12 at % or less.

For example, the oxide phase may contain at least one of $SiO_2$, $TiO_2$, $Ti_2O_3$, $Ta_2O_5$, $Cr_2O_3$, CoO, $Co_3O_4$, $B_2O_3$, $Fe_2O_3$, CuO, $Y_2O_3$, MgO, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

The target may be preferably used to form a magnetic recording layer.

The target can be manufactured by, for example, a manufacturing method of a magnetron sputtering target, the method including the steps of: mixing and dispersing a first non-magnetic metal powder containing a ferromagnetic metal element and an oxide powder to obtain a non-magnetic powder mixture; and mixing and dispersing the obtained non-magnetic powder mixture, a magnetic metal powder containing the ferromagnetic metal element, and a second non-magnetic metal powder containing the ferromagnetic metal element and being different in constituent elements or the content ratio of constituent elements from the first non-magnetic metal powder to obtain a powder mixture for pressure sintering.

The target can be manufactured by, for example, a manufacturing method of a magnetron sputtering target, the method including the steps of: mixing and dispersing a first non-magnetic metal powder containing a ferromagnetic metal element and an oxide powder to obtain a non-magnetic powder mixture; and mixing and dispersing the obtained non-magnetic powder mixture, a magnetic metal powder containing the ferromagnetic metal element, a second non-magnetic metal powder containing the ferromagnetic metal element and being different in constituent elements or the content ratio of constituent elements from the first non-magnetic metal powder, and an oxide powder to obtain a powder mixture for pressure sintering.

Herein, the "magnetic metal powder" is a powder with magnetism (except for powders with magnetism sufficiently lower than the magnetism of ordinary magnetic substances), and the "non-magnetic powders" are a concept including not only powders with no magnetism but also powders with magnetism sufficiently lower than the magnetism of ordinary magnetic substances.

The number of types of the non-magnetic metal powders used in the above-described manufacturing method may be, for example, two.

For example, the ferromagnetic metal element is Co. In this case, when magnetron sputtering is performed using the target manufactured by the above-described manufacturing method, a magnetic recording medium having high magnetic recording characteristics can be easily obtained.

When the magnetic metal powder contains Co and Cr as main components, the ratio of the amount of Co contained in the magnetic metal powder is preferably 85 at % or more from the viewpoint of improving the leakage magnetic flux ratio of a target to be manufactured. The magnetic metal powder is more preferably composed only of Co.

Preferably, at least one of the plurality of non-magnetic metal powders is a Co—Cr alloy in which the ratio of the amount of Co is more than 0 at % and 75 at % or less or a Co—Cr—Pt alloy in which the ratio of the amount of Co is more than 0 at % and 73 at % or less. Preferably, at least one of the plurality of non-magnetic metal powders is a Co—Pt alloy in which the ratio of the amount of Co is more than 0 at % and 12 at % or less.

Advantageous Effects of Invention

According to the present invention, the amount of the leakage magnetic flux from the target surface during magnetron sputtering can be increased compared with that of the conventional target, without reducing the content of the ferromagnetic metal element contained in the target. Therefore, magnetron sputtering can be favorably performed, and failure such as nodules and particles during sputtering is unlikely to occur.

DESCRIPTION OF EMBODIMENTS

Figure 1:
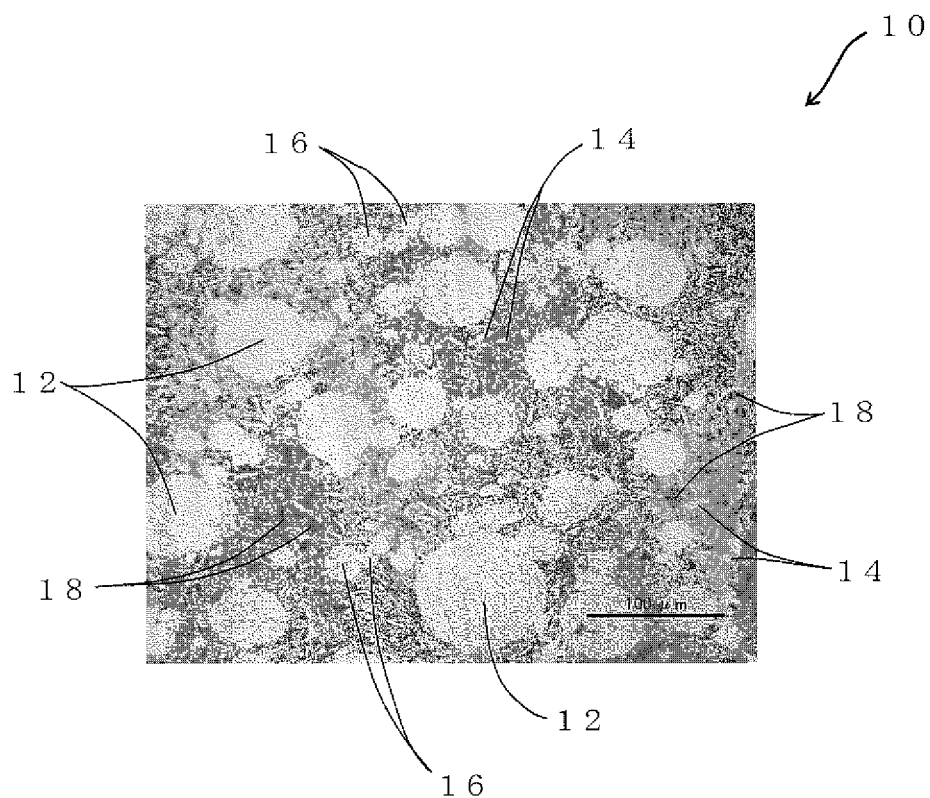
FIG. 1 is a metallurgical microscope photograph showing an example of the microstructure of a target according to an embodiment.

The magnetron sputtering target according to the present invention is a magnetron sputtering target having a ferromagnetic metal element, the magnetron sputtering target comprising: a magnetic phase containing the ferromagnetic metal element; a plurality of non-magnetic phases that each contain the ferromagnetic metal element and that are different in constituent elements or a content ratio of constituent elements; and an oxide phase, wherein at least one of the plurality of non-magnetic phases is more finely interdispersed with the oxide phase than the magnetic phase.

In the present invention, a plurality of non-magnetic phases that each contain the ferromagnetic metal element and that are different in constituent elements or a content ratio of constituent elements, are provided. This allows the volume fraction of the non-magnetic phases with respect to the total volume of the target to increase while the ratio of the amounts of the constituent elements including the ferromagnetic metal element in the entire target is held constant, and the volume fraction of the magnetic phase with respect to the total volume of the target can be reduced. Therefore, the magnetism of the target as a whole can be reduced, and the amount of leakage magnetic flux from the surface of the target during magnetron sputtering can be increased, so that magnetron sputtering can be performed favorably.

For example, as described later, the magnetism of a Co—Cr alloy is substantially zero when the ratio of the amount of Co is 75 at % or less. The magnetism of a Co—Pt alloy is substantially zero when the ratio of the amount of Co is 12 at % or less. Therefore, when the target contains three metal elements, that is, Co, Cr, and Pt, it is more preferable to use two non-magnetic phases of a Co—Cr alloy phase containing Co in an amount of 75 at % or less and a Co—Pt alloy phase containing Co in an amount of 12 at % or less than one non-magnetic phase of a Co—Cr alloy phase containing Co in an amount of 75 at % or less or a Co—Pt alloy phase containing Co in an amount of 12 at % or less. This is because the volume fraction of the non-magnetic phases with respect to the total volume of the target can be increased while the overall composition of the target is held constant, so that the volume fraction of the magnetic phase with respect to the total volume of the target can be reduced.

As described above, when a plurality of non-magnetic phases that each contain the ferromagnetic metal element and that are different in constituent elements or a content ratio of constituent elements, are used instead of one non-magnetic phase, the volume fraction of the non-magnetic phases with respect to the total volume of the target can be increased while the overall composition of the target is held constant, so that the volume fraction of the magnetic phase with respect to the total volume of the target can be reduced. The magnetism of the target as a whole can thereby be reduced.

When the volume fraction of the non-magnetic phases with respect to the total volume of the target is increased while the overall composition of the target is held constant, the volume fraction of the magnetic phase is reduced, and the ratio of the amount of the ferromagnetic metal element contained in the magnetic phase increases. However, as described later, when, for example, the ratio of the amount of Co contained in the Co—Cr alloy is 85 at % or more, the magnetism of such a Co—Cr alloy is substantially the same as the magnetism of Co itself. Even when the ratio of the amount of Co is increased further, the magnetism is held substantially constant. Therefore, it is conceivable that, when the ratio of the amount of the ferromagnetic metal element contained in the magnetic phase is equal to or larger than a certain value, the magnetism of the magnetic phase does not increase significantly even when the ratio of the amount of the ferromagnetic metal element contained in the magnetic phase is increased further. For this reason, even when the ratio of the amount of the ferromagnetic metal element contained in the magnetic phase is high, the magnetism of the target as a whole can be reduced by increasing the volume fraction of the non-magnetic phases with respect to the total volume of the target to reduce the volume fraction of the magnetic phase with respect to the total volume of the target.

Although the reason is not made clear at this stage, when the size of the magnetic phase is made relatively large (when the average size of the magnetic phase is set to fall in the range of, for example, 40 μm or larger and 80 μm or smaller), the amount of the leakage magnetic flux from the target surface can be further increased. Therefore, it is preferable that the size of the magnetic phase be made relatively large (the average size of the magnetic phase be set to fall in the range of, for example, 40 μm or larger and 80 μm or smaller). Here, in the present invention, at least one of the plurality of non-magnetic phases is more finely interdispersed with the oxide phase than the magnetic phase. Therefore, even when the size of the magnetic phase is made relatively larger (even when the average size of the magnetic phase is set to fall in the range of, for example, 40 μm or larger and 80 μm or smaller), the oxides are inhibited from aggregating to generate a large oxide phase. Accordingly, failure such as nodules and particles during sputtering is unlikely to occur.

When the average size of the magnetic phase falls below 40 μm, the effect of increasing the amount of the leakage magnetic flux from the target surface is reduced. When the average size of the magnetic phase exceeds 80 μm, the uniformity of the structure of the target collapses to an extremely large extent. Accordingly, failure during sputtering can occur.

Here, when calculating the size of the magnetic phase herein, the values of the major axis and the minor axis of a white phase which is considered as the magnetic phase are calculated in the metallurgical microscope photograph at a photographing magnification of 400 times, and the average value of these values is determined to be the size of an individual magnetic phase. Then, the sizes of all white phases which are considered as the magnetic phases in the metallurgical microscope photograph at a photographing magnification of 400 times are calculated, and the average value of these calculated phase sizes is determined to be the average size of the magnetic phase. However, it is considered that a magnetic phase having a size of 10 m or smaller has an extraordinarily small effect on the amount of the leakage magnetic flux of the target. Therefore, such a magnetic phase is ignored when calculating the average size of the magnetic phase.

Since the magnetron sputtering target according to the present invention contains the ferromagnetic metal element, the magnetron sputtering target can be used for the preparation of a magnetic recording medium. The ferromagnetic metal element which can be employed in the present invention is not particularly limited, and Co, Fe and Ni, for example, can be employed. When Co is employed as the ferromagnetic metal element, a recording layer (a magnetic layer) having a large coercive force can be easily formed, and a target suitable for the preparation of a hard disk is likely to be obtained.

No particular limitation is imposed on metal elements other than the ferromagnetic metal element contained in the magnetic phase and the non-magnetic phases in the magnetron sputtering target according to the present invention. For example, the magnetic phase and/or the non-magnetic phases can contain any of metal elements such as Cr, Pt, Au, Ag, Ru, Rh, Pd, Ir, W, Ta, Cu, B, and Mo.

A non-magnetic phase without containing the ferromagnetic metal element may also be provided. That is, a nonmagnetic phase without containing the ferromagnetic metal element may be provided, other than the magnetic phase containing the ferromagnetic metal element and the plurality of non-magnetic phases that each contain the ferromagnetic metal element and that are different in constituent elements or the content ratio of constituent elements. As the non-magnetic phase without containing the ferromagnetic metal element, a phase containing a metal element such as Cr, Pt, Au, Ag, Ru, Rh, Pd, Ir, W, Ta, Cu, B, and Mo may be provided.

Hereinafter, a Co—Cr—Pt—$SiO_2$—$TiO_2$—$Cr_2O_3$ target which can be suitably employed for the preparation of a magnetic recording layer will be specifically described as one embodiment of the present invention. In the present embodiment, a metal phase has a three-phase structure including one magnetic phase and two non-magnetic phases. However, two or more magnetic phases that are different in constituent elements or the content ratio of constituent elements may be included as the magnetic phase; and the three or more non-magnetic phases that are different in constituent elements or the content ratio of constituent elements may be included as the non-magnetic phase. Furthermore, the target may have a multiple-phase structure with four or more phases.

1. Constituent Components of Target

The constituent components of the target according to this embodiment are Co—Cr—Pt—$SiO_2$—$TiO_2$—$Cr_2O_3$. Co, Cr, and Pt are the constituent components forming magnetic particles (fine magnets) in a granular structure in a magnetic recording layer formed by sputtering. The oxides ($SiO_2$, $TiO_2$, and $Cr_2O_3$) form a non-magnetic matrix that separates the magnetic particles (fine magnets) in the granular structure from each other.

The ratio of the amounts of the metals (Co, Cr, and Pt) and the ratio of the amounts of the oxides ($SiO_2$, $TiO_2$, and $Cr_2O_3$) with respect to the total amount of the target are determined according to the intended composition of the magnetic recording layer. The ratio of the amounts of the metals with respect to the total amount of the target is 88 mol % or more and 94 mol % or less, and the ratio of the amounts of the oxides ($SiO_2$, $TiO_2$, and $Cr_2O_3$) with respect to the total amount of the target is 6 mol % or more and 12 mol % or less.

Co is a ferromagnetic metal element and plays a central role in the formation of the magnetic particles (fine magnets) in the granular structure of the magnetic recording layer. The ratio of the amount of Co with respect to the total amount of the metals (Co, Cr, and Pt) is 60 at % or more and 80 at % or less.

Cr has a function of reducing the magnetic moment of Co when alloyed with Co within a prescribed composition range and plays a role in controlling the strength of the magnetism of the magnetic particles. The ratio of the amount of Cr with respect to the total amount of the metals (Co, Cr, and Pt) is 4 at % or more and 24 at % or less.

Pt has a function of increasing the magnetic moment of Co when alloyed with Co within a prescribed composition range and plays a role in controlling the strength of the magnetism of the magnetic particles. The ratio of the amount of Pt with respect to the total amount of the metals (Co, Cr, and Pt) is 1 at % or more and 22 at % or less.

In this embodiment, $SiO_2$, $TiO_2$, and $Cr_2O_3$ are used as the oxides, but the oxides used are not limited to $SiO_2$, $TiO_2$, and $Cr_2O_3$. For example, at least one oxide selected from $SiO_2$, $TiO_2$, $Ti_2O_3$, $Ta_2O_5$, $Cr_2O_3$, CoO, $Co_3O_4$, $B_2O_3$, $Fe_2O_3$, CuO, $Y_2O_3$, MgO, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$ and $NiO_2$ may be used.

2. Microstructure of Target

As shown in FIG. 1 (a SEM photograph of the cross section in the thickness direction of a target according to Example 1) as an example, in a microstructure of a target 10 according to the present embodiment, a magnetic phase 12 (a Co—Cr alloy phase wherein the content ratio of Co is 85 at % or more), a first non-magnetic phase 14 (a Co—Cr—Pt alloy phase wherein the content ratio of Co is more than 0 at % and 73 at % or less), and a second non-magnetic phase 16 (a Co—Pt alloy phase wherein the content ratio of Co is more than 0 at % and 12 at % or less) are interdispersed with each other; and the first non-magnetic phase 14 (the Co—Cr—Pt alloy phase wherein the content ratio of Co is more than 0 at % and 73 at % or less) and an oxide phase 18 (a $SiO_2$—$TiO_2$—$Cr_2O_3$ phase) are more finely interdispersed with the oxide phase 18 than the magnetic phase 12 and the second non-magnetic phase 16. In this embodiment, the magnetic phase 12 (the Co—Cr alloy phase containing Co in an amount of 85 at % or more) may be a Co single-element phase containing 100 at % of Co, and the Co—Cr alloy phase containing Co in an amount of 85 at % or more includes a Co single-element phase containing 100 at % of Co.

In FIG. 1, the magnetic phase 12 is a large white phase having an approximately circular shape; the first non-magnetic phase 14 is a white fine elongated phase which is finely interdispersed with the oxide phase 18; the second non-magnetic phase 16 is a small white phase having an approximately circular shape; and the oxide phase 18 is a dark gray phase.

FIG. 1 is a metallurgical microscope photograph of the cross section of the sintered body prepared in Example 1, and is conveniently presented here merely for explaining the structure of the target 10 according to the present embodiment. The target according to the present embodiment is not limited to Example 1. The composition described here may not correspond to an actual composition of the phases indicated by the reference sign in Example 1.

In this embodiment, the three-phase structure including one magnetic phase (the Co—Cr alloy phase containing Co in an amount of 85 at % or more) and two non-magnetic phases (the Co—Cr—Pt alloy phase containing Co in an amount of more than 0 at % and 73 at % or less and the Co—Pt alloy phase containing Co in an amount of more than 0 at % and 12 at % or less) is used instead of a single Co—Cr—Pt alloy phase. This allows the volume fraction of the magnetic phase with respect to the total volume of the target to be reduced while the ratio of the amounts of the constituent elements including the ferromagnetic metal element contained in the entire target is held constant. With this configuration, the magnetism of the target as a whole can be reduced while the ratio of the amounts of the constituent elements contained in the target is held constant. Therefore, the amount of leakage magnetic flux from the surface of the target during magnetron sputtering can be increased, and magnetron sputtering can thereby be performed favorably.

The reason why the ratio of the amount of Co contained in the Co—Cr alloy phase (magnetic phase) is set to 85 at % or more in this embodiment will be described.

Figure 2:
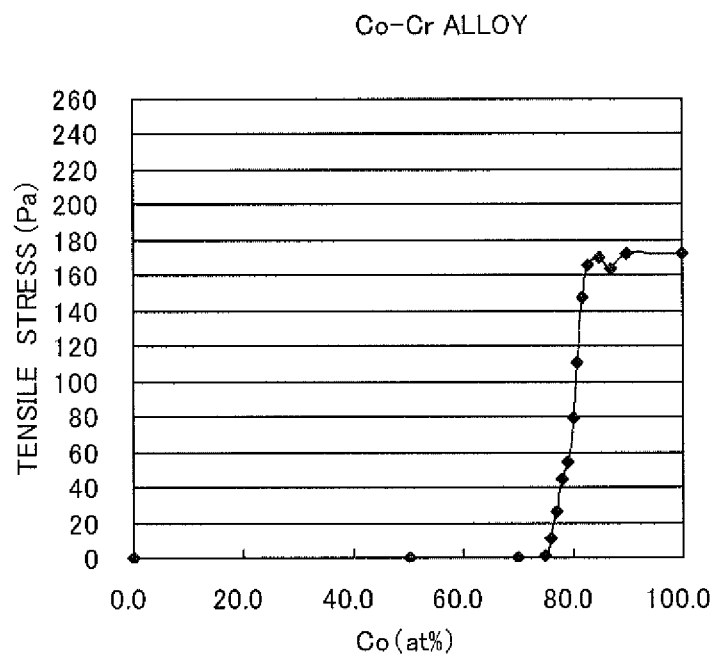
FIG. 2 is a graph showing the relationship between the ratio of the amount of Co and magnetism of a Co—Cr alloy.

TABLE 1 below shows the experimental results of the measurement of the tensile stresses of Co—Cr alloys with different ratios of amounts of Co. The tensile stress is used as a measure for evaluation of magnetism (the larger the value of the tensile stress, the larger the magnetism, as described later). FIG. 2 is a graph based on TABLE 1 below and showing the relationship between the ratio of the amount of Co in the Co—Cr alloy and its magnetism. The horizontal axis represents the ratio of the amount of Co, and the vertical axis represents the tensile stress used as the measure of evaluation of magnetism.

TABLE 1

| Ratio of amount of Co (at %) | Tensile stress (Pa) |
| --- | --- |
| 0 | 0.0 |
| 50 | 0.0 |
| 70 | 0.0 |
| 75 | 1.1 |
| 76 | 11.2 |
| 77 | 26.2 |
| 78 | 44.6 |
| 79 | 54.6 |
| 80 | 79.5 |
| 81 | 110.4 |
| 82 | 147.4 |
| 83 | 165.3 |
| 85 | 169.9 |
| 87 | 164.1 |
| 90 | 172.4 |
| 100 | 172.8 |

As shown in TABLE 1 and FIG. 2, the magnetism of a Co—Cr alloy is substantially zero when the ratio of the amount of Co is 75 at % or less. When the ratio of the amount of Co exceeds 75 at %, the magnetism increases steeply. When the ratio of the amount of Co is 83 at % or more, the gradient of the increase in magnetism decreases, and the magnetism becomes substantially constant. Therefore, in the Co—Cr alloy which is the magnetic phase, even when the ratio of the amount of Co is increased from 83 at %, almost no increase in the magnetism from that when the ratio of the amount of Co is 83 at % or more occurs.

Therefore, in this embodiment, the ratio of the amount of Co contained in the Co—Cr alloy phase is set to 85 at % or more. More specifically, the ratio of the amount of Co contained in the Co—Cr alloy phase which is the magnetic phase is increased with almost no increase in the magnetism from that when the ratio of the amount of Co is 83 at %. The larger the ratio of the amount of Co contained in the Co—Cr alloy phase, the smaller the volume fraction of the Co—Cr alloy phase which is the magnetic phase can be while the ratio of the amount of Co with respect to the total amount of the target is held constant, and the larger the volume fraction of the non-magnetic phases (the Co—Cr—Pt alloy phase containing Co in an amount of more than 0 at % and 73 at % or less and the Co—Pt alloy phase containing Co in an amount of more than 0 at % and 12 at % or less) can be. The magnetism of the target as a whole can thereby be reduced.

Next, the reason why the ratio of the amount of Co contained in the Co—Cr—Pt alloy phase is set to be more than 0 at % and 73 at % or less will be described.

As shown in TABLE 1 and FIG. 2, in the Co—Cr alloy, when the ratio of the amount of Co to the total amount of Co and Cr is 75 at % or less, the Co—Cr alloy can contain Co with the magnetism of the Co—Cr alloy being substantially zero. It is conceivable that a Co—Cr—Pt alloy prepared by adding Pt to the Co—Cr alloy shows a similar tendency. Therefore, it is conceivable that, when the ratio of the amount of Co to the total amount of Co, Cr, and Pt is 75 at % or less, the Co—Cr alloy can contain Co with the magnetism of the alloy being substantially zero. However, as described above, Pt has a function of increasing the magnetic moment of Co when alloyed with Co within a prescribed composition range. Therefore, in this embodiment, the ratio of the amount of Co to the total amount of Co, Cr, and Pt is set to 73 at % or less. In Examples described later, a large leakage magnetic flux ratio was actually obtained when the first non-magnetic phase was a 68Co-22Cr-10Pt alloy phase (the ratio of the amount of Co was 68 at % and was not more than 73 at %). However, when the ratio of the amount of Co is zero, the Co—Cr—Pt alloy phase which is the non-magnetic phase does not contain Co, and this does not contribute to a reduction in the volume fraction of the Co—Cr alloy phase (magnetic phase) while the ratio of the amounts of the constituent elements including Co contained in the entire target 10 is held constant. Therefore, in this embodiment, the ratio of the amount of Co contained in the Co—Cr—Pt alloy phase is set to be more than 0 at % and 73 at % or less. This allows the volume fraction of the Co—Cr alloy phase (magnetic phase) to be reduced while the ratio of the amounts of the constituent elements including Co contained in the target 10 is held constant. The magnetism of the target as a whole is thereby reduced, and magnetron sputtering can be performed favorably.

Next, the reason why the ratio of the amount of Co contained in the Co—Pt alloy phase is set to be more than 0 at % and 12 at % or less will be described.

Figure 3:
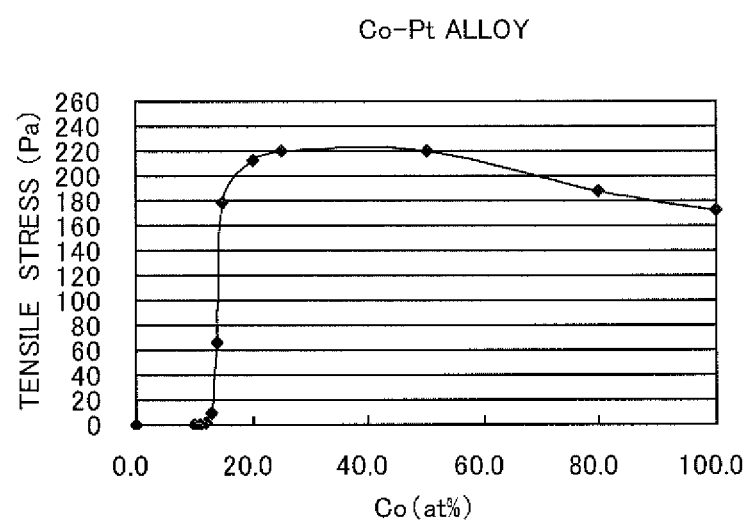
FIG. 3 is a graph showing the relationship between the ratio of the amount of Co and magnetism of a Co—Pt alloy.

TABLE 2 below shows the experimental results of the measurement of the tensile stresses of Co—Pt alloys with different amounts of Co. The tensile stress was used as a measure for evaluation of magnetism (the larger the value of the tensile stress, the larger the magnetism, as described later). FIG. 3 is a graph based on TABLE 2 below and showing the relationship between the ratio of the amount of Co contained in the Co—Pt alloy and its magnetism. The horizontal axis represents the ratio of the amount of Co, and the vertical axis represents the tensile stress used as the measure of evaluation of magnetism.

TABLE 2

| Ratio of amount of Co (at %) | Tensile stress (Pa) |
| --- | --- |
| 0 | 0.0 |
| 10 | 0.2 |
| 11 | 0.5 |
| 12 | 0.8 |
| 13 | 9.6 |
| 14 | 66.6 |
| 15 | 179.1 |
| 20 | 212.4 |
| 25 | 220.7 |
| 50 | 220.7 |
| 80 | 187.4 |
| 100 | 172.8 |

As shown in TABLE 2 and FIG. 3, in the Co—Pt alloy, when the ratio of the amount of Co to the total amount of Co and Pt is 12 at % or less, the Co—Pt alloy can contain Co with the magnetism of the Co—Pt alloy being substantially zero. However, when the ratio of the amount of Co is zero, there is no contribution to a reduction in the magnetism of the target as a whole by reducing the volume fraction of the Co—Cr alloy phase (magnetic phase) while the ratio of the amounts of the constituent elements including Co contained in the target 10 is held constant. Therefore, in this embodiment, the ratio of the amount of Co contained in the Co—Pt alloy phase is set to be more than 0 at % and 12 at % or less. This allows the volume fraction of the Co—Cr alloy phase (magnetic phase) to be reduced while the ratio of the amounts of the constituent elements including Co contained in the target 10 is held constant. The magnetism of the target as a whole is thereby reduced, and magnetron sputtering can be performed preferably.

The data in TABLES 1 and 2 and FIGS. 2 and 3 were measured by the present inventors and more specifically were measured as follows. The data in TABLE 1 and FIG. 2 was measured as follows. Co and Cr were mixed to obtain mixtures with a volume of 1 cm³ and different compositions. These mixtures were arc-melted to produce disk-shaped samples having a bottom area of 0.785 cm². The bottom surface of one of the disk-shaped samples was attached to a magnet (formed of ferrite) having a residual magnetic flux density of 500 Gauss. Then the sample was pulled in a direction perpendicular to the bottom surface, and a force when the sample was detached from the magnet was measured. Since a tensile stress determined by dividing the measured force by the bottom surface area 0.785 cm² is positively correlated with the magnetism of the sample, the tensile stress was used as the measure for evaluation of magnetism, and the value of the tensile stress was shown in TABLE 1 and plotted on the vertical axis in FIG. 2. The data in TABLE 2 and FIG. 3 were obtained as in the data in TABLE 1 and FIG. 2 except that Pt and Co were mixed to obtain mixtures having a volume of 1 cm³.

As described above, in the target 10 in this embodiment, the non-magnetic phases containing Co, or the Co—Cr—Pt alloy phase (containing Co in an amount of more than 0 at % and 73 at % or less) and the Co—Pt alloy phase (containing Co in an amount of more than 0 at % and 12 at % or less), are provided. Therefore, the volume fraction of the Co—Cr alloy phase which is the magnetic phase can be reduced while the ratio of the amounts of the constituent elements including Co contained in the target 10 can be held constant, and the magnetism of the target 10 as a whole can thereby be reduced. In the Co—Cr alloy phase which is the magnetic phase, the ratio of the amount of Co is 85 at % or more. Therefore, the ratio of the amount of Co contained in the Co—Cr alloy phase which is the magnetic phase can be increased with almost no increase in the magnetism from that when the ratio of the amount of Co is 83 at %, and the volume fraction of the Co—Cr alloy phase which is the magnetic phase can be reduced while the ratio of the amount of Co with respect to the total amount of the target is held constant. The magnetism of the target as a whole can thereby be reduced.

Therefore, in this embodiment, the amount of leakage magnetic flux from the surface of the target during magnetron sputtering can be increased while the ratio of the amount of the ferromagnetic metal element contained in the target is not reduced (the ratio of the amounts of the constituent elements contained in the target is not changed), and magnetron sputtering can thereby be performed favorably.

Although the reason is not made clear at this stage, when the size of the magnetic phase (the Co—Cr alloy phase wherein the content ratio of Co is 85 at % or more) is made relatively large (when the average size of the phase is in the range of, for example, 40 μm or larger and 80 μm or smaller), the amount of the leakage magnetic flux from the target surface can be further increased. Therefore, it is preferable that the size of the magnetic phase (the Co—Cr alloy phase wherein the content ratio of Co is 85 at % or more) be made relatively large (the average size of the phase be in the range of, for example, 40 μm or larger and 80 μm or smaller).

Although the reason is not made clear at this stage, when the size of the second non-magnetic phase is made larger than the first non-magnetic phase, the amount of the leakage magnetic flux from the target surface tends to be further increased. Therefore, the second non-magnetic metal powder (the 5Co-95Pt alloy powder) may not be mixed with the oxide powder by a ball mill, and the size of the second non-magnetic phase (the 5Co-95Pt alloy phase) may be made larger than that of the first non-magnetic phase (the 68Co-22Cr-10Pt alloy phase).

According to the present embodiment, at least one of the plurality of non-magnetic phases is more finely interdispersed with the oxide phase than the magnetic phase and other non-magnetic phases. Therefore, even when the size of the magnetic phase is made relatively large (even when the average size of the magnetic phase is set to fall in the range of, for example, 40 μm or larger and 80 μm or smaller), and furthermore, even when the sizes of other non-magnetic phases are made relatively large, the oxides are inhibited from aggregating to generate a large oxide phase. Accordingly, failure such as nodules and particles during sputtering is unlikely to generate.

3. Manufacturing Method of Target

The target 10 according to the present embodiment can be produced as follows.

(1) Production of Magnetic Metal Powder

Co and Cr are weighed such that a prescribed composition (the ratio of the amount of Co is 85 at % or more) is obtained. Then a molten alloy is produced and gas-atomized to produce an atomized Co—Cr alloy magnetic powder having the prescribed composition (the ratio of the amount of Co is 85 at % or more). The produced atomized Co—Cr alloy magnetic powder is classified so that the particle size becomes not larger than a predetermined particle size (for example, 106 μm or smaller). In this case, Cr may not be added, and an atomized magnetic powder composed only of Co may be produced. In this embodiment, the atomized Co—Cr alloy magnetic powder having a prescribed composition (the ratio of the amount of Co is 85 at % or more) includes the atomized magnetic powder composed only of Co.

(2) Production of First Non-Magnetic Metal Powder and Non-Magnetic Powder Mixture Co, Cr, and Pt are weighed such that a prescribed composition (the ratio of the amount of Co is more than 0 at % and 73 at % or less) is obtained. Then a molten alloy is produced and gas-atomized to produce first non-magnetic metal powder (atomized Co—Cr—Pt alloy non-magnetic powder) having the prescribed composition (the ratio of the amount of Co is more than 0 at % and 73 at % or less). The produced first non-magnetic metal powder (atomized Co—Cr—Pt alloy non-magnetic powder) is classified so that the particle size becomes not larger than a predetermined particle size (for example, 106 μm or smaller).

The produced classified atomized Co—Cr—Pt alloy non-magnetic powder and the oxide powder (a $SiO_2$ powder, a $TiO_2$ powder and a $Cr_2O_3$ powder) are mixed and dispersed to produce a non-magnetic powder mixture. In the oxide powder (a $SiO_2$ powder, a $TiO_2$ powder and a $Cr_2O_3$ powder), fine primary particles aggregate to form a secondary particle. Mixing and dispersing are performed so that the atomized Co—Cr—Pt alloy non-magnetic powder and the oxide powder (a $SiO_2$ powder, a $TiO_2$ powder and a $Cr_2O_3$ powder) are sufficiently finely interdispersed. (For example, mixing and dispersing are performed until the cumulative rotation number for the atomized Co—Cr—Pt alloy non-magnetic powder and the oxide powder by a ball mill reaches 1,000,000 or more.)

(3) Production of Second Non-Magnetic Metal Powder Co and Pt are weighed such that a prescribed composition (the ratio of the amount of Co is more than 0 at % and 12 at % or less) is obtained. Then a molten alloy is produced and gas-atomized to produce second non-magnetic metal powder (atomized Co—Pt alloy non-magnetic powder) having the prescribed composition (the ratio of the amount of Co is more than 0 at % and 12 at % or less). The produced second non-magnetic metal powder is classified so that the particle size becomes not larger than a predetermined particle size (for example, 106 atm or smaller).

(4) Production of Powder Mixture for Pressure Sintering

The non-magnetic powder mixture produced in (2), the magnetic metal powder produced in (1), and the second non-magnetic metal powder produced in (3) are mixed and dispersed until they are generally uniform, to produce a powder mixture for pressure sintering. When producing this powder mixture for pressure sintering, the oxide powder may be added as necessary to the non-magnetic powder mixture produced in (2), the magnetic metal powder produced in (1), and the second non-magnetic metal powder produced in (3), before mixing and dispersing. The mixing and dispersing in this step are terminated before each particle size decreases. When the mixing and dispersing are performed to such a degree that each particle size decreases, the leakage magnetic flux of the obtained target can be reduced.

(5) Molding

The powder mixture for pressure sintering produced in (4) is pressure-sintered and molded using, for example, a vacuum hot press method to produce a target.

(6) Characteristic of Manufacturing Method

The characteristic of the manufacturing method according to the present embodiment is that the first non-magnetic metal powder produced in (2) and the oxide powder are mixed and dispersed until they are sufficiently finely interdispersed to obtain the non-magnetic powder mixture as described in (2).

In the non-magnetic powder mixture produced in (2), the Co—Cr—Pt alloy powder and the oxide powder are sufficiently finely interdispersed with each other. Therefore, even when the mixing is terminated before each particle size decreases during mixing and dispersing the non-magnetic powder mixture produced in (2), the magnetic metal powder produced in (1), and the second non-magnetic metal powder produced in (3) to produce the powder mixture for pressure sintering, the oxides are inhibited from aggregating to generate a large oxide phase in the obtained target. Accordingly, failure such as nodules and particles during sputtering is unlikely to generate.

Thus, according to the manufacturing method of the present embodiment, the sizes of the magnetic metal powder (a Co—Cr alloy powder wherein the content ratio of Co is 85 at % or more) and the second non-magnetic metal powder (a Co—Pt alloy powder wherein the content ratio of Co is more than 0 at % and 12 at % or less) in the powder mixture for pressure sintering can be increased, while generation of nodules, particles and the like during sputtering is inhibited. Accordingly, the leakage magnetic flux of the obtained target can be increased.

EXAMPLES

Example 1

The overall composition of a target produced in Example 1 was 90(71Co-10Cr-14Pt-5Ru)-7SiO$_2$-3Cr$_2$O$_3$, and the target was produced and evaluated as follows.

Co, Cr, and Pt were weighed such that an alloy to be produced had an alloy composition of Co: 68 at %, Cr: 22 at %, and Pt: 10 at % and were heated to 1,700° C. to form a molten 68Co-22Cr-10Pt alloy. The molten alloy was gas-atomized to produce a 68Co-22Cr-10Pt alloy powder (first non-magnetic metal powder).

Co and Pt were weighed such that an alloy to be produced had an alloy composition of Co: 5 at % and Pt: 95 at % and were heated to 2,000° C. to form a molten 5Co-95Pt alloy. The molten alloy was gas-atomized to produce a 5Co-95Pt alloy powder (second non-magnetic metal powder).

Co alone was heated to 1,700° C. to obtain molten Co, and the molten Co was gas-atomized to produce a Co powder (magnetic metal powder).

The produced three atomized metal powders (68Co-22Cr-10Pt alloy powder, 5Co-95Pt alloy powder, and Co powder) were separately classified through 150 mesh sieves to obtain three atomized metal powders (68Co-22Cr-10Pt alloy powder, 5Co-95Pt alloy powder, and Co powder) having a particle diameter of φ106 μm or smaller.

The Co powder was further classified through a 325 mesh sieve to obtain an atomized metal powder having a particle size of 45 μm or larger and 106 μm or smaller.

To 735.70 g of the classified 68Co-22Cr-10Pt alloy powder, 106.53 g of a SiO$_2$ powder, 115.46 g of a Cr$_2$O$_3$ powder and 115.26 g of a Ru powder (having a particle size of 106 μm or smaller) were added. Then, the mixture was mixed and dispersed by a ball mill to obtain a non-magnetic powder mixture. The cumulative rotation number of a ball mill was 4,136,400.

Next, 493.14 g of the obtained non-magnetic powder mixture, 197.68 g of the classified 5Co-95Pt alloy powder (the second non-magnetic metal powder), and 246.18 g of the classified Co powder (the magnetic metal powder) were mixed by a Turbula shaker under conditions of 67 rpm and 30 min to obtain a pressure sintering powder mixture.

30 g of the produced powder mixture for pressure sintering was subjected to a hot press under the conditions of a sintering temperature of 1,200° C. and a pressure of 31 MPa for 30 minutes in an atmosphere of 5×10$^{-2}$ Pa or lower to produce a test piece (φ30 mm). The thickness of the obtained test piece was about 4.8 mm. The relative density of the produced test piece was 98.65%.

Figure 4:
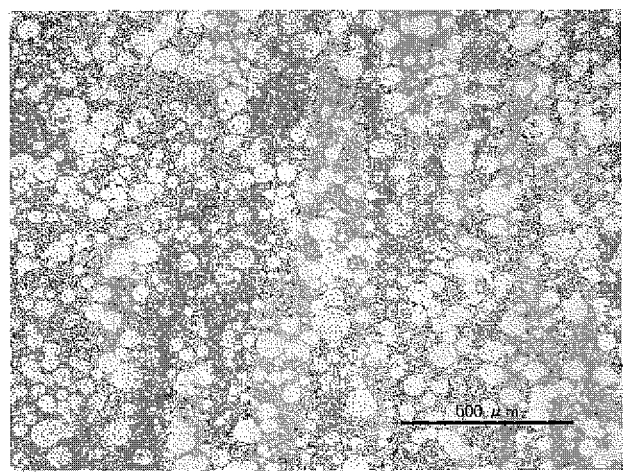
FIG. 4 is a metallurgical microscope photograph of the cross section in the thickness direction of a test piece according to Example 1 at low magnification (photographing magnification: 100 times, photograph scale: 500 μm).
Figure 5:
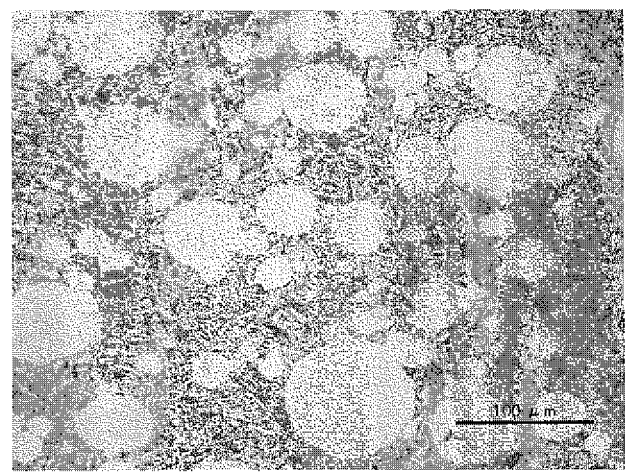
FIG. 5 is a metallurgical microscope photograph of the cross section in the thickness direction of a test piece according to Example 1 at high magnification (photographing magnification: 400 times, photograph scale: 100 mm).

FIG. 4 and FIG. 5 are metallurgical microscope photograph of the cross section in the thickness direction of the obtained test piece. FIG. 4 is a photograph at a photographing magnification of 100 times (with a photograph scale of 500 μm), and FIG. 5 is a photograph at a photographing magnification of 400 times (with a photograph scale of 100 μm).

In FIG. 4 and FIG. 5, it is considered that a dark grey phase is the oxide phase; a white small elongated phase which is intermingled and interdispersed with the oxide phase is the 68Co-22Cr-10Pt alloy; and an approximately circular white phase is the Co phase and the 5Co-95Pt phase. It is considered that, since the 68Co-22Cr-10Pt alloy powder is mixed with the oxide powder by a ball mill with a cumulative rotation number of up to 4,136,400, the 68Co-22Cr-10Pt alloy phase and the oxide phase are finely intermingled, and the 68Co-22Cr-10Pt alloy phase is deformed to be elongated. On the other hand, it is considered that, since the Co powder and the 5Co-95Pt powder are not subjected to mixing by a ball mill, the approximately spherical shape is maintained.

Here, in the present Example 1, the Co powder and the 5Co-95Pt powder are not subjected to mixing by a ball mill. Thus, it is considered that both of the Co phase and the 5Co-95Pt alloy phase in the target have an approximately circular shape in FIG. 4 and FIG. 5. Accordingly, it is difficult to make a distinction between both the phases. For this reason, the size of the Co phase in the target is not calculated in the present Example 1. However, while the Co powder is classified twice, so that the particle size thereof falls in the range of 45 µm or larger and 106 µm or smaller and the Co powder having a particle size of smaller than 45 µm is excluded, the 5Co-95Pt powder is classified only once, so that the particle size thereof falls in the range of 106 µm or smaller. Therefore, it is considered that in FIG. 4 and FIG. 5, the approximately circular large white phase is mainly the Co phase, and the approximately circular small white phase is mainly the 5Co-95Pt phase.

Next, the produced powder mixture for pressure sintering was subjected to a hot press under the conditions of a sintering temperature of 1,200° C. and a pressure of 31 MPa for 60 minutes in an atmosphere of $5 \times 10^{-2}$ Pa or lower to produce two targets with ϕ152.4 mm and a thickness of 5.0 mm. The relative densities of the produced two targets were 99.85% and 99.86%, and the average relative density was 99.86%.

The leakage magnetic flux from each of the two produced targets was evaluated according to ASTM F2086-01. A horseshoe-shaped magnet (formed of alnico) was used to generate the magnetic flux. This magnet was attached to an apparatus for measuring the leakage magnetic flux, and a gauss meter was connected to a hole probe. The hole probe was disposed so as to be positioned directly above the center between the magnetic poles of the horseshoe-shaped magnet.

First, a magnetic flux density of the horizontal direction on the surface of a table of the measuring apparatus was measured with no target placed on the surface of the table to measure a source field defined by ASTM. The source fields were 897 (G) and 897 (G).

Next, the tip of the hole probe was raised to the position at which the leakage magnetic flux from a target was measured (a position at a height of (the thickness of the target+2 mm) from the surface of the table), and a leakage magnetic flux density in a direction horizontal to the surface of the table was measured with no target placed on the surface of the table to measure a reference field defined by ASTM. The reference fields were 616 (G) and 614 (G).

Then a target was placed on the surface of the table such that the distance between the center of the surface of the target and a point on the target surface directly below the hole probe was 43.7 mm. The target was rotated 5 turns in an anticlockwise direction without moving its central position and then rotated by 0°, 30°, 60°, 90°, and 120° without moving the central position to measure the leakage magnetic flux density in a direction horizontal to the table surface at each of these rotated positions. The obtained five leakage magnetic flux density values were divided by the value of the reference field and multiplied by 100 to obtain leakage magnetic flux ratios (%). The five leakage magnetic flux ratios (%) were averaged, and the average value was used as the average leakage magnetic flux ratio (%) of the target. As shown in TABLES 3 and 4 below, the average leakage magnetic flux ratios of the two produced targets were 72.2% and 73.3%, respectively, and the average of these two average leakage magnetic flux ratios was 72.8%.

TABLE 3

|  | Source Field (G) | Reference Field (G) | Leakage magnetic flux density (G) | Leakage magnetic flux ratio (%) |
|---|---|---|---|---|
| 0° | 897 | 616 | 445 | 72.2 |
| 30° | 897 | 616 | 445 | 72.2 |

TABLE 3-continued

|  | Source Field (G) | Reference Field (G) | Leakage magnetic flux density (G) | Leakage magnetic flux ratio (%) |
|---|---|---|---|---|
| 60° | 897 | 616 | 445 | 72.2 |
| 90° | 897 | 616 | 445 | 72.2 |
| 120° | 897 | 616 | 445 | 72.2 |
| Average leakage magnetic flux ratio (%) | | | | 72.2 |

TABLE 4

|  | Source Field (G) | Reference Field (G) | Leakage magnetic flux density (G) | Leakage magnetic flux ratio (%) |
|---|---|---|---|---|
| 0° | 897 | 614 | 451 | 73.5 |
| 30° | 897 | 614 | 450 | 73.3 |
| 60° | 897 | 614 | 450 | 73.3 |
| 90° | 897 | 614 | 450 | 73.3 |
| 120° | 897 | 614 | 450 | 73.3 |
| Average leakage magnetic flux ratio (%) | | | | 73.3 |

Example 2

The composition of the whole target produced as Example 2 is 90(71Co-10Cr-14Pt-5Ru)-7SiO$_2$-3Cr$_2$O$_3$, and is the same as that of Example 1. Furthermore, the composition of the three atomized metal powders produced (the 68Co-22Cr-10Pt alloy powder, the 5Co-95Pt alloy powder, and the Co powder) is the same as that of Example 1. However, although a metal powder mixed and dispersed with the oxide by a ball mill was only the first non-magnetic metal powder (the 68Co-22Cr-10Pt alloy powder) in Example 1, the second nonmagnetic metal powder (the 5Co-95Pt alloy powder) and the magnetic metal powder (the Co powder) are also mixed and dispersed with the oxide by a ball mill in addition to the first non-magnetic metal powder (the 68Co-22Cr-10Pt alloy powder) in the present Example 2. This is the difference between Example 1 and Example 2.

The target in the present Example 2 was produced and evaluated as follows.

Atomization and classification were performed in the same manner as in Example 1 to obtain a 68Co-22Cr-10Pt alloy powder (having a particle size of 106 µm or smaller), a 5Co-95Pt alloy powder (having a particle size of 106 µm or smaller) and a Co powder (having a particle size of 45 µm or larger and 106 µm or smaller).

To 742.38 g of the obtained 68Co-22Cr-10Pt alloy powder, 76.55 g of a SiO$_2$ powder, 80.81 g of a Cr$_2$O$_3$ powder, and 116.31 g of a Ru powder (having a particle size of 106 µm or smaller) were added. Then, the mixture was mixed and dispersed by a ball mill (with the cumulative rotation number of a ball mill of 4,136,400) to obtain a first non-magnetic powder mixture.

To 891.43 g of the obtained 5Co-95Pt alloy powder, 26.92 g of a SiO$_2$ powder and 31.07 g of a Cr$_2$O$_3$ powder were added. Then, the mixture was mixed and dispersed by a ball mill (with the cumulative rotation number of a ball mill of 1,308,960) to obtain a second non-magnetic powder mixture.

To 790.00 g of the obtained Co powder, 26.35 g of a SiO$_2$ powder and 30.39 g of a Cr$_2$O$_3$ powder were added. Then, the mixture was mixed and dispersed by a ball mill (with the cumulative rotation number of a ball mill of 493,560) to obtain a magnetic powder mixture.

Next, 465.60 g of the first non-magnetic powder mixture (a powder in which the 68Co-22Cr-10Pt alloy powder and the oxide powder are mixed and dispersed), 210.54 g of the second non-magnetic powder mixture (a powder in which the 5Co-95Pt alloy powder and the oxide powder are mixed and dispersed), and 263.86 g of the magnetic powder mixture (a powder in which the Co powder and the oxide powder are mixed and dispersed) were mixed and dispersed by a Turbula shaker in the same manner as in Example 1 to obtain a powder mixture for pressure sintering.

30 g of the produced powder mixture for pressure sintering was subjected to a hot press under the conditions of a sintering temperature of 1,210° C. and a pressure of 31 MPa for 30 minutes in an atmosphere of $5 \times 10^{-2}$ Pa or lower to produce a test piece (ϕ30 mm). The thickness of the obtained test piece was about 4.8 mm. The relative density of the produced test piece was 99.12%.

Figure 6:
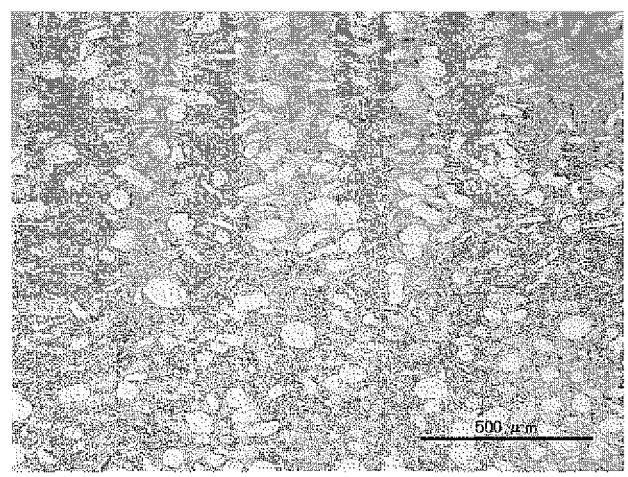
FIG. 6 is a metallurgical microscope photograph of the cross section in the thickness direction of a test piece according to Example 2 at low magnification (photographing magnification: 100 times, photograph scale: 500 μm).
Figure 7:
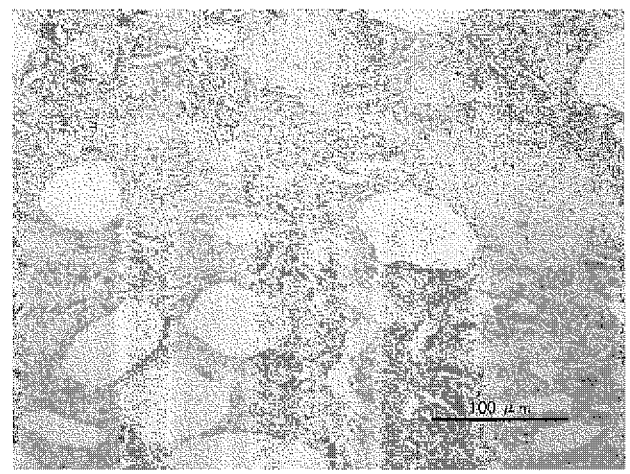
FIG. 7 is a metallurgical microscope photograph of the cross section in the thickness direction of a test piece according to Example 2 at high magnification (photographing magnification: 400 times, photograph scale: 100 μm).

FIG. 6 and FIG. 7 are metallurgical microscope photograph of the cross section in the thickness direction of the obtained test piece. FIG. 6 is a photograph at a photographing magnification of 100 times (with a photograph scale of 500 μm), and FIG. 7 is a photograph at a photographing magnification of 400 times (with a photograph scale of 100 μm).

In FIG. 6 and FIG. 7, a white phase is a metal phase. An approximately circular white phase hardly exits, and the white phase has an elliptical shape or a more elongated shape. It is considered that this is because each of the three atomized metal powders produced was mixed and dispersed with the oxide by a ball mill in the present Example 2. However, the cumulative rotation number during mixing of the Co powder by a ball mill is 493,560, which is not more than 1/8 of 4,136,400 that is the cumulative rotation number for the 68Co-22Cr-10Pt powder, and not more than 2/5 of 1,308,960 that is the cumulative rotation number for the 5Co-95Pt powder. Thus it is considered that the Co powder is less elongated than the 68Co-22Cr-10Pt powder and the 5Co-95Pt powder. Therefore, it can also be considered that a large white phase having an aspect ratio of 3 or less is the Co phase in FIG. 6 and FIG. 7.

When it was assumed that the white phase having an aspect ratio of 3 or less is the Co phase in FIG. 7, the average size of the Co phase was 45 μm. When calculating the size of an individual phase, the average value between a major axis and a minor axis was determined as the size of the phase.

Furthermore, when calculating the average value of the size of the Co phase in FIG. 7, a phase having a size of 10 μm or smaller was ignored.

The white small elongated phase which is intermingled and interdispersed with the oxide phase that is a dark grey phase in FIG. 6 and FIG. 7 is considered to be the 68Co-22Cr-10Pt alloy phase and the 5Co-95Pt alloy phase.

When FIG. 6 and FIG. 7 of the present Example 2 are compared with FIG. 4 and FIG. 5 of Example 1, it is observed that the maximum value of the size of the white phase indicating a metal phase and the ratio of the white phase to the whole photograph are larger in FIG. 4 and FIG. 5 of Example 1. (While the maximum value of the size of the white phase in FIG. 4 of Example 1 is 92 μm, the maximum value of the size of the white phase in FIG. 7 of the present Example 2 is 71 μm. It is also clear at a glance that the ratio of the white phase to the whole photograph is larger in FIG. 4 and FIG. 5 of Example 1 than in FIG. 6 and FIG. 7 of the present Example 2.) Therefore, it is considered that the sizes of the Co phase and the 5Co-95Pt alloy phase in the target of Example 1 are larger than the sizes of the Co phase and the 5Co-95Pt alloy phase in the target of the present Example 2. In the present Example 2, each of the three atomized metal powders produced was mixed and dispersed with the oxide by a ball mill. Therefore, it is considered that the size of the white metal phase is decreased, and the metal phase is finely interdispersed with the oxide phase, whereby the proportion of the region observed as the white phase is reduced.

Next, the produced powder mixture for pressure sintering was subjected to a hot press under the conditions of a sintering temperature of 1,210° C. and a pressure of 31 MPa for 60 minutes in an atmosphere of $5 \times 10^{-2}$ Pa or lower to produce two targets with ϕ152.4 mm and a thickness of 5.0 mm. The relative densities of the produced two targets were 99.73% and 99.82%, and the average relative density was 99.78%.

The leakage magnetic flux from each of the two produced targets was evaluated as in Example 1. As shown in TABLES 5 and 6 below, the average leakage magnetic flux ratios were 65.0% and 65.3%, and the average of the average leakage magnetic flux ratios of the two produced targets was 65.2%.

TABLE 5

| | Source Field (G) | Reference Field (G) | Leakage magnetic flux density (G) | Leakage magnetic flux ratio (%) |
|---|---|---|---|---|
| 0° | 894 | 604 | 394 | 65.2 |
| 30° | 894 | 604 | 393 | 65.1 |
| 60° | 894 | 604 | 393 | 65.1 |
| 90° | 894 | 604 | 392 | 64.9 |
| 120° | 894 | 604 | 392 | 64.9 |
| Average leakage magnetic flux ratio (%) | | | | 65.0 |

TABLE 6

| | Source Field (G) | Reference Field (G) | Leakage magnetic flux density (G) | Leakage magnetic flux ratio (%) |
|---|---|---|---|---|
| 0° | 894 | 619 | 404 | 65.3 |
| 30° | 894 | 619 | 404 | 65.3 |
| 60° | 894 | 619 | 405 | 65.4 |
| 90° | 894 | 619 | 404 | 65.3 |
| 120° | 894 | 619 | 404 | 65.3 |
| Average leakage magnetic flux ratio (%) | | | | 65.3 |

Comparative Example 1

The composition of the whole target produced as Comparative Example 1 is 90(71Co-10Cr-14Pt-5Ru)-7SiO$_2$-3Cr$_2$O$_3$, and is the same as those of Examples 1 and 2. The three atomized metal powders produced are a 68Co-22Cr-10Pt alloy powder (a non-magnetic metal powder), a 50Co-50Pt alloy powder (a first magnetic metal powder), and a Co powder (a second magnetic metal powder). The 50Co-50Pt alloy powder (the magnetic metal powder) is produced instead of the 5Co-95Pt alloy powder (the non-magnetic metal powder) in Examples 1 and 2. Furthermore, in the present Comparative Example 1, the metal powder mixed and dispersed with the oxide by a ball mill is the 68Co-22Cr-10Pt alloy powder (the non-magnetic metal powder) and the 50Co-50Pt alloy powder (the first magnetic metal powder). The Co powder (the second magnetic metal powder) is not mixed and dispersed with the oxide by a ball mill.

The target in the present Comparative Example 1 was produced and evaluated as follows.

Atomization and classification were performed in the same manner as in Example 1 to obtain a 68Co-22Cr-10Pt alloy powder (having a particle size of 106 μm or smaller).

To 775.53 g of the obtained 68Co-22Cr-10Pt alloy powder, 68.30 g of a $SiO_2$ powder, 74.04 g of a $Cr_2O_3$ powder, and 121.51 g of a Ru powder (having a particle size of 106 μm or smaller) were added. Then, the mixture was mixed and dispersed by a ball mill (with the cumulative rotation number of a ball mill of 4,136,400) to obtain a non-magnetic powder mixture.

Atomization and classification were performed as in Example 1 except that the alloy composition was changed to thereby obtain the 50Co-50Pt alloy powder (having a particle size of 106 μm or smaller). During atomization performed to obtain the 50Co-50Pt alloy powder, the heating temperature and the injection temperature were 1,800° C.

To 1121.25 g of the obtained 50Co-50Pt alloy powder, 85.41 g of a $SiO_2$ powder and 92.54 g of a $Cr_2O_3$ powder were added. Then, the mixture was mixed and dispersed by a ball mill (with the cumulative rotation number of a ball mill of 2,805,840) to obtain a magnetic powder mixture.

Atomization was performed in the same manner as in Example 1 to obtain a Co powder. The obtained Co powder was classified only through a 150 mesh sieve into a Co powder having a particle size of 106 μm or smaller. The obtained Co powder was not mixed and dispersed with the oxide by a ball mill.

Next, 455.93 g of the non-magnetic powder mixture (a powder in which the 68Co-22Cr-10Pt alloy powder and the oxide powder are mixed and dispersed), 293.57 g of the magnetic powder mixture (a powder in which the 50Co-50Pt alloy powder and the oxide powder are mixed and dispersed), and 190.51 g of the magnetic metal powder (a Co powder) were mixed and dispersed by a Turbula shaker in the same manner as in Example 1 to obtain a powder mixture for pressure sintering.

30 g of the produced powder mixture for pressure sintering was subjected to a hot press under the conditions of a sintering temperature of 1,200° C. and a pressure of 31 MPa for 30 minutes in an atmosphere of $5 \times 10^{-2}$ Pa or lower to produce a test piece (ϕ30 mm). The thickness of the obtained test piece was about 4.8 mm. The relative density of the produced test piece was 98.14%.

Figure 8:
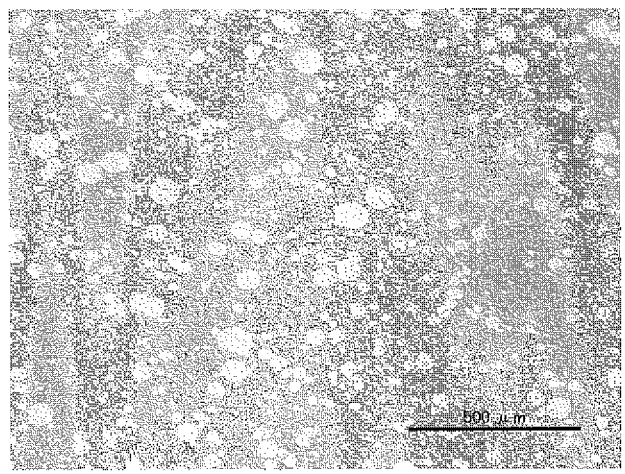
FIG. 8 is a metallurgical microscope photograph of the cross section in the thickness direction of a test piece according to Comparative Example 1 at low magnification (photographing magnification: 100 times, photograph scale: 500 μm).
Figure 9:
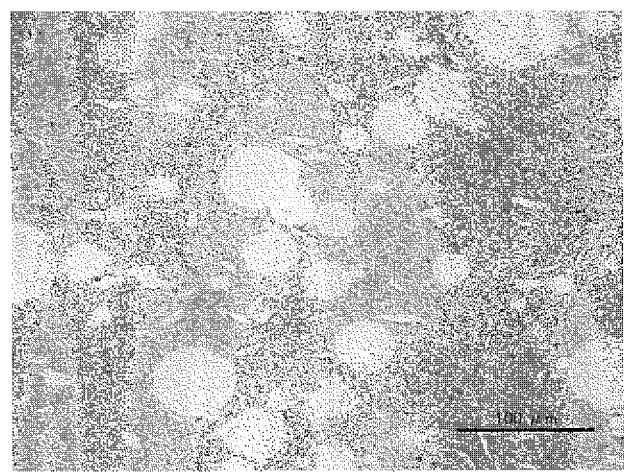
FIG. 9 is a metallurgical microscope photograph of the cross section in the thickness direction of a test piece according to Comparative Example 1 at high magnification (photographing magnification: 400 times, photograph scale: 100 μm).

FIG. 8 and FIG. 9 are metallurgical microscope photograph of the cross section in the thickness direction of the obtained test piece. FIG. 8 is a photograph at a photographing magnification of 100 times (with a photograph scale of 500 μm), and FIG. 9 is a photograph at a photographing magnification of 400 times (with a photograph scale of 100 μm).

It is considered that the approximately circular white phase in FIG. 8 and FIG. 9 is the Co phase which is not subjected to mixing by a ball mill. It is considered that, since the mixing by a ball mill is not performed, the Co phase maintains an approximately circular shape.

On the other hand, the cumulative rotation number for the 68Co-22Cr-10Pt alloy powder and the oxide powder by a ball mill is 4,136,400, and the cumulative rotation number for the 50Co-50Pt alloy powder and the oxide powder by a ball mill is 2,805,840. Thus, both of the cumulative rotation numbers are high. Therefore, in FIG. 8 and FIG. 9, the white small elongated phase which is intermingled and interdispersed with the oxide phase that is a dark grey phase is considered to be the 68Co-22Cr-10Pt alloy phase and the 50Co-50Pt alloy phase.

When it was assumed that all of the white phases each having an approximately circular shape (here, a shape having an aspect ratio of 1.5 or less is considered as an approximately circular shape) are the Co phases in FIG. 9, the average size of the Co phase was 40 μm. When calculating the size of an individual phase, the average value between the value of a major axis that is the longest diameter and the value of a minor axis that is the shortest diameter was determined as the size of the phase. Furthermore, when calculating the average value of the size of the Co phase in FIG. 9, a phase having a size of 10 μm or smaller was ignored.

Next, the produced powder mixture for pressure sintering was subjected to a hot press under the conditions of a sintering temperature of 1,200° C. and a pressure of 31 MPa for 60 minutes in an atmosphere of $5 \times 10^{-2}$ Pa or lower to produce two targets with ϕ152.4 mm and a thickness of 5.0 mm. The relative densities of the produced two targets were 99.87% and 99.68%, and the average relative density was 99.78%.

The leakage magnetic flux from each of the two produced targets was evaluated as in Example 1. As shown in TABLEs 7 and 8 below, the average leakage magnetic flux ratios were 61.0% and 60.8%, and the average of the average leakage magnetic flux ratios of the two produced targets was 60.9%.

TABLE 7

| | Source Field (G) | Reference Field (G) | Leakage magnetic flux density (G) | Leakage magnetic flux ratio (%) |
|---|---|---|---|---|
| 0° | 891 | 601 | 367 | 61.1 |
| 30° | 891 | 601 | 367 | 61.1 |
| 60° | 891 | 601 | 367 | 61.1 |
| 90° | 891 | 601 | 366 | 60.9 |
| 120° | 891 | 601 | 366 | 60.9 |
| Average leakage magnetic flux ratio (%) | | | | 61.0 |

TABLE 8

| | Source Field (G) | Reference Field (G) | Leakage magnetic flux density (G) | Leakage magnetic flux ratio (%) |
|---|---|---|---|---|
| 0° | 891 | 628 | 382 | 60.8 |
| 30° | 891 | 628 | 382 | 60.8 |
| 60° | 891 | 628 | 382 | 60.8 |
| 90° | 891 | 628 | 382 | 60.8 |
| 120° | 891 | 628 | 382 | 60.8 |
| Average leakage magnetic flux ratio (%) | | | | 60.8 |

Comparative Example 2

The composition of the whole target produced as Comparative Example 2 is 90(71Co-10Cr-14Pt-5Ru)-7$SiO_2$-3$Cr_2O_3$, and is the same as those of Examples 1 and 2 and Comparative Example 1. The three atomized metal powders produced are a 68Co-22Cr-10Pt alloy powder (a non-magnetic metal powder), a 50Co-50Pt alloy powder (a first magnetic metal powder), and a Co powder (a second magnetic metal powder). Similarly to Comparative Example 1, the 50Co-50Pt alloy powder (the magnetic metal powder) was produced instead of the 5Co-95Pt alloy powder (the non-magnetic metal powder) in Examples 1 and 2. However, the present Comparative Example 2 differs from Comparative Example 1, in that each of all of the three atomized metal powders produced is mixed and dispersed with the oxide by a ball mill, and the magnetic metal powder (the Co powder) is also mixed and dispersed with the oxide by a ball mill.

Comparative Example 2 also differs from Comparative Example 1 in that the magnetic metal powder (the Co powder) is classified twice so that the range of the particles size becomes 45 μm or larger and 106 μM or smaller in the same manner as in Examples 1 and 2.

The target in the present Comparative Example 2 was produced and evaluated as follows.

Atomization and classification were performed in the same manner as in Example 1 to obtain a 68Co-22Cr-10Pt alloy powder (having a particle size of 106 μm or smaller).

To 721.72 g of the obtained 68Co-22Cr-10Pt alloy powder, 62.58 g of a $SiO_2$ powder, 68.91 g of a $Cr_2O_3$ powder, and 113.08 g of a Ru powder (having a particle size of 106 μm or smaller) were added. Then, the mixture was mixed and dispersed by a ball mill (with the cumulative rotation number of a ball mill of 4,136,400) to obtain a non-magnetic powder mixture.

Atomization and classification were performed as in Example 1 except that the alloy composition was changed to thereby obtain the 50Co-50Pt alloy powder (having a particle size of 106 μm or smaller). During atomization performed to obtain the 50Co-50Pt alloy powder, the heating temperature and the injection temperature were 1,800° C.

To 1123.33 g of the obtained classified 50Co-50Pt alloy powder, 54.49 g of a $SiO_2$ powder and 59.99 g of a $Cr_2O_3$ powder were added. Then, the mixture was mixed and dispersed by a ball mill (with the cumulative rotation number of a ball mill of 2,805,840) to obtain a first magnetic powder mixture.

Furthermore, atomization and classification were performed in the same manner as in Examples 1 and 2 to obtain a Co powder (having a particle size of 45 μm or larger and 106 μm or smaller).

To 927.40 g of the obtained classified Co powder, 36.36 g of a $SiO_2$ powder and 35.97 g of a $Cr_2O_3$ powder were added. Then, the mixture was mixed and dispersed by a ball mill (with the cumulative rotation number of a ball mill of 493,560) to obtain a second magnetic powder mixture.

Next, 455.47 g of the non-magnetic powder mixture (a powder in which the 68Co-22Cr-10Pt alloy powder and the oxide powder are mixed and dispersed), 279.18 g of the first magnetic powder mixture (a powder in which the 50Co-50Pt alloy powder and the oxide powder are mixed and dispersed), and 205.37 g of the second magnetic powder mixture (a powder in which the Co powder and the oxide powder are mixed and dispersed) were mixed and dispersed by a Turbula shaker in the same manner as in Example 1 to obtain a powder mixture for pressure sintering.

30 g of the produced powder mixture for pressure sintering was subjected to a hot press under the conditions of a sintering temperature of 1,200° C. and a pressure of 31 MPa for 30 minutes in an atmosphere of $5 \times 10^{-2}$ Pa or lower to produce a test piece (ϕ30 mm). The thickness of the obtained test piece was about 4.8 mm. The relative density of the produced test piece was 99.08%.

Figure 10:
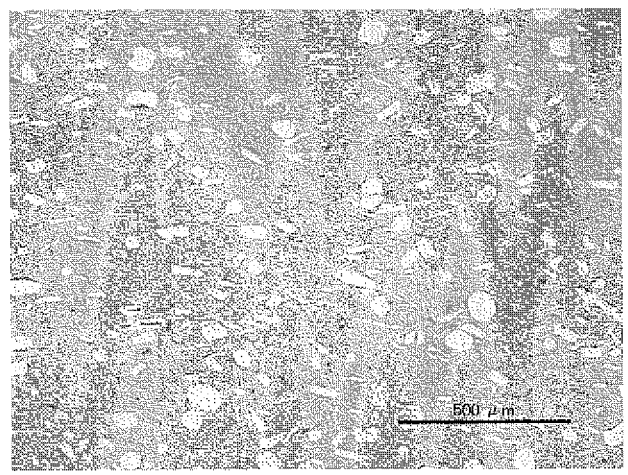
FIG. 10 is a metallurgical microscope photograph of the cross section in the thickness direction of a test piece according to Comparative Example 2 at low magnification (photographing magnification: 100 times, photograph scale: 500 μm).
Figure 11:
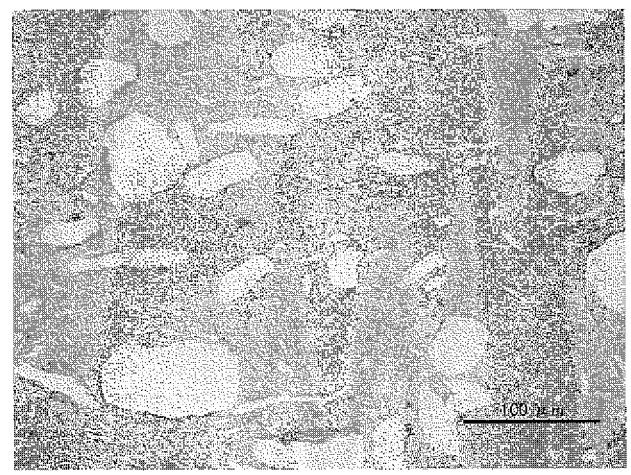
FIG. 11 is a metallurgical microscope photograph of the cross section in the thickness direction of a test piece according to Comparative Example 2 at high magnification (photographing magnification: 400 times, photograph scale: 100 μm).

FIG. 10 and FIG. 11 are metallurgical microscope photograph of the cross section in the thickness direction of the obtained test piece. FIG. 10 is a photograph at a photographing magnification of 100 times (with a photograph scale of 500 μm), and FIG. 11 is a photograph at a photographing magnification of 400 times (with a photograph scale of 100 μm).

In FIG. 10 and FIG. 11, a white phase is the metal phase. An approximately circular white phase hardly exits, and the white phase has an elliptical shape or a more elongated shape. It is considered that this is because each of the three atomized metal powders produced was mixed and dispersed with the oxide by a ball mill in the present Comparative Example 2. However, the cumulative rotation number during mixing of the Co powder by a ball mill is 493,560, which is not more than ⅛ of 4,136,400 that is the cumulative rotation number for the 68Co-22Cr-10Pt powder, and not more than ⅕ of 2,805,840 that is the cumulative rotation number for the 50Co-50Pt powder. Thus, it is considered that the Co powder is less elongated than the 68Co-22Cr-10Pt powder and the 50Co-50Pt powder. Therefore, it can also be considered that a large white phase having an aspect ratio of 3 or less is the Co phase in FIG. 10 and FIG. 11.

When it was assumed that the white phase having an aspect ratio of 3 or less is the Co phase in FIG. 11, the average size of the Co phase was 38 μm. When calculating the size of an individual phase, the average value between a major axis and a minor axis was determined as the size of the phase. Furthermore, when calculating the average value of the size of the Co phase in FIG. 11, a phase having a size of 10 μm or smaller was ignored.

In FIG. 8 and FIG. 9, the white small elongated phase which is intermingled and interdispersed with the oxide phase that is a dark grey phase is considered to be the 68Co-22Cr-10Pt alloy phase and the 50Co-50Pt alloy phase.

Next, the produced powder mixture for pressure sintering was subjected to a hot press under the conditions of a sintering temperature of 1,200° C. and a pressure of 31 MPa for 60 minutes in an atmosphere of $5 \times 10^{-2}$ Pa or lower to produce two targets with ϕ152.4 mm and a thickness of 5.0 mm. The relative densities of the produced two targets were 98.90% and 99.06%, and the average relative density was 98.98%.

The leakage magnetic flux from each of the two produced targets was evaluated as in Example 1. As shown in TABLEs 9 and 10 below, the average leakage magnetic flux ratios were 59.9% and 59.8%, and the average of the average leakage magnetic flux ratios of the two produced targets was 59.9%.

TABLE 9

| | Source Field (G) | Reference Field (G) | Leakage magnetic flux density (G) | Leakage magnetic flux ratio (%) |
|---|---|---|---|---|
| 0° | 894 | 612 | 367 | 60.0 |
| 30° | 894 | 612 | 367 | 60.0 |
| 60° | 894 | 612 | 367 | 60.0 |
| 90° | 894 | 612 | 366 | 59.8 |
| 120° | 894 | 612 | 365 | 59.6 |
| Average leakage magnetic flux ratio (%) | | | | 59.9 |

TABLE 10

| | Source Field (G) | Reference Field (G) | Leakage magnetic flux density (G) | Leakage magnetic flux ratio (%) |
|---|---|---|---|---|
| 0° | 894 | 613 | 366 | 59.7 |
| 30° | 894 | 613 | 366 | 59.7 |
| 60° | 894 | 613 | 367 | 59.9 |
| 90° | 894 | 613 | 367 | 59.9 |
| 120° | 894 | 613 | 367 | 59.9 |
| Average leakage magnetic flux ratio (%) | | | | 59.8 |

Comparative Example 3

The composition of the whole target produced as Comparative Example 3 is 90(71Co-10Cr-14Pt-5Ru)-7$SiO_2$-3$Cr_2O_3$, and is the same as those of Examples 1 and 2 and Comparative Examples 1 and 2. The three atomized metal powders produced are a 68Co-22Cr-10Pt alloy powder (a non-magnetic metal powder), a 50Co-50Pt alloy powder (a first magnetic metal powder), and a Co powder (a second magnetic metal powder). Similarly to Comparative Examples 1 and 2, the 50Co-50Pt alloy powder (the magnetic metal powder) was produced instead of the 5Co-95Pt alloy powder (the non-magnetic metal powder) in Examples 1 and 2. Similarly to Comparative Example 2, the present Comparative Example 3 differs from Comparative Example 1, in that each of all of the three atomized metal powders produced is mixed and dispersed with the oxide by a ball mill, and the magnetic metal powder (the Co powder) is also mixed and dispersed with the oxide by a ball mill. The cumulative rotation number of a ball mill for the magnetic metal powder (the Co powder) is the same as that in Comparative Example 2 (493,560).

However, while the magnetic metal powder (the Co powder) is classified twice so that the range of the particle size becomes 45 μM or larger and 106 μm or smaller in Comparative Example 2, classification is performed only once so that the range of the particle size of the magnetic metal powder (the Co powder) is 106 μm or smaller in the present Comparative Example 3. In this respect, the present Comparative Example 3 differs from Comparative Example 2.

The target in the present Comparative Example 3 was produced and evaluated as follows.

Atomization and classification were performed in the same manner as in Example 1 to obtain a 68Co-22Cr-10Pt alloy powder (having a particle size of 106 μm or smaller).

To 721.72 g of the obtained 68Co-22Cr-10Pt alloy powder, 62.58 g of a $SiO_2$ powder, 68.91 g of a $Cr_2O_3$ powder, and 113.08 g of a Ru powder (having a particle size of 106 μm or smaller) were added. Then, the mixture was mixed and dispersed by a ball mill (with the cumulative rotation number of a ball mill of 4,136,400) to obtain a non-magnetic powder mixture.

Atomization and classification were performed as in Example 1 except that the alloy composition was changed to thereby obtain the 50Co-50Pt alloy powder (having a particle size of 106 or smaller). During atomization performed to obtain the 50Co-50Pt alloy powder, the heating temperature and the injection temperature were 1,800° C.

To 1123.33 g of the obtained 50Co-50Pt alloy powder, 54.49 g of a $SiO_2$ powder and 59.99 g of a $Cr_2O_3$ powder were added. Then, the mixture was mixed and dispersed by a ball mill (with the cumulative rotation number of a ball mill of 2,805,840) to obtain a first magnetic powder mixture.

Atomization was performed in the same manner as in Examples 1 and 2 to obtain a Co powder. Then, similarly to Comparative Example 1, the obtained Co powder was classified only through a 150 mesh sieve into a Co powder having a particle size of 106 μm or smaller.

To 927.40 g of the obtained classified Co powder, 36.36 g of a $SiO_2$ powder and 35.97 g of a $Cr_2O_3$ powder were added. Then, the mixture was mixed and dispersed by a ball mill (with the cumulative rotation number of a ball mill of 493,560) to obtain a second magnetic powder mixture.

Next, 455.47 g of the non-magnetic powder mixture (a powder in which the 68Co-22Cr-10Pt alloy powder and the oxide powder are mixed and dispersed), 279.18 g of the first magnetic powder mixture (a powder in which the 50Co-50Pt alloy powder and the oxide powder are mixed and dispersed), and 205.37 g of the second magnetic powder mixture (a powder in which the Co powder and the oxide powder are mixed and dispersed) were mixed and dispersed by a Turbula shaker in the same manner as in Example 1 to obtain a powder mixture for pressure sintering.

30 g of the produced powder mixture for pressure sintering was subjected to a hot press under the conditions of a sintering temperature of 1,190° C. and a pressure of 31 MPa for 30 minutes in an atmosphere of $5 \times 10^{-2}$ Pa or lower to produce a test piece (φ30 mm). The thickness of the obtained test piece was about 4.8 mm. The relative density of the produced test piece was 98.25%.

Figure 12:
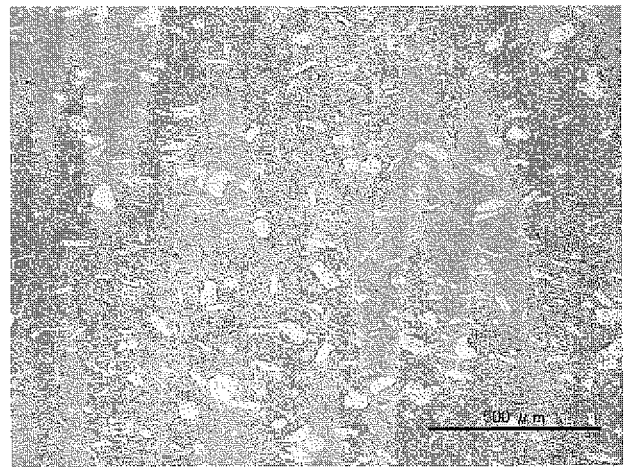
FIG. 12 is a metallurgical microscope photograph of the cross section in the thickness direction of a test piece according to Comparative Example 3 at low magnification (photographing magnification: 100 times, photograph scale: 500 μm).
Figure 13:
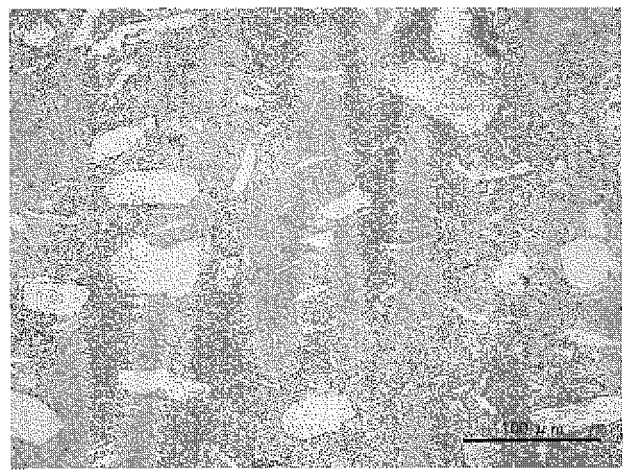
FIG. 13 is a metallurgical microscope photograph of the cross section in the thickness direction of a test piece according to Comparative Example 3 at high magnification (photographing magnification: 400 times, photograph scale: 100 μm).

FIG. 12 and FIG. 13 are metallurgical microscope photograph of the cross section in the thickness direction of the obtained test piece. FIG. 12 is a photograph at a photographing magnification of 100 times (with a photograph scale of 500 μm), and FIG. 13 is a photograph at a photographing magnification of 400 times (with a photograph scale of 100 μm).

In FIG. 12 and FIG. 13, a white phase is the metal phase. An approximately circular white phase hardly exits, and the white phase has an elliptical shape or a more elongated shape. It is considered that this is because each of the three atomized metal powders produced was mixed and dispersed with the oxide by a ball mill in the present Comparative Example 3. However, the cumulative rotation number during mixing of the Co powder by a ball mill is 493,560, which is not more than ⅛ of 4,136,400 that is the cumulative rotation number for the 68Co-22Cr-10Pt powder, and not more than ⅕ of 2,805,840 that is the cumulative rotation number for the 50Co-50Pt powder. Thus, it is considered that the Co powder is less elongated than the 68Co-22Cr-10Pt powder and the 50Co-50Pt powder. Therefore, it can also be considered that a large white phase having an aspect ratio of 3 or less is the Co phase in FIG. 12 and FIG. 13.

When it was assumed that the white phase having an aspect ratio of 3 or less is the Co phase in FIG. 13, the average size of the Co phase was 35 μm. When calculating the size of an individual phase, the average value between a major axis and a minor axis was determined as the size of the phase. Furthermore, when calculating the average value of the size of the Co phase in FIG. 13, a phase having a size of 10 μm or smaller was ignored.

When FIG. 12 and FIG. 13 of the present Comparative Example 3 are compared with FIG. 10 and FIG. 11 of Comparative Example 2, the proportion of the large white phase in the target is smaller in the present Comparative Example 3 than in Comparative Example 2. It is considered that this is because the particle size of the Co particle used in the production of the target is 45 μm or larger and 106 μm or smaller in Comparative Example 2, while the particle size of the Co particle used in the production of the target is 106 μm or smaller in the present Comparative Example 3.

Next, the produced powder mixture for pressure sintering was subjected to a hot press under the conditions of a sintering temperature of 1,190° C. and a pressure of 31 MPa for 60 minutes in an atmosphere of $5 \times 10^{-2}$ Pa or lower to produce two targets with φ152.4 mm and a thickness of 5.0 mm. The relative densities of the produced two targets were 98.92% and 99.04%, and the average relative density was 98.98%.

The leakage magnetic flux from each of the two produced targets was evaluated as in Example 1. As shown in TABLES 11 and 12 below, the average leakage magnetic flux ratios were 56.6% and 56.7%, and the average of the average leakage magnetic flux ratios of the two produced targets was 56.7%.

TABLE 11

|  | Source Field (G) | Reference Field (G) | Leakage magnetic flux density (G) | Leakage magnetic flux ratio (%) |
| --- | --- | --- | --- | --- |
| 0° | 893 | 628 | 356 | 56.7 |
| 30° | 893 | 628 | 357 | 56.8 |
| 60° | 893 | 628 | 355 | 56.5 |

TABLE 11-continued

| | Source Field (G) | Reference Field (G) | Leakage magnetic flux density (G) | Leakage magnetic flux ratio (%) |
|---|---|---|---|---|
| 90° | 893 | 628 | 355 | 56.5 |
| 120° | 893 | 628 | 355 | 56.5 |
| Average leakage magnetic flux ratio (%) | | | | 56.6 |

TABLE 12

| | Source Field (G) | Reference Field (G) | Leakage magnetic flux density (G) | Leakage magnetic flux ratio (%) |
|---|---|---|---|---|
| 0° | 893 | 617 | 350 | 56.7 |
| 30° | 893 | 617 | 350 | 56.7 |
| 60° | 893 | 617 | 351 | 56.9 |
| 90° | 893 | 617 | 350 | 56.7 |
| 120° | 893 | 617 | 350 | 56.7 |
| Average leakage magnetic flux ratio (%) | | | | 56.7 |

Comparative Example 4

The composition of the whole target produced as Comparative Example 4 is 90(71Co-10Cr-14Pt-5Ru)-7SiO$_2$-$^3$Cr$_2$O$_3$, and is the same as those of Examples 1 and 2 and Comparative Examples 1, 2, and 3. The three atomized metal powders produced are a 68Co-22Cr-10Pt alloy powder (a non-magnetic metal powder), a 50Co-50Pt alloy powder (a first magnetic metal powder), and a Co powder (a second magnetic metal powder). Similarly to Comparative Examples 1, 2, and 3, the 50Co-50Pt alloy powder (the magnetic metal powder) was produced instead of the 5Co-95Pt alloy powder (the non-magnetic metal powder) in Examples 1 and 2. Similarly to Comparative Examples 2 and 3, the present Comparative Example 4 differs from Comparative Example 1, in that each of all of the three atomized metal powders produced is mixed and dispersed with the oxide by a ball mill, and the magnetic metal powder (the Co powder) is also mixed and dispersed with the oxide by a ball mill. However, in the present Comparative Example 4, the cumulative rotation number of a ball mill for the magnetic metal powder (the Co powder) is 817,560, which is larger by 66% than 493,560 that is the cumulative rotation number of a ball mill for the magnetic metal powder (the Co powder) in Comparative Example 3. It is noted that, in the present Comparative Example 4, the magnetic metal powder (the Co powder) is classified only once, and the range of the particle size of the magnetic metal powder (the Co powder) is 106 μm or smaller. In this respect, the present Comparative Example 4 is the same as Comparative Example 3.

The target in the present Comparative Example 4 was produced and evaluated as follows.

Atomization and classification were performed in the same manner as in Example 1 to obtain a 68Co-22Cr-10Pt alloy powder (having a particle size of 106 μm or smaller).

To 721.72 g of the obtained 68Co-22Cr-10Pt alloy powder, 62.58 g of a SiO$_2$ powder, 68.91 g of a Cr$_2$O$_3$ powder, and 113.08 g of a Ru powder (having a particle size of 106 μm or smaller) were added. Then, the mixture was mixed and dispersed by a ball mill (with the cumulative rotation number of a ball mill of 4,136,400) to obtain a non-magnetic powder mixture.

Atomization and classification were performed as in Example 1 except that the alloy composition was changed to thereby obtain the 50Co-50Pt alloy powder (having a particle size of 106 μm or smaller). During atomization performed to obtain the 50Co-50Pt alloy powder, the heating temperature and the injection temperature were 1,800° C.

To 1123.33 g of the obtained 50Co-50Pt alloy powder, 54.49 g of a SiO$_2$ powder and 59.99 g of a Cr$_2$O$_3$ powder were added. Then, the mixture was mixed and dispersed by a ball mill (with the cumulative rotation number of a ball mill of 2,805,840) to obtain a first magnetic powder mixture.

Atomization was performed in the same manner as in Examples 1 and 2 to obtain a Co powder. Then; similarly to Comparative Example 1, the obtained Co powder was classified only through a 150 mesh sieve into a Co powder having a particle size of 106 μm or smaller.

To 927.40 g of the obtained Co powder, 36.36 g of a SiO$_2$ powder and 35.97 g of a Cr$_2$O$_3$ powder were added. Then, the mixture was mixed and dispersed by a ball mill (with the cumulative rotation number of a ball mill of 817,560) to obtain a non-magnetic powder mixture.

Next, 455.47 g of the non-magnetic powder mixture (a powder in which the 68Co-22Cr-10Pt alloy powder and the oxide powder are mixed and dispersed), 279.18 g of the first magnetic powder mixture (a powder in which the 50Co-50Pt alloy powder and the oxide powder are mixed and dispersed), and 205.37 g of the second magnetic powder mixture (a powder in which the Co powder and the oxide powder are mixed and dispersed) were mixed and dispersed by a Turbula shaker in the same manner as in Example 1 to obtain a powder mixture for pressure sintering.

30 g of the produced powder mixture for pressure sintering was subjected to a hot press under the conditions of a sintering temperature of 1,190° C. and a pressure of 31 MPa for 30 minutes in an atmosphere of 5×10$^{12}$ Pa or lower to produce a test piece (φ30 mm). The thickness of the obtained test piece was about 4.8 mm. The relative density of the produced test piece was 98.25%.

Figure 14:
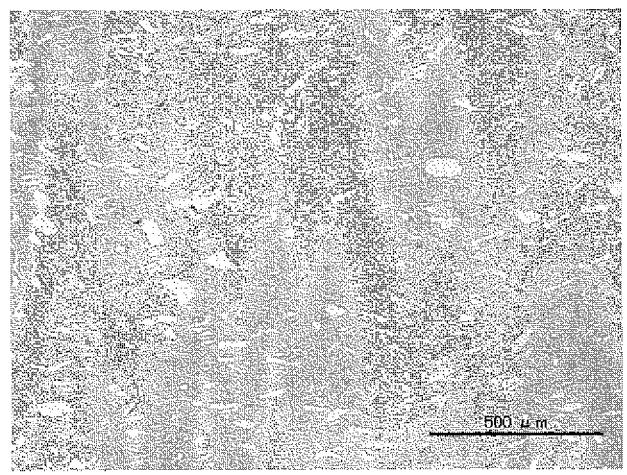
FIG. 14 is a metallurgical microscope photograph of the cross section in the thickness direction of a test piece according to Comparative Example 4 at low magnification (photographing magnification: 100 times, photograph scale: 500 μm).
Figure 15:
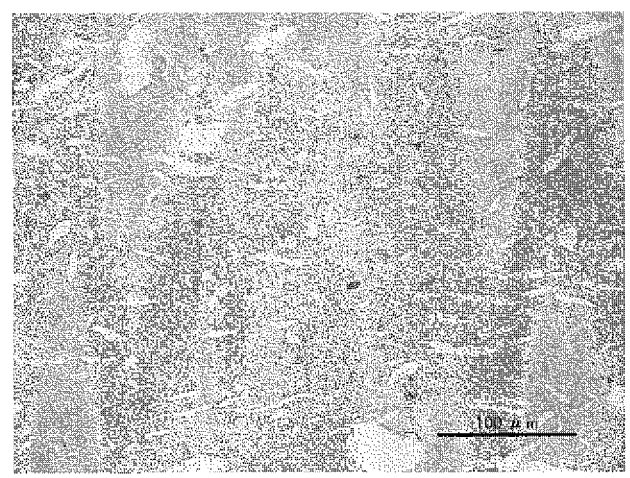
FIG. 15 is a metallurgical microscope photograph of the cross section in the thickness direction of a test piece according to Comparative Example 4 at high magnification (photographing magnification: 400 times, photograph scale: 100 μm).

FIG. 14 and FIG. 15 are metallurgical microscope photograph of the cross section in the thickness direction of the obtained test piece. FIG. 14 is a photograph at a photographing magnification of 100 times (with a photograph scale of 500 μm), and FIG. 15 is a photograph at a photographing magnification of 400 times (with a photograph scale of 100 μm).

In FIG. 14 and FIG. 15, a white phase is the metal phase, and an approximately circular white phase does not exist. The white phase present has an elliptical shape or a more elongated shape. Furthermore, the size of the white phase having an elliptical shape or a more elongated shape itself is smaller compared with those in Comparative Examples 1 to 3. It is considered that this is because, in the present Comparative Example 4, each of all of the three atomized metal powders produced is mixed and dispersed with the oxide by a ball mill, and the cumulative rotation number during mixing of the Co powder by a ball mill is 817,560, which is larger by 66% than 493,560 that is the cumulative rotation number of a ball mill for the magnetic metal powder (the Co powder) in Comparative Examples 2 and 3.

However, the cumulative rotation number during mixing of the Co powder by a ball mill is 817,560, which is not more than ⅕ of 4,136,400 that is the cumulative rotation number for the 68Co-22Cr-10Pt powder, and not more than ⅓ of 2,805,840 that is the cumulative rotation number for the 50Co-50Pt powder. Thus, it is considered that the Co powder is less elongated than the 68Co-22Cr-10Pt powder and the 50Co-50Pt powder. Therefore, it can also be considered that a large white phase having an aspect ratio of 3 or less is the Co phase in FIG. 14 and FIG. 15.

When it was assumed that the white phase having an aspect ratio of 3 or less is the Co phase in FIG. 15, the average size of the Co phase was 231m. When calculating the size of an individual phase, the average value between a major axis and a minor axis was determined as the size of the phase. Furthermore, when calculating the average value of the size of the Co phase in FIG. 15, a phase having a size of 10 μm or smaller was ignored.

Next, the produced powder mixture for pressure sintering was subjected to a hot press under the conditions of a sintering temperature of 1,190° C. and a pressure of 31 MPa for 60 minutes in an atmosphere of $5 \times 10^{-2}$ Pa or lower to produce two targets with φ152.4 mm and a thickness of 5.0 mm. The relative densities of the produced two targets were 99.22% and 99.24%, and the average relative density was 99.23%.

The leakage magnetic flux from each of the two produced targets was evaluated as in Example 1. As shown in TABLEs 13 and 14 below, the average leakage magnetic flux ratios were 55.5% and 55.3%, and the average of the average leakage magnetic flux ratios of the two produced targets was 55.4%.

TABLE 13

| | Source Field (G) | Reference Field (G) | Leakage magnetic flux density (G) | Leakage magnetic flux ratio (%) |
|---|---|---|---|---|
| 0° | 894 | 613 | 339 | 55.3 |
| 30° | 894 | 613 | 340 | 55.5 |
| 60° | 894 | 613 | 340 | 55.5 |
| 90° | 894 | 613 | 340 | 55.5 |
| 120° | 894 | 613 | 340 | 55.5 |
| Average leakage magnetic flux ratio (%) | | | | 55.5 |

TABLE 14

| | Source Field (G) | Reference Field (G) | Leakage magnetic flux density (G) | Leakage magnetic flux ratio (%) |
|---|---|---|---|---|
| 0° | 894 | 642 | 355 | 55.3 |
| 30° | 894 | 642 | 354 | 55.1 |
| 60° | 894 | 642 | 355 | 55.3 |
| 90° | 894 | 642 | 355 | 55.3 |
| 120° | 894 | 642 | 355 | 55.3 |
| Average leakage magnetic flux ratio (%) | | | | 55.3 |

Reference Example 1

The composition of the whole target produced as Reference Example 1 is 91 (71.5Co-11Cr-17.5Pt)-3SiO$_2$-2TiO$_2$-4Cr$_2$O$_3$. The three atomized metal powders produced are a 68Co-22Cr-10Pt alloy powder (a non-magnetic metal powder), a 50Co-50Pt alloy powder (a first magnetic metal powder), and a Co powder (a second magnetic metal powder). The 50Co-50Pt alloy powder (the magnetic metal powder) is produced instead of the 5Co-95Pt alloy powder (the non-magnetic metal powder) in Examples 1 and 2. Furthermore, in the present Reference Example 1, the metal powder mixed and dispersed with the oxide by a ball mill is the 68Co-22Cr-10Pt alloy powder (the non-magnetic metal powder) and the 50Co-50Pt alloy powder (the first magnetic metal powder). The Co powder (the second magnetic metal powder) is not mixed and dispersed with the oxide by a ball mill.

The target in the present Reference Example 1 was produced and evaluated as follows.

Atomization and classification were performed in the same manner as in Example 1 to obtain a 68Co-22Cr-10Pt alloy powder (having a particle size of 106 μm or smaller). To 1074.21 g of the obtained 68Co-22Cr-10Pt alloy powder, 31.60 g of a SiO$_2$ powder, 28.04 g of a TiO$_2$ powder, and 106.73 g of a Cr$_2$O$_3$ powder were added. Then, the mixture was mixed and dispersed by a ball mill (with the cumulative rotation number of a ball mill of 1,308,960) to obtain a non-magnetic powder mixture.

Atomization and classification were performed as in Example 1 except that the alloy composition was changed to thereby obtain the 50Co-50Pt alloy powder. During atomization performed to obtain the 50Co-50Pt alloy powder, the heating temperature and the injection temperature were 1,800° C.

To 978.92 g of the obtained 50Co-50Pt alloy powder, 28.78 g of a SiO$_2$ powder, 25.56 g of a TiO$_2$ powder, and 97.23 g of a Cr$_2$O$_3$ powder were added. Then, the mixture was mixed and dispersed by a ball mill (with the cumulative rotation number of a ball mill of 1,802,160) to obtain a magnetic powder mixture.

Atomization was performed in the same manner as in Example 1 to obtain a Co powder. The obtained Co powder was classified only through a 150 mesh sieve into a Co powder having a particle size of 106 μm or smaller. The obtained Co powder was not mixed and dispersed with the oxide by a ball mill.

Next, 572.48 g of the non-magnetic powder mixture (a powder in which the 68Co-22Cr-10Pt alloy powder and the oxide powder are mixed and dispersed), 511.81 g of the magnetic powder mixture (a powder in which the 50Co-50Pt alloy powder and the oxide powder are mixed and dispersed), and 205.72 g of Co powder were mixed and dispersed by a Turbula shaker in the same manner as in Example 1 to obtain a powder mixture for pressure sintering.

30 g of the produced powder mixture for pressure sintering was subjected to a hot press under the conditions of a sintering temperature of 1,170° C. and a pressure of 24.5 MPa for 30 minutes in an atmosphere of $5 \times 10^{-2}$ Pa or lower to produce a test piece (φ30 mm). The thickness of the obtained test piece was about 4.5 mm. The relative density of the produced test piece was 98.65%.

Figure 16:
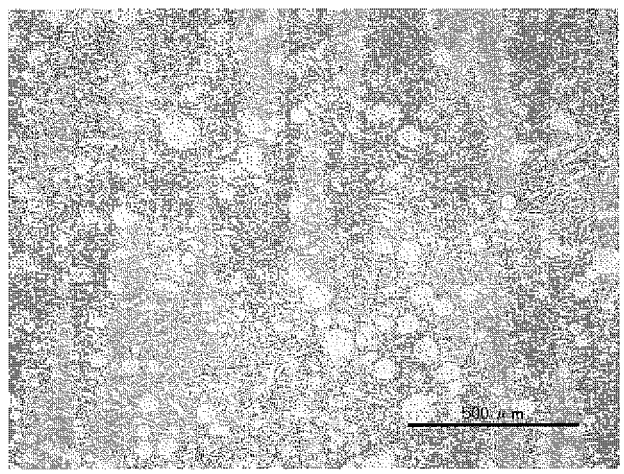
FIG. 16 is a metallurgical microscope photograph of the cross section in the thickness direction of a test piece according to Reference Example 1 at low magnification (photographing magnification: 100 times, photograph scale: 500 μm).
Figure 17:
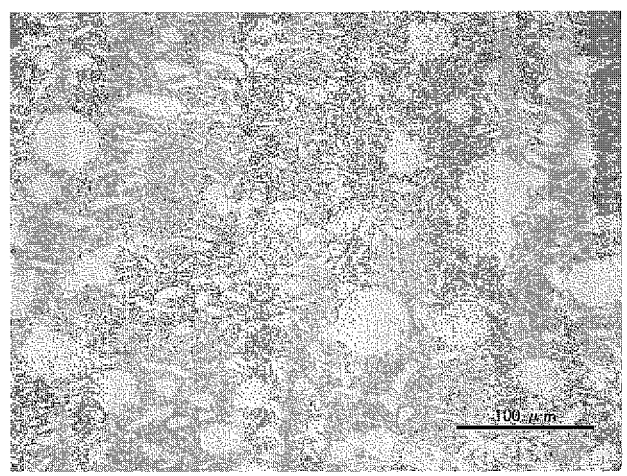
FIG. 17 is a metallurgical microscope photograph of the cross section in the thickness direction of a test piece according to Reference Example 1 at high magnification (photographing magnification: 400 times, photograph scale: 100 μm).

FIG. 16 and FIG. 17 are metallurgical microscope photograph of the cross section in the thickness direction of the obtained test piece. FIG. 16 is a photograph at a photographing magnification of 100 times (with a photograph scale of 500 μm), and FIG. 17 is a photograph at a photographing magnification of 400 times (with a photograph scale of 100 μm).

It is considered that the approximately circular white phase in FIG. 16 and FIG. 17 is the Co phase which is not subjected to mixing by a ball mill. It is considered that, since the Co powder was not subjected to mixing by a ball mill, the Co phase maintained an approximately circular shape.

On the other hand, the cumulative rotation number for the 68Co-22Cr-10Pt alloy powder and the oxide powder by a ball mill is 1,308,960, which is almost at the same level as 1,082,160 that is the cumulative rotation number for the 50Co-50Pt alloy powder and the oxide powder by a ball mill. Therefore, in FIG. 16 and FIG. 17, a white small elongated phase which is intermingled with the oxide phase that is a dark grey portion is considered to be the 68Co-22Cr-10Pt alloy phase and the 50Co-50Pt alloy phase.

When it was assumed that all of the white phases each having an approximately circular shape (here, a shape having an aspect ratio of 1.5 or less is considered as an approximately circular shape) are the Co phases in FIG. 17, the average size of the Co phase was 29 μm. When calculating the size of an individual phase, the average value between a major axis and a minor axis was determined as the size of the phase. Furthermore, when calculating the average value of the size of the Co phase in FIG. 17, a phase having a size of 10 µm or smaller was ignored.

Next, the produced powder mixture for pressure sintering was subjected to a hot press under the conditions of a sintering temperature of 1,170° C. and a pressure of 24.5 MPa for 60 minutes in an atmosphere of $5 \times 10^{-2}$ Pa or lower to produce two targets with 9152.4 mm and a thickness of 6.5 mm. The relative densities of the produced two targets were 98.56% and 98.52%, and the average relative density was 98.54%.

The leakage magnetic flux from each of the two produced targets was evaluated as in Example 1. As shown in TABLEs 15 and 16 below, the average leakage magnetic flux ratios were 46.9% and 47.1%, and the average of the average leakage magnetic flux ratios of the two produced targets was 47.0%. Here, it should be noted that the thickness of the target of the present Reference Example 1 is 6.5 mm, which is thicker by 1.5 mm than 5.0 mm that is the thickness of the target of Examples 1 and 2 and Comparative Examples 1 to 4, and thus the leakage magnetic flux is measured rather low.

TABLE 15

| | Source Field (G) | Reference Field (G) | Leakage magnetic flux density (G) | Leakage magnetic flux ratio (%) |
|---|---|---|---|---|
| 0° | 893 | 590 | 277 | 46.9 |
| 30° | 893 | 590 | 277 | 46.9 |
| 60° | 893 | 590 | 277 | 46.9 |
| 90° | 893 | 590 | 277 | 46.9 |
| 120° | 893 | 590 | 276 | 46.8 |
| Average leakage magnetic flux ratio (%) | | | | 46.9 |

TABLE 16

| | Source Field (G) | Reference Field (G) | Leakage magnetic flux density (G) | Leakage magnetic flux ratio (%) |
|---|---|---|---|---|
| 0° | 893 | 569 | 267 | 46.9 |
| 30° | 893 | 569 | 268 | 47.1 |
| 60° | 893 | 569 | 268 | 47.1 |
| 90° | 893 | 569 | 268 | 47.1 |
| 120° | 893 | 569 | 268 | 47.1 |
| Average leakage magnetic flux ratio (%) | | | | 47.1 |

Reference Example 2

The composition of the whole target produced as Reference Example 2 is 91(71.5Co-11Cr-17.5Pt)-3SiO$_2$-2TiO$_2$-4Cr$_2$O$_3$, and is the same as those of Reference Example 1. Similarly to Reference Example 1, the three atomized metal powders produced are a 68Co-22Cr-10Pt alloy powder (a non-magnetic metal powder), a 50Co-50Pt alloy powder (a first magnetic metal powder), and a Co powder (a second magnetic metal powder). The 50Co-50Pt alloy powder (the magnetic metal powder) is produced instead of the 5Co-95Pt alloy powder (the non-magnetic metal powder) in Examples 1 and 2. However, in Reference Example 1, a metal powder mixed and dispersed with the oxide by a ball mill is the 68Co-22Cr-10Pt alloy powder (the non-magnetic metal powder) and the 50Co-50Pt alloy powder (the first magnetic metal powder), and the Co powder (the second magnetic metal powder) is not mixed and dispersed with the oxide by a ball mill. On the other hand, in the present Reference Example 2, each of all of the three metal powders is mixed with the oxide by a ball mill, and the Co powder (the second magnetic metal powder) is also mixed and dispersed with the oxide by a ball mill.

The target in the present Reference Example 2 was produced and evaluated as follows.

Atomization and classification were performed in the same manner as in Reference Example 1 to obtain a 68Co-22Cr-10Pt alloy powder, a 50Co-50Pt alloy powder, and a Co powder.

To 1020.20 g of the obtained 68Co-22Cr-10Pt alloy powder, 28.42 g of a SiO$_2$ powder, 25.21 g of a TiO$_2$ powder, and 95.95 g of a Cr$_2$O$_3$ powder were added. Then, the mixture was mixed and dispersed by a ball mill (with the cumulative rotation number of a ball mill of 1,308,960) to obtain a non-magnetic powder mixture.

To 1840.00 g of the obtained 50Co-50Pt alloy powder, 28.65 g of a SiO$_2$ powder, 25.43 g of a TiO$_2$ powder, and 96.79 g of a Cr$_2$O$_3$ powder were added. Then, the mixture was mixed and dispersed by a ball mill (with the cumulative rotation number of a ball mill of 1,802,160) to obtain a first magnetic powder mixture.

To 870.00 g of the obtained Co powder, 29.18 g of a SiO$_2$ powder, 25.91 g of a TiO$_2$ powder, and 98.63 g of a Cr$_2$O$_3$ powder were added. Then, the mixture was mixed and dispersed by a ball mill (with the cumulative rotation number of a ball mill of 1,069,560) to obtain a second magnetic powder mixture.

Next, 568.40 g of the non-magnetic powder mixture (a powder in which the 68Co-22Cr-10Pt alloy powder and the oxide powder are mixed and dispersed), 479.53 g of the first magnetic powder mixture (a powder in which the 50Co-50Pt alloy powder and the oxide powder are mixed and dispersed), and 242.07 g of the second magnetic powder mixture (a powder in which the Co powder and the oxide powder are mixed and dispersed) were mixed and dispersed by a Turbula shaker in the same manner as in Example 1 to obtain a powder mixture for pressure sintering.

30 g of the produced powder mixture for pressure sintering was subjected to a hot press under the conditions of a sintering temperature of 1,170° C. and a pressure of 24.5 MPa for 30 minutes in an atmosphere of $5 \times 10^{-2}$ Pa or lower to produce a test piece (φ30 mm). The thickness of the obtained test piece was about 4.5 mm. The relative density of the produced test piece was 98.38%.

Figure 18:
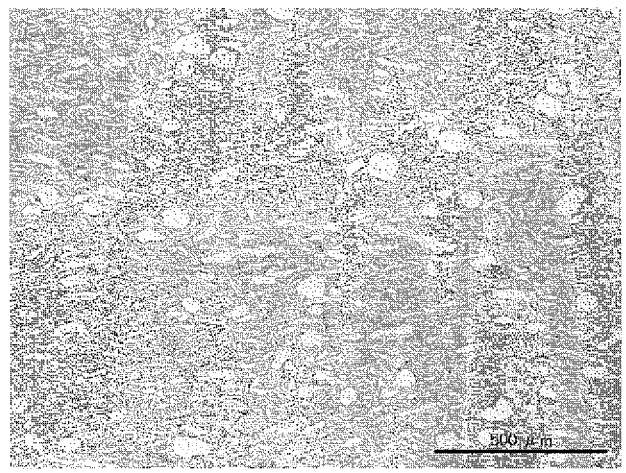
FIG. 18 is a metallurgical microscope photograph of the cross section in the thickness direction of a test piece according to Reference Example 2 at low magnification (photographing magnification: 100 times, photograph scale: 500 μm).
Figure 19:
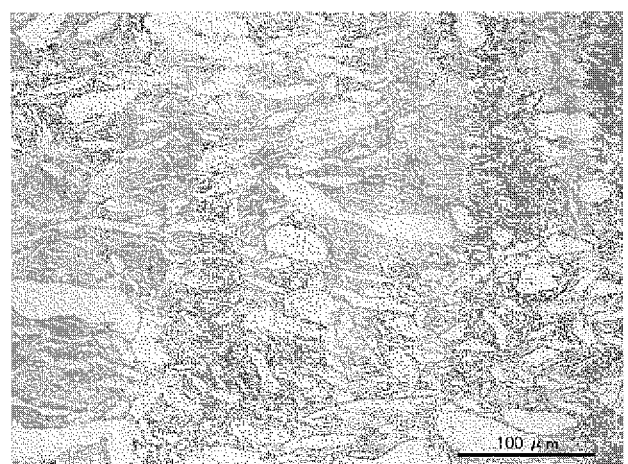
FIG. 19 is a metallurgical microscope photograph of the cross section in the thickness direction of a test piece according to Reference Example 2 at high magnification (photographing magnification: 400 times, photograph scale: 100 μm).

FIG. 18 and FIG. 19 are metallurgical microscope photograph of the cross section in the thickness direction of the obtained test piece. FIG. 18 is a photograph at a photographing magnification of 100 times (with a photograph scale of 500 µm), and FIG. 19 is a photograph at a photographing magnification of 400 times (with a photograph scale of 100 µm).

In FIG. 18 and FIG. 19, an approximately circular white phase hardly exits, and a white phase predominately has an elongated shape. It is considered that this is because each of all of the three metal powders is mixed with the oxide by a ball mill in the present Reference Example 2. Even in Example 2, each of all of the three metal powders is mixed with the oxide by a ball mill. However, in Example 2, the cumulative rotation number of a ball mill during mixing and dispersing of the Co powder with the oxide powder was 493,560, which is not more than half of 1,069,560 that is the cumulative rotation number for the Co powder in the present Reference Example 2. Thus, it is considered that the Co phase having an approximately circular to elliptical shape exists in FIG. 6 and FIG. 7 of Example 2.

In the present Reference Example 2, the size of each of the 68Co-22Cr-10Pt alloy powder, the 50Co-50Pt alloy powder, and the Co powder is 106 µm or smaller, and thus similar to each other. The cumulative rotation number of a ball mill during mixing and dispersing with the oxide powder is 1,308,960 for the 68Co-22Cr-10Pt alloy powder, 1,082,160 for the 50Co-50Pt alloy powder, and 1,069,560 for the Co powder. Since these numbers are at the same level, it cannot be estimated which phase is the Co phase in FIG. 19. For this reason, the average size of the Co phase is not calculated in the present Reference Example 2.

Next, the produced powder mixture for pressure sintering was subjected to a hot press under the conditions of a sintering temperature of 1,170° C. and a pressure of 24.5 MPa for 60 minutes in an atmosphere of $5\times10^{-2}$ Pa or lower to produce four targets with φ152.4 mm and a thickness of 6.5 mm. The relative densities of the produced four targets were 98.6%, 98.8%, 98.8%, and 98.7%, and the average relative density was 98.7%.

The leakage magnetic flux from each of the four produced targets was evaluated as in Example 1. As shown in TABLEs 17 to 20 below, the average leakage magnetic flux ratios were 44.3%, 44.2%, 44.5%, and 44.7%, and the average of the average leakage magnetic flux ratios of the four produced targets was 44.4%.

TABLE 17

| | Source Field (G) | Reference Field (G) | Leakage magnetic flux density (G) | Leakage magnetic flux ratio (%) |
|---|---|---|---|---|
| 0° | 891 | 576 | 255 | 44.3 |
| 30° | 891 | 576 | 255 | 44.3 |
| 60° | 891 | 576 | 256 | 44.4 |
| 90° | 891 | 576 | 256 | 44.4 |
| 120° | 891 | 576 | 255 | 44.3 |
| Average leakage magnetic flux ratio (%) | | | | 44.3 |

TABLE 18

| | Source Field (G) | Reference Field (G) | Leakage magnetic flux density (G) | Leakage magnetic flux ratio (%) |
|---|---|---|---|---|
| 0° | 891 | 580 | 256 | 44.1 |
| 30° | 891 | 580 | 256 | 44.1 |
| 60° | 891 | 580 | 257 | 44.3 |
| 90° | 891 | 580 | 257 | 44.3 |
| 120° | 891 | 580 | 256 | 44.1 |
| Average leakage magnetic flux ratio (%) | | | | 44.2 |

TABLE 19

| | Source Field (G) | Reference Field (G) | Leakage magnetic flux density (G) | Leakage magnetic flux ratio (%) |
|---|---|---|---|---|
| 0° | 891 | 576 | 255 | 44.3 |
| 30° | 891 | 576 | 256 | 44.4 |
| 60° | 891 | 576 | 256 | 44.4 |
| 90° | 891 | 576 | 258 | 44.8 |
| 120° | 891 | 576 | 257 | 44.6 |
| Average leakage magnetic flux ratio (%) | | | | 44.5 |

TABLE 20

| | Source Field (G) | Reference Field (G) | Leakage magnetic flux density (G) | Leakage magnetic flux ratio (%) |
|---|---|---|---|---|
| 0° | 891 | 581 | 259 | 44.6 |
| 30° | 891 | 581 | 259 | 44.6 |
| 60° | 891 | 581 | 260 | 44.8 |
| 90° | 891 | 581 | 260 | 44.8 |
| 120° | 891 | 581 | 259 | 44.6 |
| Average leakage magnetic flux ratio (%) | | | | 44.7 |

Example 3

The composition of the whole target produced as Example 3 is 91 (73Co-11Cr-16Pt)-4SiO$_2$-2TiO$_2$-3Cr$_2$O$_3$. The three atomized metal powders produced are a 68Co-22Cr-10Pt alloy powder (a first non-magnetic metal powder), a 5Co-95Pt alloy powder (a second non-magnetic metal powder), and a Co powder (a magnetic metal powder), which are the same as in Examples 1 and 2. Similarly to Example 2, in the present Example 3, each of all of the three atomized metal powders produced is mixed and dispersed with the oxide powder by a ball mill; the cumulative rotation number of a ball mill for the first non-magnetic metal powder (the 68Co-22Cr-10Pt alloy powder) is 1,082,160; the cumulative rotation number of a ball mill for the second non-magnetic metal powder (the 5Co-95Pt alloy powder) is 385,560; and the cumulative rotation number of a ball mill for the magnetic metal powder (the Co powder) is 871,560.

However, while the magnetic metal powder (the Co powder) is classified twice so that the range of the particle size is 45 μm or larger and 106 μm or smaller in Examples 1 and 2, classification is performed only once in the present example 3, so that the range of the particle size of the magnetic metal powder (the Co powder) is 106 μm or smaller in the present Example 3. In this respect, the present Example 3 is different from Examples 1 and 2.

The target in the present Example 3 was produced and evaluated as follows.

Atomization and classification were performed in the same manner as in Examples 1 and 2 to obtain a 68Co-22Cr-10Pt alloy powder (having a particle size of 106 μm or smaller).

To 1155.56 g of the obtained 68Co-22Cr-10Pt alloy powder, 42.51 g of a SiO$_2$ powder, 28.29 g of a TiO$_2$ powder, and 80.57 g of a Cr$_2$O$_3$ powder were added. Then, the mixture was mixed and dispersed by a ball mill (with the cumulative rotation number of a ball mill of 1,082,160) to obtain a first non-magnetic powder mixture.

Atomization and classification were performed in the same manner as in Examples 1 and 2 to obtain a 5Co-95Pt alloy powder (having a particle size of 106 μm or smaller).

To 1410.60 g of the obtained 5Co-95Pt alloy powder, 25.06 g of a SiO$_2$ powder, 16.68 g of a TiO$_2$ powder, and 47.52 g of a Cr$_2$O$_3$ powder were added. Then, the mixture was mixed and dispersed by a ball mill (with the cumulative rotation number of a ball mill of 385,560) to obtain a second non-magnetic powder mixture.

Atomization was performed in the same manner as in Examples 1 and 2 to obtain a Co powder. Then, similarly to Comparative Example 1, the obtained Co powder was classified only through a 150 mesh sieve into a Co powder having a particle size of 106 μm or smaller.

To 1478.28 g of the obtained classified Co powder, 61.96 g of a SiO$_2$ powder, 41.24 g of a TiO$_2$ powder, and 117.44 g of a Cr$_2$O$_3$ powder were added. Then, the mixture was mixed and dispersed by a ball mill (with the cumulative rotation number of a ball mill of 871,560) to obtain a magnetic powder mixture.

Next, 602.13 g of the first non-magnetic powder mixture (a powder in which the 68Co-22Cr-10Pt alloy powder and the oxide powder are mixed and dispersed), 347.66 g of the second non-magnetic powder mixture (a powder in which the 5Co-95Pt alloy powder and the oxide powder are mixed and dispersed), and 390.23 g of the magnetic powder mixture (a powder in which the Co powder and the oxide powder are mixed and dispersed) were mixed and dispersed by a Turbula shaker in the same manner as in Example 1 to obtain a powder mixture for pressure sintering.

30 g of the produced powder mixture for pressure sintering was subjected to a hot press under the conditions of a sintering temperature of 1,120° C. and a pressure of 31 MPa for 30 minutes in an atmosphere of $5 \times 10^{-2}$ Pa or lower to produce a test piece (φ30 mm). The thickness of the obtained test piece was about 4.6 mm. The relative density of the produced test piece was 99.33%.

Figure 20:
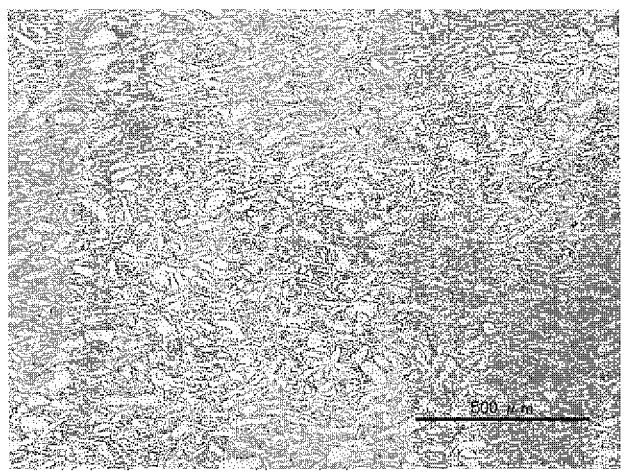
FIG. 20 is a metallurgical microscope photograph of the cross section in the thickness direction of a test piece according to Example 3 at low magnification (photographing magnification: 100 times, photograph scale: 500 μm).
Figure 21:
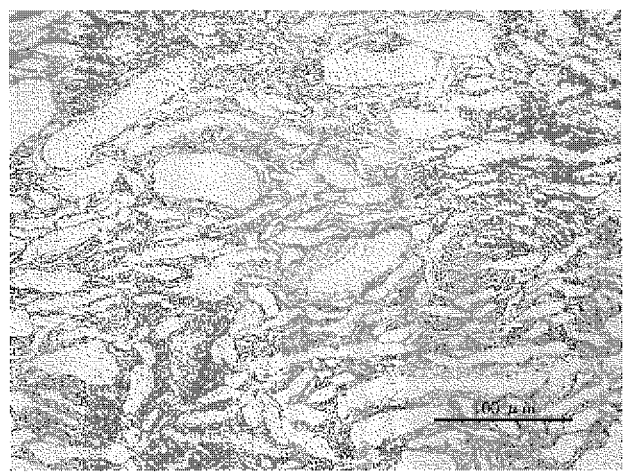
FIG. 21 is a metallurgical microscope photograph of the cross section in the thickness direction of a test piece according to Example 3 at high magnification (photographing magnification: 400 times, photograph scale: 100 μm).

FIG. 20 and FIG. 21 are metallurgical microscope photograph of the cross section in the thickness direction of the obtained test piece. FIG. 20 is a photograph at a photographing magnification of 100 times (with a photograph scale of 500 μm), and FIG. 21 is a photograph at a photographing magnification of 400 times (with a photograph scale of 100 μm).

In FIG. 20 and FIG. 21, a white phase is the metal phase. An approximately circular white phase hardly exits, and the white phase has an elliptical shape or a more elongated shape. It is considered that this is because each of the three atomized metal powders produced was mixed and dispersed with the oxide powder by a ball mill in the present Example 3. In the present Example 3, it is observed that the proportion of the white phase is larger compared with Comparative Examples 6 to 8 and the like which will be described later. It is considered that this is because the cumulative rotation number of a ball mill when producing the second non-magnetic powder mixture (a powder in which the 5Co-95Pt alloy powder and the oxide powder are mixed and dispersed) and the magnetic powder mixture (a powder in which the Co powder and the oxide powder are mixed and dispersed) was smaller compared with those in Comparative Examples 6 to 8 and the like, so that the particle sizes of the 5Co-95Pt alloy powder and the Co powder were not considerably decreased, and the 5Co-95Pt alloy powder and the Co powder were not considerably finely intermingled with the oxide powder.

Next, the produced powder mixture for pressure sintering was subjected to a hot press under the conditions of a sintering temperature of 1,120° C. and a pressure of 31 MPa for 60 minutes in an atmosphere of $5 \times 10^{-2}$ Pa or lower to produce a target with 9152.4 mm and a thickness of 7.0 mm. The relative density of the produced target was 98.96%.

The leakage magnetic flux from the produced target was evaluated as in Example 1. As shown in TABLE 21 below, the average leakage magnetic flux ratios was 48.1%.

TABLE 21

| | Source Field (G) | Reference Field (G) | Leakage magnetic flux density (G) | Leakage magnetic flux ratio (%) |
|---|---|---|---|---|
| 0° | 896 | 573 | 275 | 48.0 |
| 30° | 896 | 573 | 275 | 48.0 |
| 60° | 896 | 573 | 276 | 48.2 |
| 90° | 896 | 573 | 275 | 48.0 |
| 120° | 896 | 573 | 276 | 48.2 |
| Average leakage magnetic flux ratio (%) | | | | 48.1 |

The composition of the whole target produced as Comparative Example 5 is 91(73Co-11Cr-16Pt)-4SiO$_2$-2TiO$_2$-3Cr$_2$O$_3$, and is the same as that of Example 3. The three atomized metal powders produced are a 68Co-22Cr-10Pt alloy powder (a first non-magnetic metal powder), a 5Co-95Pt alloy powder (a second non-magnetic metal powder), and a Co powder (a magnetic metal powder), and are the same as those of Examples 1 to 3. In the present Comparative Example 5, similarly to Examples 2 and 3, each of all of the three atomized metal powders produced is mixed and dispersed with the oxide powder by a ball mill; the cumulative rotation number of a ball mill for the first non-magnetic metal powder (the 68Co-22Cr-10Pt alloy powder) is 1,082,160; the cumulative rotation number of a ball mill for the second non-magnetic metal powder (the 5Co-95Pt alloy powder) is 385,560; and the cumulative rotation number of a ball mill for the magnetic metal powder (the Co powder) is 3,300,840.

However, while the magnetic metal powder (the Co powder) is classified twice so that the range of the particle size is 45 μm or larger and 106 μm or smaller in Examples 1 and 2, classification is performed only once similarly to Example 3 so that the range of the particle size of the magnetic metal powder (the Co powder) is 106 μm or smaller in the present Comparative Example 5. In this respect, the present Comparative Example 5 is different from Examples 1 and 2. Furthermore, in the present Comparative Example 5, the cumulative rotation number of a ball mill for the magnetic metal powder (the Co powder) is 3,300,840, which is more than the cumulative rotation number (1,082,160) of a ball mill for the first non-magnetic metal powder (the 68Co-22Cr-10Pt alloy powder) and the cumulative rotation number (385,560) of a ball mill for the second non-magnetic metal powder (the 5Co-95Pt alloy powder). Thus, it is considered that in the obtained target, the magnetic phase (the Co phase) is more finely interdispersed with the oxide phase than all of the non-magnetic phases (the 68Co-22Cr-10Pt alloy phase and the 5Co-95Pt alloy phase). Accordingly, the present Comparative Example 5 is not within the scope of the present invention.

The target in the present Comparative Example 5 was produced and evaluated as follows.

Atomization and classification were performed in the same manner as in Examples 1 to 3 to obtain a 68Co-22Cr-10Pt alloy powder (having a particle size of 106 μm or smaller).

To 1155.56 g of the obtained 68Co-22Cr-10Pt alloy powder, 42.51 g of a SiO$_2$ powder, 28.29 g of a TiO$_2$ powder, and 80.57 g of a Cr$_2$O$_3$ powder were added. Then, the mixture was mixed and dispersed by a ball mill (with the cumulative rotation number of a ball mill of 1,082,160) to obtain a first non-magnetic powder mixture.

Atomization and classification were performed in the same manner as in Examples 1 to 3 to obtain a 5Co-95Pt alloy powder (having a particle size of 106 μm or smaller).

To 1410.60 g of the obtained 5Co-95Pt alloy powder, 25.06 g of a SiO$_2$ powder, 16.68 g of a TiO$_2$ powder, and 47.52 g of a Cr$_2$O$_3$ powder were added. Then, the mixture was mixed and dispersed by a ball mill (with the cumulative rotation number of a ball mill of 385,560) to obtain a second non-magnetic powder mixture.

Atomization was performed in the same manner as in Examples 1 to 3 to obtain a Co powder. Then, similarly to Example 3, the obtained Co powder was classified only through a 150 mesh sieve into a Co powder having a particle size of 106 μm or smaller.

To 1478.28 g of the obtained classified Co powder, 61.96 g of a SiO$_2$ powder, 41.24 g of a TiO$_2$ powder, and 117.44 g of a Cr$_2$O$_3$ powder were added. Then, the mixture was mixed and dispersed by a ball mill (with the cumulative rotation number of a ball mill of 3,300,840) to obtain a magnetic powder mixture.

Next, 602.13 g of the first non-magnetic powder mixture (a powder in which the 68Co-22Cr-10Pt alloy powder and the oxide powder are mixed and dispersed), 347.66 g of the second non-magnetic powder mixture (a powder in which the 5Co-95Pt alloy powder and the oxide powder are mixed and dispersed), and 390.23 g of the magnetic powder mixture (a powder in which the Co powder and the oxide powder are mixed and dispersed) were mixed and dispersed by a Turbula shaker in the same manner as in Example 1 to obtain a powder mixture for pressure sintering.

30 g of the produced powder mixture for pressure sintering was subjected to a hot press under the conditions of a sintering temperature of 1,120° C. and a pressure of 31 MPa for 30 minutes in an atmosphere of $5 \times 10^{-2}$ Pa or lower to produce a test piece (ϕ30 mm). The thickness of the obtained test piece was about 4.6 mm. The relative density of the produced test piece was 98.42%.

Figure 22:
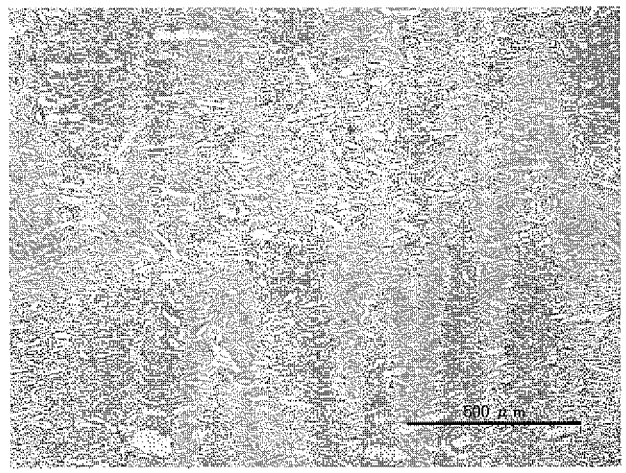
FIG. 22 is a metallurgical microscope photograph of the cross section in the thickness direction of a test piece according to Comparative Example 5 at low magnification (photographing magnification: 100 times, photograph scale: 500 μm).
Figure 23:
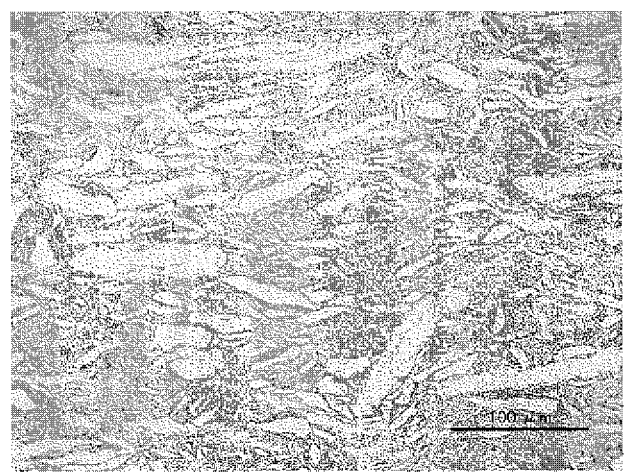
FIG. 23 is a metallurgical microscope photograph of the cross section in the thickness direction of a test piece according to Comparative Example 5 at high magnification (photographing magnification: 400 times, photograph scale: 100 μm).

FIG. 22 and FIG. 23 are metallurgical microscope photograph of the cross section in the thickness direction of the obtained test piece. FIG. 22 is a photograph at a photographing magnification of 100 times (with a photograph scale of 500 μm), and FIG. 23 is a photograph at a photographing magnification of 400 times (with a photograph scale of 100 μm).

In FIG. 22 and FIG. 23, a white phase is the metal phase. An approximately circular white phase hardly exits, and the white phase has an elliptical shape or a more elongated shape. It is considered that this is because each of the three atomized metal powders produced was mixed and dispersed with the oxide powder by a ball mill in the present Comparative Example 5. In the present Comparative Example 5, it is observed that the proportion of the white phase is a little smaller compared with Example 3. It is considered that this is because the cumulative rotation number of a ball mill when producing the magnetic powder mixture (a powder in which the Co powder and the oxide powder are mixed and dispersed) was larger compared with that in Example 3, so that the particle size of the Co powder was decreased and the Co powder was finely intermingled with the oxide powder.

Next, the produced powder mixture for pressure sintering was subjected to a hot press under the conditions of a sintering temperature of 1,120° C. and a pressure of 31 MPa for 60 minutes in an atmosphere of $5 \times 10^{-2}$ Pa or lower to produce a target with ϕ152.4 mm and a thickness of 7.0 mm. The relative density of the produced target was 98.65%.

The leakage magnetic flux from the produced target was evaluated as in Example 1. As shown in TABLE 22 below, the average leakage magnetic flux ratios was 39.9%.

TABLE 22

| | Source Field (G) | Reference Field (G) | Leakage magnetic flux density (G) | Leakage magnetic flux ratio (%) |
| --- | --- | --- | --- | --- |
| 0° | 895 | 575 | 228 | 39.7 |
| 30° | 895 | 575 | 230 | 40.0 |
| 60° | 895 | 575 | 229 | 39.8 |
| 90° | 895 | 575 | 229 | 39.8 |
| 120° | 895 | 575 | 230 | 40.0 |
| Average leakage magnetic flux ratio (%) | | | | 39.9 |

Comparative Example 6

The composition of the whole target produced as Comparative Example 6 is 91 (73Co-11Cr-16Pt)-4SiO$_2$-2TiO$_2$-3Cr$_2$O$_3$, and is the same as that of Examples 3 and 4. The three atomized metal powders produced are a 68Co-22Cr-10Pt alloy powder (a first non-magnetic metal powder), a 5Co-95Pt alloy powder (a second non-magnetic metal powder), and a Co powder (a magnetic metal powder), and are the same as those of Examples 1 to 3 and Comparative Example 5. In the present Comparative Example 6, similarly to Examples 2 and 3 and Comparative Example 5, each of all of the three atomized metal powders produced is mixed and dispersed with the oxide powder by a ball mill; the cumulative rotation number of a ball mill for the first non-magnetic metal powder (the 68Co-22Cr-10Pt alloy powder) is 1,082,160; the cumulative rotation number of a ball mill for the second non-magnetic metal powder (the 5Co-95Pt alloy powder) is 547,560; and the cumulative rotation number of a ball mill for the magnetic metal powder (the Co powder) is 3,300,840.

However, while the magnetic metal powder (the Co powder) is classified twice so that the range of the particle size is 45 μm or larger and 106 μm or smaller in Examples 1 and 2, classification is performed only once similarly to Examples 3 and 4 so that the range of the particle size of the magnetic metal powder (the Co powder) is 106 μm or smaller in the present Comparative Example 6. In this respect, the present Comparative Example 6 is different from Examples 1 and 2. Furthermore, in the present Comparative Example 6, the cumulative rotation number of a ball mill for the magnetic metal powder (the Co powder) is 3,300,840, which is more than the cumulative rotation number (1,082,160) of a ball mill for the first non-magnetic metal powder (the 68Co-22Cr-10Pt alloy powder) and the cumulative rotation number (547,560) of a ball mill for the second non-magnetic metal powder (the 5Co-95Pt alloy powder). Thus, it is considered that in the obtained target, the magnetic phase (the Co phase) is more finely interdispersed with the oxide phase than all of the non-magnetic phases (the 68Co-22Cr-10Pt alloy phase and the 5Co-95Pt alloy phase). Accordingly, the present Comparative Example 6 is not within the scope of the present invention.

The target in the present Comparative Example 6 was produced and evaluated as follows.

Atomization and classification were performed in the same manner as in Examples 1 to 3 and Comparative Example 5 to obtain a 68Co-22Cr-10Pt alloy powder (having a particle size of 106 μm or smaller).

To 1155.56 g of the obtained 68Co-22Cr-10Pt alloy powder, 42.51 g of a SiO$_2$ powder, 28.29 g of a TiO$_2$ powder, and 80.57 g of a Cr$_2$O$_3$ powder were added. Then, the mixture was mixed and dispersed by a ball mill (with the cumulative rotation number of a ball mill of 1,082,160) to obtain a first non-magnetic powder mixture.

Atomization and classification were performed in the same manner as in Examples 1 to 3 and Comparative Example 5 to obtain a 5Co-95Pt alloy powder (having a particle size of 106 μm or smaller).

To 1410.60 g of the obtained 5Co-95Pt alloy powder, 25.06 g of a SiO$_2$ powder, 16.68 g of a TiO$_2$ powder, and 47.52 g of a Cr$_2$O$_3$ powder were added. Then, the mixture was mixed and dispersed by a ball mill (with the cumulative rotation number of a ball mill of 547,560) to obtain a second non-magnetic powder mixture.

Atomization was performed in the same manner as in Examples 1 to 3 and Comparative Example 5 to obtain a Co powder. Then, similarly to Examples 3 and 4, the obtained Co powder was classified only through a 150 mesh sieve into a Co powder having a particle size of 106 μm or smaller.

To 1478.28 g of the obtained classified Co powder, 61.96 g of a SiO$_2$ powder, 41.24 g of a TiO$_2$ powder, and 117.44 g of a Cr$_2$O$_3$ powder were added. Then, the mixture was mixed and dispersed by a ball mill (with the cumulative rotation number of a ball mill of 3,300,840) to obtain a magnetic powder mixture.

Next, 602.13 g of the first non-magnetic powder mixture (a powder in which the 68Co-22Cr-10Pt alloy powder and the oxide powder are mixed and dispersed), 347.66 g of the second non-magnetic powder mixture (a powder in which the 5Co-95Pt alloy powder and the oxide powder are mixed and dispersed), and 390.23 g of the magnetic powder mixture (a powder in which the Co powder and the oxide powder are mixed and dispersed) were mixed and dispersed by a Turbula shaker in the same manner as in Example 1 to obtain a powder mixture for pressure sintering.

30 g of the produced powder mixture for pressure sintering was subjected to a hot press under the conditions of a sintering temperature of 1,120° C. and a pressure of 31 MPa for 30 minutes in an atmosphere of $5 \times 10^{-2}$ Pa or lower to produce a test piece ($\phi$30 mm). The thickness of the obtained test piece was about 4.6 mm. The relative density of the produced test piece was 98.79%.

Figure 24:
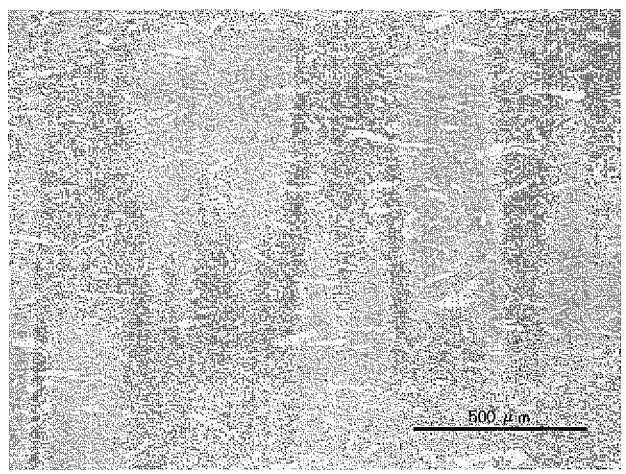
FIG. 24 is a metallurgical microscope photograph of the cross section in the thickness direction of a test piece according to Comparative Example 6 at low magnification (photographing magnification: 100 times, photograph scale: 500 μm).
Figure 25:
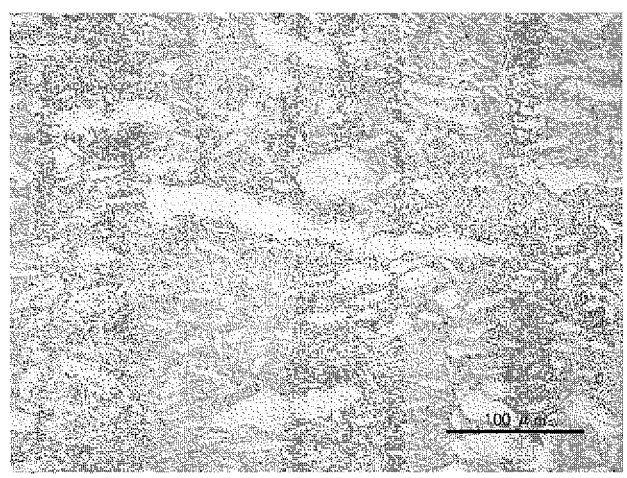
FIG. 25 is a metallurgical microscope photograph of the cross section in the thickness direction of a test piece according to Comparative Example 6 at high magnification (photographing magnification: 400 times, photograph scale: 100 μm).

FIG. 24 and FIG. 25 are metallurgical microscope photograph of the cross section in the thickness direction of the obtained test piece. FIG. 24 is a photograph at a photographing magnification of 100 times (with a photograph scale of 500 μm), and FIG. 25 is a photograph at a photographing magnification of 400 times (with a photograph scale of 100 μm).

In FIG. 24 and FIG. 25, a white phase is the metal phase. An approximately circular white phase hardly exits, and the white phase has an elliptical shape or a more elongated shape. It is considered that this is because each of the three atomized metal powders produced was mixed and dispersed with the oxide powder by a ball mill in the present Comparative Example 6. In the present Comparative Example 6, it is observed that the proportion of the white phase is a little smaller compared with Comparative Example 5. It is considered that this is because the cumulative rotation number of a ball mill when producing the second non-magnetic powder mixture (a powder in which the 5Co-95Pt alloy powder and the oxide powder are mixed and dispersed) was larger compared with that in Comparative Example 5, so that the particle size of the 5Co-95Pt alloy powder was decreased, and the 5Co-95Pt alloy powder was finely intermingled with the oxide powder.

Next, the produced powder mixture for pressure sintering was subjected to a hot press under the conditions of a sintering temperature of 1,120° C. and a pressure of 31 MPa for 60 minutes in an atmosphere of $5 \times 10^{-2}$ Pa or lower to produce a target with $\phi$152.4 mm and a thickness of 7.0 mm. The relative density of the produced target was 98.34%.

The leakage magnetic flux from the produced target was evaluated as in Example 1. As shown in TABLE 23 below, the average leakage magnetic flux ratios was 38.6%.

TABLE 23

| | Source Field (G) | Reference Field (G) | Leakage magnetic flux density (G) | Leakage magnetic flux ratio (%) |
|---|---|---|---|---|
| 0° | 892 | 556 | 215 | 38.7 |
| 30° | 892 | 556 | 216 | 38.8 |
| 60° | 892 | 556 | 215 | 38.7 |
| 90° | 892 | 556 | 214 | 38.5 |
| 120° | 892 | 556 | 212 | 38.1 |
| Average leakage magnetic flux ratio (%) | | | | 38.6 |

Comparative Example 7

The composition of the whole target produced as Comparative Example 7 is 91 (73Co-11Cr-16Pt)-4SiO$_2$-2TiO$_2$-3Cr$_2$O$_3$, and is the same as that of Example 3 and Comparative Examples 1 and 2. The three atomized metal powders produced are a 68Co-22Cr-10Pt alloy powder (a first non-magnetic metal powder), a 5Co-95Pt alloy powder (a second non-magnetic metal powder), and a Co powder (a magnetic metal powder), and are the same as those of Examples 1 to 3 and Comparative Examples 1 and 2. In the present Comparative Example 7, similarly to Examples 2 and 3 and Comparative Examples 1 and 2, each of all of the three atomized metal powders produced is mixed and dispersed with the oxide powder by a ball mill; the cumulative rotation number of a ball mill for the first non-magnetic metal powder (the 68Co-22Cr-10Pt alloy powder) is 1,082,160; the cumulative rotation number of a ball mill for the second non-magnetic metal powder (the 5Co-95Pt alloy powder) is 1,573,560; and the cumulative rotation number of a ball mill for the magnetic metal powder (the Co powder) is 3,300,840.

However, while the magnetic metal powder (the Co powder) is classified twice so that the range of the particle size is 45 μm or larger and 106 μm or smaller in Examples 1 and 2, classification is performed only once similarly to Example 3 and Comparative Examples 5 and 6 so that the range of the particle size of the magnetic metal powder (the Co powder) is 106 μm or smaller in the present Comparative Example 7. In this respect, the present Comparative Example 7 is different from Examples 1 and 2. Furthermore, in the present Comparative Example 7, the cumulative rotation number of a ball mill for the magnetic metal powder (the Co powder) is 3,300,840, which is more than the cumulative rotation number (1,082,160) of a ball mill for the first non-magnetic metal powder (the 68Co-22Cr-10Pt alloy powder) and the cumulative rotation number (1,573,560) of a ball mill for the second non-magnetic metal powder (the 5Co-95Pt alloy powder). Thus, it is considered that in the obtained target, the magnetic phase (the Co phase) is more finely interdispersed with the oxide phase than all of the non-magnetic phases (the 68Co-22Cr-10Pt alloy phase and the 5Co-95Pt alloy phase). Accordingly, the present Comparative Example 7 is not within the scope of the present invention.

The target in the present Comparative Example 7 was produced and evaluated as follows.

Atomization and classification were performed in the same manner as in Examples 1 to 3 and Comparative Examples 5 and 6 to obtain a 68Co-22Cr-10Pt alloy powder (having a particle size of 106 μm or smaller).

To 1155.56 g of the obtained 68Co-22Cr-10Pt alloy powder, 42.51 g of a SiO$_2$ powder, 28.29 g of a TiO$_2$ powder, and 80.57 g of a Cr$_2$O$_3$ powder were added. Then, the mixture was mixed and dispersed by a ball mill (with the cumulative rotation number of a ball mill of 1,082,160) to obtain a first non-magnetic powder mixture.

Atomization and classification were performed in the same manner as in Examples 1 to 3 and Comparative Examples 5 and 6 to obtain a 5Co-95Pt alloy powder (having a particle size of 106 μm or smaller).

To 1410.60 g of the obtained 5Co-95Pt alloy powder, 25.06 g of a SiO$_2$ powder, 16.68 g of a TiO$_2$ powder, and 47.52 g of a Cr$_2$O$_3$ powder were added. Then, the mixture was mixed and dispersed by a ball mill (with the cumulative rotation number of a ball mill of 1,573,560) to obtain a second non-magnetic powder mixture.

Atomization was performed in the same manner as in Examples 1 to 3 and Comparative Examples 5 and 6 to obtain a Co powder. Then, similarly to Examples 3 to 5, the obtained Co powder was classified only through a 150 mesh sieve into a Co powder having a particle size of 106 μm or smaller.

To 1478.28 g of the obtained classified Co powder, 61.96 g of a SiO$_2$ powder, 41.24 g of a TiO$_2$ powder, and 117.44 g of a Cr$_2$O$_3$ powder were added. Then, the mixture was mixed and dispersed by a ball mill (with the cumulative rotation number of a ball mill of 3,300,840) to obtain a magnetic powder mixture.

Next, 602.13 g of the first non-magnetic powder mixture (a powder in which the 68Co-22Cr-10Pt alloy powder and the oxide powder are mixed and dispersed), 347.66 g of the second non-magnetic powder mixture (a powder in which the 5Co-95Pt alloy powder and the oxide powder are mixed and dispersed), and 390.23 g of the magnetic powder mixture (a powder in which the Co powder and the oxide powder are mixed and dispersed) were mixed and dispersed by a Turbula shaker in the same manner as in Example 1 to obtain a powder mixture for pressure sintering.

30 g of the produced powder mixture for pressure sintering was subjected to a hot press under the conditions of a sintering temperature of 1,120° C. and a pressure of 31 MPa for 30 minutes in an atmosphere of 5×10$^{-2}$ Pa or lower to produce a test piece (φ30 mm). The thickness of the obtained test piece was about 4.6 mm. The relative density of the produced test piece was 98.39%.

Figure 26:
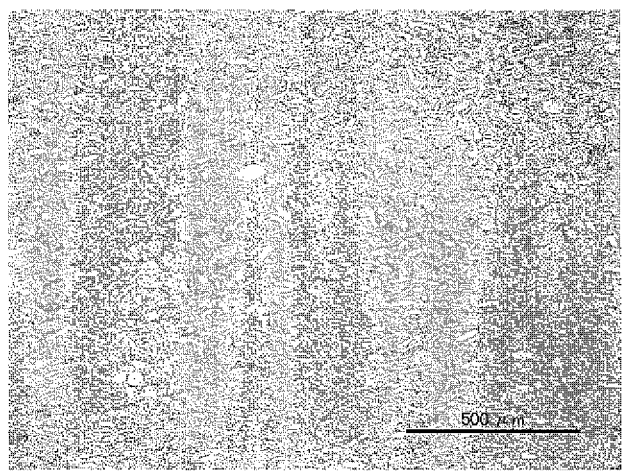
FIG. 26 is a metallurgical microscope photograph of the cross section in the thickness direction of a test piece according to Comparative Example 7 at low magnification (photographing magnification: 100 times, photograph scale: 500 μm).
Figure 27:
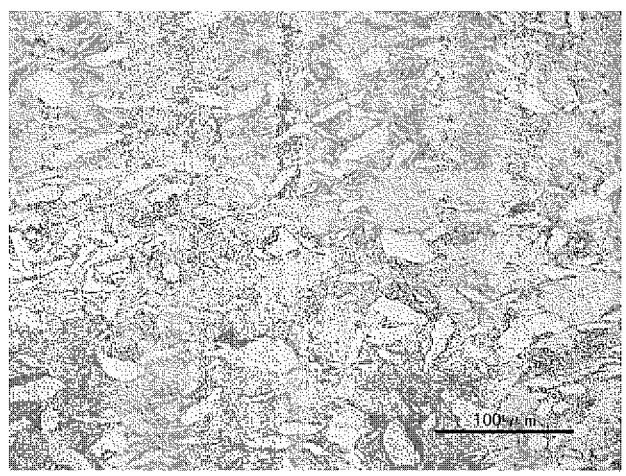
FIG. 27 is a metallurgical microscope photograph of the cross section in the thickness direction of a test piece according to Comparative Example 7 at high magnification (photographing magnification: 400 times, photograph scale: 100 μm).

FIG. 26 and FIG. 27 are metallurgical microscope photograph of the cross section in the thickness direction of the obtained test piece. FIG. 26 is a photograph at a photographing magnification of 100 times (with a photograph scale of 500 μm), and FIG. 27 is a photograph at a photographing magnification of 400 times (with a photograph scale of 100 μm).

In FIG. 26 and FIG. 27, a white phase is the metal phase. An approximately circular white phase hardly exits, and the white phase has an elliptical shape or a more elongated shape. It is considered that this is because each of the three atomized metal powders produced was mixed and dispersed with the oxide powder by a ball mill in the present Comparative Example 7. In the present Comparative Example 7, the size of the white phase is smaller compared with those of Example 3 and Comparative Examples 5 and 6. It is considered that this is because the cumulative rotation number of a ball mill for each of the 68Co-22Cr-10Pt alloy powder (the first non-magnetic metal powder), the 5Co-95Pt alloy powder (the second non-magnetic metal powder) and the Co powder (the magnetic metal powder) exceeded 1,000,000 when producing the powder mixture with the oxide powder, so that the size of each metal powder was considerably decreased during mixing with the oxide powder by a ball mill.

Next, the produced powder mixture for pressure sintering was subjected to a hot press under the conditions of a sintering temperature of 1,120° C. and a pressure of 31 MPa for 60 minutes in an atmosphere of 5×10$^{-2}$ Pa or lower to produce a target with φ152.4 mm and a thickness of 7.0 mm. The relative density of the produced target was 98.23%.

The leakage magnetic flux from the produced target was evaluated as in Example 1. As shown in TABLE 24 below, the average leakage magnetic flux ratios was 35.5%.

TABLE 24

| Source Field (G) | Reference Field (G) | Leakage magnetic flux density (G) | Leakage magnetic flux ratio (%) |
|---|---|---|---|
| 0° | 893 | 560 | 200 | 35.7 |
| 30° | 893 | 560 | 199 | 35.5 |
| 60° | 893 | 560 | 199 | 35.5 |

TABLE 24-continued

| Source Field (G) | Reference Field (G) | Leakage magnetic flux density (G) | Leakage magnetic flux ratio (%) |
|---|---|---|---|
| 90° | 893 | 560 | 199 | 35.5 |
| 120° | 893 | 560 | 199 | 35.5 |
| Average leakage magnetic flux ratio (%) | | | 35.5 |

Comparative Example 8

The composition of the whole target produced as Comparative Example 8 is 91(73Co-11Cr-16Pt)-4SiO$_2$-2TiO$_2$-3Cr$_2$O$_3$, and is the same as that of Examples 3 and Comparative Examples 5 to 7. The three atomized metal powders produced are a 68Co-22Cr-10Pt alloy powder (a first non-magnetic metal powder), a 5Co-95Pt alloy powder (a second non-magnetic metal powder), and a Co powder (a magnetic metal powder), and are the same as those of Examples 1 to 3 and Comparative Examples 5 to 7. In the present Comparative Example 8, similarly to Examples 2 and 3 and Comparative Examples 5 to 7, each of all of the three atomized metal powders produced is mixed and dispersed with the oxide powder by a ball mill; the cumulative rotation number of a ball mill for the first non-magnetic metal powder (the 68Co-22Cr-10Pt alloy powder) is 2,390,040; the cumulative rotation number of a ball mill for the second non-magnetic metal powder (the 5Co-95Pt alloy powder) is 1,573,560; and the cumulative rotation number of a ball mill for the magnetic metal powder (the Co powder) is 3,300,840.

However, while the magnetic metal powder (the Co powder) is classified twice so that the range of the particle size is 45 μm or larger and 106 μm or smaller in Examples 1 and 2, classification is performed only once similarly to Examples 3 to 6 so that the range of the particle size of the magnetic metal powder (the Co powder) is 106 μm or smaller in the present Comparative Example 8. In this respect, the present Comparative Example 8 is different from Examples 1 and 2. Furthermore, in the present Comparative Example 8, the cumulative rotation number of a ball mill for the magnetic metal powder (the Co powder) is 3,300,840, which is more than the cumulative rotation number (2,390,040) of a ball mill for the first non-magnetic metal powder (the 68Co-22Cr-10Pt alloy powder) and the cumulative rotation number (1,573,560) of a ball mill for the second non-magnetic metal powder (the 5Co-95Pt alloy powder). Thus, it is considered that in the obtained target, the magnetic phase (the Co phase) is more finely interdispersed with the oxide phase than all of the non-magnetic phases (the 68Co-22Cr-10Pt alloy phase and the 5Co-95Pt alloy phase). Accordingly, the present Comparative Example 8 is not within the scope of the present invention.

The target in the present Comparative Example 8 was produced and evaluated as follows.

Atomization and classification were performed in the same manner as in Examples 1 to 3 and Comparative Examples 5 to 7 to obtain a 68Co-22Cr-10Pt alloy powder (having a particle size of 106 μm or smaller).

To 1155.56 g of the obtained 68Co-22Cr-10Pt alloy powder, 42.51 g of a Si$_2$ powder, 28.29 g of a TiO$_2$ powder, and 80.57 g of a Cr$_2$O$_3$ powder were added. Then, the mixture was mixed and dispersed by a ball mill (with the cumulative rotation number of a ball mill of 2,390,040) to obtain a first non-magnetic powder mixture.

Atomization and classification were performed in the same manner as in Examples 1 to 3 and Comparative Examples 5 to 7 to obtain a 5Co-95Pt alloy powder (having a particle size of 106 μm or smaller).

To 1410.60 g of the obtained 5Co-95Pt alloy powder, 25.06 g of a SiO$_2$ powder, 16.68 g of a TiO$_2$ powder, and 47.52 g of a Cr$_2$O$_3$ powder were added. Then, the mixture was mixed and dispersed by a ball mill (with the cumulative rotation number of a ball mill of 1,573,560) to obtain a second non-magnetic powder mixture.

Atomization was performed in the same manner as in Examples 1 to 3 and Comparative Examples 5 to 7 to obtain a Co powder. Then, similarly to Example 3 and Comparative Examples 5 to 7, the obtained Co powder was classified only through a 150 mesh sieve into a Co powder having a particle size of 106 μm or smaller.

To 1478.28 g of the obtained classified Co powder, 61.96 g of a SiO$_2$ powder, 41.24 g of a TiO$_2$ powder, and 117.44 g of a Cr$_2$O$_3$ powder were added. Then, the mixture was mixed and dispersed by a ball mill (with the cumulative rotation number of a ball mill of 3,300,840) to obtain a magnetic powder mixture.

Next, 602.13 g of the first non-magnetic powder mixture (a powder in which the 68Co-22Cr-10Pt alloy powder and the oxide powder are mixed and dispersed), 347.66 g of the second non-magnetic powder mixture (a powder in which the 5Co-95Pt alloy powder and the oxide powder are mixed and dispersed), and 390.23 g of the magnetic powder mixture (a powder in which the Co powder and the oxide powder are mixed and dispersed) were mixed and dispersed by a Turbula shaker in the same manner as in Example 1 to obtain a powder mixture for pressure sintering.

30 g of the produced powder mixture for pressure sintering was subjected to a hot press under the conditions of a sintering temperature of 1,120° C. and a pressure of 31 MPa for 30 minutes in an atmosphere of 5×10$^{-2}$ Pa or lower to produce a test piece ($\phi$30 mm). The thickness of the obtained test piece was about 4.6 mm. The relative density of the produced test piece was 97.89%.

Figure 28:
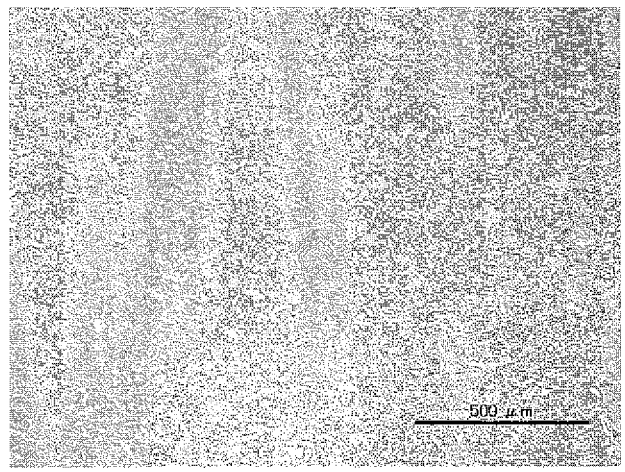
FIG. 28 is a metallurgical microscope photograph of the cross section in the thickness direction of a test piece according to Comparative Example 8 at low magnification (photographing magnification: 100 times, photograph scale: 500 μm).
Figure 29:
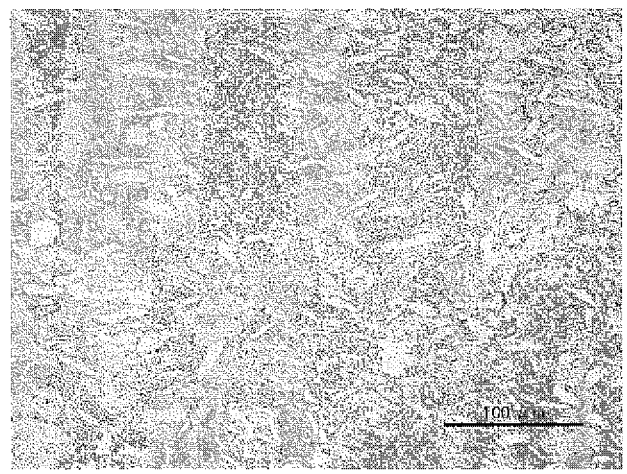
FIG. 29 is a metallurgical microscope photograph of the cross section in the thickness direction of a test piece according to Comparative Example 8 at high magnification (photographing magnification: 400 times, photograph scale: 100 μm).

FIG. 28 and FIG. 29 are metallurgical microscope photograph of the cross section in the thickness direction of the obtained test piece. FIG. 28 is a photograph at a photographing magnification of 100 times (with a photograph scale of 500 μm), and FIG. 29 is a photograph at a photographing magnification of 400 times (with a photograph scale of 100 μm).

In FIG. 28 and FIG. 29, a white phase is the metal phase. An approximately circular white phase hardly exits, and the white phase has an elliptical shape or a more elongated shape. It is considered that this is because each of the three atomized metal powders produced was mixed and dispersed with the oxide powder by a ball mill in the present Comparative Example 8. In the present Comparative Example 8, the size of the white phase is further smaller even when compared with Comparative Example 7. It is considered that this is because the cumulative rotation number of a ball mill for the 68Co-22Cr-10Pt alloy powder (the first non-magnetic metal powder) when producing the powder mixture with the oxide powder was about twice the cumulative rotation number of a ball mill for the 68Co-22Cr-10Pt alloy powder (the first non-magnetic metal powder) in Comparative Example 7, so that the size of the 68Co-22Cr-10Pt alloy powder (the first non-magnetic metal powder) was considerably smaller in the present Comparative Example 8 compared with that of Comparative Example 7.

Next, the produced powder mixture for pressure sintering was subjected to a hot press under the conditions of a sintering temperature of 1,120° C. and a pressure of 31 MPa for 60 minutes in an atmosphere of 5×10$^{-2}$ Pa or lower to produce a target with $\phi$152.4 mm and a thickness of 7.0 mm. The relative density of the produced target was 98.17%.

The leakage magnetic flux from the produced target was evaluated as in Example 1. As shown in TABLE 25 below, the average leakage magnetic flux ratios was 34.5%.

TABLE 25

| | Source Field (G) | Reference Field (G) | Leakage magnetic flux density (G) | Leakage magnetic flux ratio (%) |
|---|---|---|---|---|
| 0° | 893 | 566 | 195 | 34.5 |
| 30° | 893 | 566 | 195 | 34.5 |
| 60° | 893 | 566 | 196 | 34.6 |
| 90° | 893 | 566 | 194 | 34.3 |
| 120° | 893 | 566 | 195 | 34.5 |
| Average leakage magnetic flux ratio (%) | | | | 34.5 |

Example 4

The composition of the whole target produced as Example 4 is 91(73Co-11Cr-16Pt)-4SiO$_2$-2TiO$_2$-3Cr$_2$O$_3$, and is the same as that of Example 3 and Comparative Examples 5 to 8. The three atomized metal powders produced are a 68Co-22Cr-10Pt alloy powder (a first non-magnetic metal powder), a 5Co-95Pt alloy powder (a second non-magnetic metal powder), and a Co powder (a magnetic metal powder), and are the same as those of Examples 1 to 3 and Comparative Examples 5 to 8. In the present Example 4, similarly to Examples 2 and 3 and Comparative Examples 5 to 8, each of all of the three atomized metal powders produced is mixed and dispersed with the oxide powder by a ball mill; the cumulative rotation number of a ball mill for the first non-magnetic metal powder (the 68Co-22Cr-10Pt alloy powder) is 1,082,160; the cumulative rotation number of a ball mill for the second non-magnetic metal powder (the 5Co-95Pt alloy powder) is 1,627,560; and the cumulative rotation number of a ball mill for the magnetic metal powder (the Co powder) is 871,560. In the present Example 4, the cumulative rotation number of a ball mill for each of the first non-magnetic metal powder (the 68Co-22Cr-10Pt alloy powder) and the magnetic metal powder (the Co powder) is the same as in Example 3, but the cumulative rotation number of a ball mill for the second non-magnetic metal powder (the 5Co-95Pt alloy powder) is about 4.2 times that in Example 3.

Additionally, while the magnetic metal powder (the Co powder) is classified twice so that the range of the particle size is 45 μm or larger and 106 μm or smaller in Examples 1 and 2, classification is performed only once similarly to Example 3 and Comparative Examples 5 to 8 so that the range of the particle size of the magnetic metal powder (the Co powder) is 106 μm or smaller in the present Example 4. In this respect, the present Example 4 is different from Examples 1 and 2.

The target in the present Example 4 was produced and evaluated as follows.

Atomization and classification were performed in the same manner as in Examples 1 to 3 and Comparative Examples 5 to 8 to obtain a 68Co-22Cr-10Pt alloy powder (having a particle size of 106 μm or smaller).

To 1155.56 g of the obtained 68Co-22Cr-10Pt alloy powder, 42.51 g of a SiO$_2$ powder, 28.29 g of a TiO$_2$ powder, and 80.57 g of a Cr$_2$O$_3$ powder were added. Then, the mixture was mixed and dispersed by a ball mill (with the cumulative rotation number of a ball mill of 1,082,160) to obtain a first non-magnetic powder mixture.

Atomization and classification were performed in the same manner as in Examples 1 to 3 and Comparative Examples 5 to 8 to obtain a 5Co-95Pt alloy powder (having a particle size of 106 μm or smaller).

To 1410.60 g of the obtained 5Co-95Pt alloy powder, 25.06 g of a $SiO_2$ powder, 16.68 g of a $TiO_2$ powder, and 47.52 g of a $Cr_2O_3$ powder were added. Then, the mixture was mixed and dispersed by a ball mill (with the cumulative rotation number of a ball mill of 1,627,560) to obtain a second non-magnetic powder mixture.

Atomization was performed in the same manner as in Examples 1 to 3 and Comparative Examples 5 to 8 to obtain a Co powder. Then, similarly to Example 3 and Comparative Examples to 8, the obtained Co powder was classified only through a 150 mesh sieve into a Co powder having a particle size of 106 μm or smaller.

To 1478.28 g of the obtained classified Co powder, 61.96 g of a $SiO_2$ powder, 41.24 g of a $TiO_2$ powder, and 117.44 g of a $Cr_2O_3$ powder were added. Then, the mixture was mixed and dispersed by a ball mill (with the cumulative rotation number of a ball mill of 871,560) to obtain a magnetic powder mixture.

Next, 602.13 g of the first non-magnetic powder mixture (a powder in which the 68Co-22Cr-10Pt alloy powder and the oxide powder are mixed and dispersed), 347.66 g of the second non-magnetic powder mixture (a powder in which the 5Co-95Pt alloy powder and the oxide powder are mixed and dispersed), and 390.23 g of the magnetic powder mixture (a powder in which the Co powder and the oxide powder are mixed and dispersed) were mixed and dispersed by a Turbula shaker in the same manner as in Example 1 to obtain a powder mixture for pressure sintering.

30 g of the produced powder mixture for pressure sintering was subjected to a hot press under the conditions of a sintering temperature of 1,120° C. and a pressure of 31 MPa for 30 minutes in an atmosphere of $5 \times 10^{-2}$ Pa or lower to produce a test piece (φ30 mm). The thickness of the obtained test piece was about 4.6 mm. The relative density of the produced test piece was 98.02%.

Figure 30:
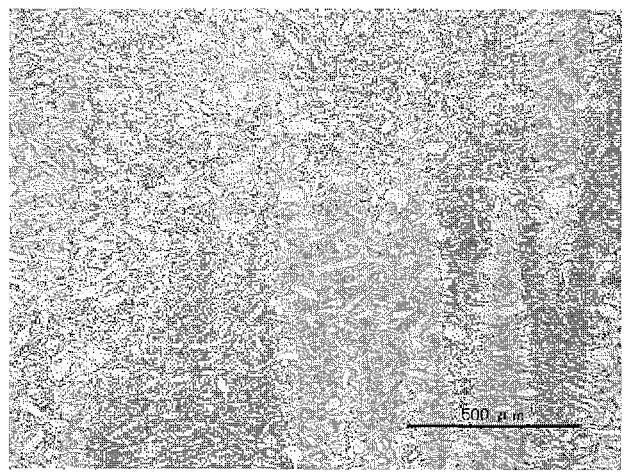
FIG. 30 is a metallurgical microscope photograph of the cross section in the thickness direction of a test piece according to Example 4 at low magnification (photographing magnification: 100 times, photograph scale: 500 μm).
Figure 31:
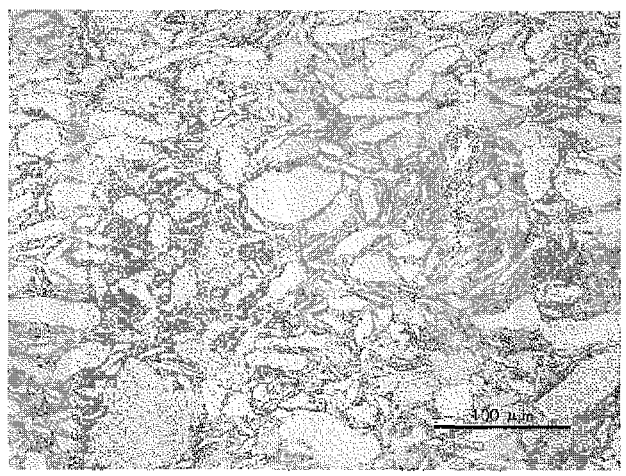
FIG. 31 is a metallurgical microscope photograph of the cross section in the thickness direction of a test piece according to Example 4 at high magnification (photographing magnification: 400 times, photograph scale: 100 μm).

FIG. 30 and FIG. 31 are metallurgical microscope photograph of the cross section in the thickness direction of the obtained test piece. FIG. 30 is a photograph at a photographing magnification of 100 times (with a photograph scale of 500 μm), and FIG. 31 is a photograph at a photographing magnification of 400 times (with a photograph scale of 100 μm).

In FIG. 30 and FIG. 31, a white phase is the metal phase. An approximately circular white phase hardly exits, and the white phase has an elliptical shape or a more elongated shape. It is considered that this is because each of the three atomized metal powders produced was mixed and dispersed with the oxide powder by a ball mill in the present Example 4.

In the present Example 4, the cumulative rotation number of a ball mill for each of the first non-magnetic metal powder (the 68Co-22Cr-10Pt alloy powder) and the magnetic metal powder (the Co powder) is the same as in Example 3, but the cumulative rotation number of a ball mill for the second non-magnetic metal powder (the 5Co-95Pt alloy powder) is about 4.2 times that in Example 3. It is considered that this is the reason why the size of the metal phase in the present Example 4 was somewhat smaller compared with the size of the metal phase in Example 3.

Next, the produced powder mixture for pressure sintering was subjected to a hot press under the conditions of a sintering temperature of 1,120° C. and a pressure of 31 MPa for 60 minutes in an atmosphere of $5 \times 10^{-2}$ Pa or lower to produce a target with φ152.4 mm and a thickness of 7.0 mm. The relative density of the produced target was 98.35%.

The leakage magnetic flux from the produced target was evaluated as in Example 1. As shown in TABLE 26 below, the average leakage magnetic flux ratios was 43.4%.

TABLE 26

| | Source Field (G) | Reference Field (G) | Leakage magnetic flux density (G) | Leakage magnetic flux ratio (%) |
|---|---|---|---|---|
| 0° | 893 | 569 | 248 | 43.6 |
| 30° | 893 | 569 | 247 | 43.4 |
| 60° | 893 | 569 | 248 | 43.6 |
| 90° | 893 | 569 | 245 | 43.1 |
| 120° | 893 | 569 | 246 | 43.2 |
| Average leakage magnetic flux ratio (%) | | | | 43.4 |

Example 5

The composition of the whole target produced as Example 5 is 91 (7300-11Cr-16Pt)-4SiO$_2$-2TiO$_2$-3Cr$_2$O$_3$, and is the same as that of Examples 3 and 4 and Comparative Examples 5 to 8. The three atomized metal powders produced are a 68Co-22Cr-10Pt alloy powder (a first non-magnetic metal powder), a 5Co-95Pt alloy powder (a second non-magnetic metal powder), and a Co powder (a magnetic metal powder), and are the same as those of Examples 1 to 4 and Comparative Examples 5 to 8. In the present Example 5, similarly to Examples 2 to 4 and Comparative Examples 5 to 8, each of all of the three atomized metal powders produced is mixed and dispersed with the oxide powder by a ball mill; the cumulative rotation number of a ball mill for the first non-magnetic metal powder (the 68Co-22Cr-10Pt alloy powder) is 2,473,200; the cumulative rotation number of a ball mill for the second non-magnetic metal powder (the 5Co-95Pt alloy powder) is 385,560; and the cumulative rotation number of a ball mill for the magnetic metal powder (the Co powder) is 871,560. In the present Example 5, the cumulative rotation number of a ball mill for each of the second non-magnetic metal powder (the 5Co-95Pt alloy powder) and the magnetic metal powder (the Co powder) is the same as in Example 3, but the cumulative rotation number of a ball mill for the first non-magnetic metal powder (the 68Co-22Cr-10Pt alloy powder) is about 2.3 times that in Example 3.

Additionally, while the magnetic metal powder (the Co powder) is classified twice so that the range of the particle size is 45 μm or larger and 106 μm or smaller in Examples 1 and 2, classification is performed only once similarly to Examples 3 and 4 and Comparative Examples 5 to 8 so that the range of the particle size of the magnetic metal powder (the Co powder) is 106 μm or smaller in the present Example 5. In this respect, the present Example 5 is different from Examples 1 and 2.

The target in the present Example 5 was produced and evaluated as follows.

Atomization and classification were performed in the same manner as in Examples 1 to 4 and Comparative Examples 5 to 8 to obtain a 68Co-22Cr-10Pt alloy powder (having a particle size of 106 μm or smaller).

To 1155.56 g of the obtained 68Co-22Cr-10Pt alloy powder, 42.51 g of a $SiO_2$ powder, 28.29 g of a $TiO_2$ powder, and 80.57 g of a $Cr_2O_3$ powder were added. Then, the mixture was mixed and dispersed by a ball mill (with the cumulative rotation number of a ball mill of 2,473,200) to obtain a first non-magnetic powder mixture.

Atomization and classification were performed in the same manner as in Examples 1 to 4 and Comparative Examples 5 to 8 to obtain a 5Co-95Pt alloy powder (having a particle size of 106 μm or smaller).

To 1410.60 g of the obtained 5Co-95Pt alloy powder, 25.06 g of a $SiO_2$ powder, 16.68 g of a $TiO_2$ powder, and 47.52 g of a $Cr_2O_3$ powder were added. Then, the mixture was mixed and dispersed by a ball mill (with the cumulative rotation number of a ball mill of 385,560) to obtain a second non-magnetic powder mixture.

Atomization was performed in the same manner as in Examples 1 to 4 and Comparative Examples 5 to 8 to obtain a Co powder. Then, similarly to Examples 3 and 4 and Comparative Examples 5 to 8, the obtained Co powder was classified only through a 150 mesh sieve into a Co powder having a particle size of 106 μm or smaller.

To 1478.28 g of the obtained classified Co powder, 61.96 g of a $SiO_2$ powder, 41.24 g of a $TiO_2$ powder, and 117.44 g of a $Cr_2O_3$ powder were added. Then, the mixture was mixed and dispersed by a ball mill (with the cumulative rotation number of a ball mill of 871,560) to obtain a magnetic powder mixture.

Next, 602.13 g of the first non-magnetic powder mixture (a powder in which the 68Co-22Cr-10Pt alloy powder and the oxide powder are mixed and dispersed), 347.66 g of the second non-magnetic powder mixture (a powder in which the 5Co-95Pt alloy powder and the oxide powder are mixed and dispersed), and 390.23 g of the magnetic powder mixture (a powder in which the Co powder and the oxide powder are mixed and dispersed) were mixed and dispersed by a Turbula shaker in the same manner as in Example 1 to obtain a powder mixture for pressure sintering.

30 g of the produced powder mixture for pressure sintering was subjected to a hot press under the conditions of a sintering temperature of 1,120° C. and a pressure of 31 MPa for 30 minutes in an atmosphere of $5 \times 10^{-2}$ Pa or lower to produce a test piece (ϕ30 mm). The thickness of the obtained test piece was about 4.6 mm. The relative density of the produced test piece was 98.42%.

Figure 32:
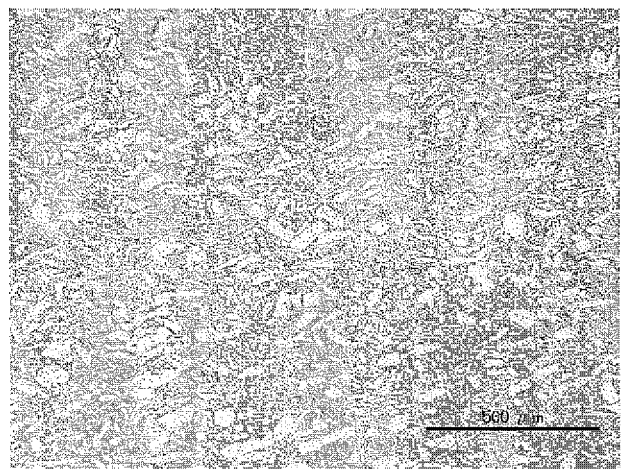
FIG. 32 is a metallurgical microscope photograph of the cross section in the thickness direction of a test piece according to Example 5 at low magnification (photographing magnification: 100 times, photograph scale: 500 μm).
Figure 33:
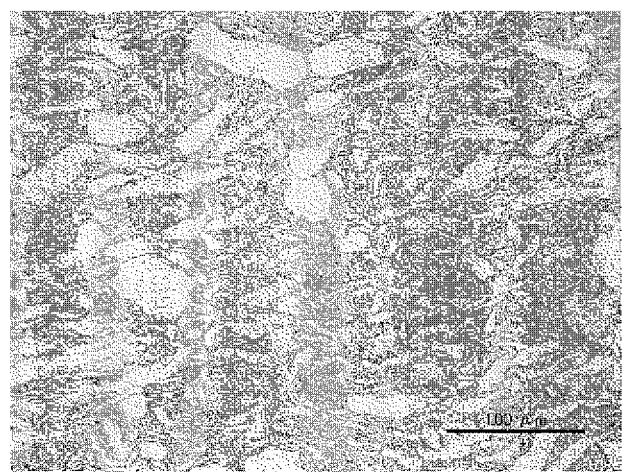
FIG. 33 is a metallurgical microscope photograph of the cross section in the thickness direction of a test piece according to Example 5 at high magnification (photographing magnification: 400 times, photograph scale: 100 μm).

FIG. 32 and FIG. 33 are metallurgical microscope photograph of the cross section in the thickness direction of the obtained test piece. FIG. 32 is a photograph at a photographing magnification of 100 times (with a photograph scale of 500 μm), and FIG. 33 is a photograph at a photographing magnification of 400 times (with a photograph scale of 100 μm).

In FIG. 32 and FIG. 33, a white phase is the metal phase. An approximately circular white phase hardly exits, and the white phase has an elliptical shape or a more elongated shape. It is considered that this is because each of the three atomized metal powders produced was mixed and dispersed with the oxide powder by a ball mill in the present Example 5.

In the present Example 5, the cumulative rotation number of a ball mill for each of the second non-magnetic metal powder (the 5Co-95Pt alloy powder) and the magnetic metal powder (the Co powder) is the same as in Example 3, but the cumulative rotation number of a ball mill for the first non-magnetic metal powder (the 68Co-22Cr-10Pt alloy powder) is about 2.3 times that in Example 3. It is considered that this is the reason why the size of the metal phase in the present Example 5 was somewhat smaller compared with the size of the metal phase in Example 3.

Next, the produced powder mixture for pressure sintering was subjected to a hot press under the conditions of a sintering temperature of 1,120° C. and a pressure of 31 MPa for 60 minutes in an atmosphere of $5 \times 10^{-2}$ Pa or lower to produce a target with ϕ152.4 mm and a thickness of 7.0 mm. The relative density of the produced target was 98.76%.

The leakage magnetic flux from the produced target was evaluated as in Example 1. As shown in TABLE 27 below, the average leakage magnetic flux ratios was 45.7%.

TABLE 27

| | Source Field (G) | Reference Field (G) | Leakage magnetic flux density (G) | Leakage magnetic flux ratio (%) |
|---|---|---|---|---|
| 0° | 895 | 574 | 263 | 45.8 |
| 30° | 895 | 574 | 263 | 45.8 |
| 60° | 895 | 574 | 263 | 45.8 |
| 90° | 895 | 574 | 262 | 45.6 |
| 120° | 895 | 574 | 262 | 45.6 |
| Average leakage magnetic flux ratio (%) | | | | 45.7 |

Example 6

The composition of the whole target produced as Example 6 is 91(73Co-11Cr-16Pt)-4$SiO_2$-2$TiO_2$-3$Cr_2O_3$, and is the same as that of Examples 3 to 5 and Comparative Examples 5 to 8. The three atomized metal powders produced are a 68Co-22Cr-10Pt alloy powder (a first non-magnetic metal powder), a 5Co-95Pt alloy powder (a second non-magnetic metal powder), and a Co powder (a magnetic metal powder), and are the same as those of Examples 1 to 5 and Comparative Examples 5 to 8. In the present Example 6, similarly to Examples 2 to 5 and Comparative Examples 5 to 8, each of all of the three atomized metal powders produced is mixed and dispersed with the oxide powder by a ball mill; the cumulative rotation number of a ball mill for the first non-magnetic metal powder (the 68Co-22Cr-10Pt alloy powder) is 2,390,040; the cumulative rotation number of a ball mill for the second non-magnetic metal powder (the 5Co-95Pt alloy powder) is 1,573,560; and the cumulative rotation number of a ball mill for the magnetic metal powder (the Co powder) is 871,560. In the present Example 6, the cumulative rotation number of a ball mill for the magnetic metal powder (the Co powder) is the same as that in Example 3, but the cumulative rotation numbers of a ball mill for the first non-magnetic metal powder (the 68Co-22Cr-10Pt alloy powder) and the second non-magnetic metal powder (the 5Co-95Pt alloy powder) are about 2.2 times and about 4.1 times those in Example 3, respectively.

Additionally, while the magnetic metal powder (the Co powder) is classified twice so that the range of the particle size is 45 μm or larger and 106 μm or smaller in Examples 1 and 2, classification is performed only once similarly to Examples 3 to 5 and Comparative Examples 5 to 8 so that the range of the particle size of the magnetic metal powder (the Co powder) is 106 μm or smaller in the present Example 6. In this respect, the present Example 6 is different from Examples 1 and 2.

The target in the present Example 6 was produced and evaluated as follows.

Atomization and classification were performed in the same manner as in Examples 1 to 5 and Comparative Examples 5 to 8 to obtain a 68Co-22Cr-10Pt alloy powder (having a particle size of 106 μm or smaller).

To 1155.56 g of the obtained 68Co-22Cr-10Pt alloy powder, 42.51 g of a $SiO_2$ powder, 28.29 g of a $TiO_2$ powder, and 80.57 g of a $Cr_2O_3$ powder were added. Then, the mixture was mixed and dispersed by a ball mill (with the cumulative rotation number of a ball mill of 2,390,040) to obtain a first non-magnetic powder mixture.

Atomization and classification were performed in the same manner as in Examples 1 to 5 and Comparative Examples 5 to 8 to obtain a 5Co-95Pt alloy powder (having a particle size of 106 μm or smaller).

To 1410.60 g of the obtained 5Co-95Pt alloy powder, 25.06 g of a $SiO_2$ powder, 16.68 g of a $TiO_2$ powder, and 47.52 g of a $Cr_2O_3$ powder were added. Then, the mixture was mixed and dispersed by a ball mill (with the cumulative rotation number of a ball mill of 1,573,560) to obtain a second non-magnetic powder mixture.

Atomization was performed in the same manner as in Examples 1 to 5 and Comparative Examples 5 to 8 to obtain a Co powder. Then, similarly to Examples 3 to 5 and Comparative Examples 5 to 8, the obtained Co powder was classified only through a 150 mesh sieve into a Co powder having a particle size of 106 μm or smaller.

To 1478.28 g of the obtained classified Co powder, 61.96 g of a $SiO_2$ powder, 41.24 g of a $TiO_2$ powder, and 117.44 g of a $Cr_2O_3$ powder were added. Then, the mixture was mixed and dispersed by a ball mill (with the cumulative rotation number of a ball mill of 871,560) to obtain a magnetic powder mixture.

Next, 602.13 g of the first non-magnetic powder mixture (a powder in which the 68Co-22Cr-10Pt alloy powder and the oxide powder are mixed and dispersed), 347.66 g of the second non-magnetic powder mixture (a powder in which the 5Co-95Pt alloy powder and the oxide powder are mixed and dispersed), and 390.23 g of the magnetic powder mixture (a powder in which the Co powder and the oxide powder are mixed and dispersed) were mixed and dispersed by a Turbula shaker in the same manner as in Example 1 to obtain a powder mixture for pressure sintering.

30 g of the produced powder mixture for pressure sintering was subjected to a hot press under the conditions of a sintering temperature of 1,120° C. and a pressure of 31 MPa for 30 minutes in an atmosphere of $5\times10^{-2}$ Pa or lower to produce a test piece (ϕ30 mm). The thickness of the obtained test piece was about 4.6 mm. The relative density of the produced test piece was 98.55%.

Figure 34:
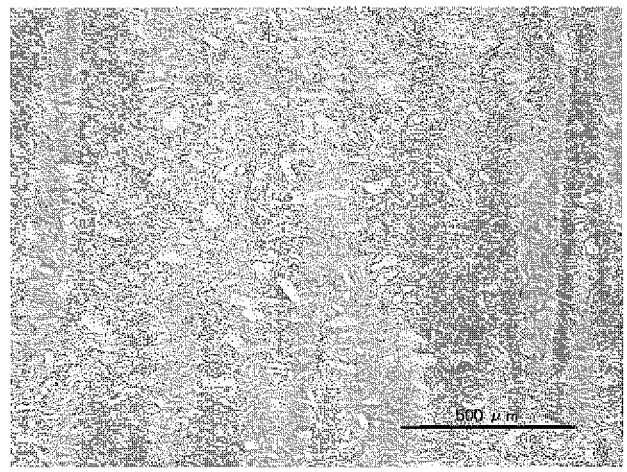
FIG. 34 is a metallurgical microscope photograph of the cross section in the thickness direction of a test piece according to Example 6 at low magnification (photographing magnification: 100 times, photograph scale: 500 μm).
Figure 35:
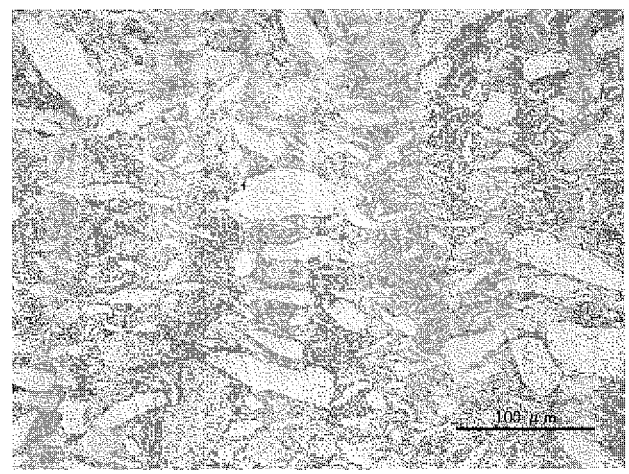
FIG. 35 is a metallurgical microscope photograph of the cross section in the thickness direction of a test piece according to Example 6 at high magnification (photographing magnification: 400 times, photograph scale: 100 μm).

FIG. 34 and FIG. 35 are metallurgical microscope photograph of the cross section in the thickness direction of the obtained test piece. FIG. 34 is a photograph at a photographing magnification of 100 times (with a photograph scale of 500 μm), and FIG. 35 is a photograph at a photographing magnification of 400 times (with a photograph scale of 100 μm).

In FIG. 34 and FIG. 35, a white phase is the metal phase. An approximately circular white phase hardly exits, and the white phase has an elliptical shape or a more elongated shape. It is considered that this is because each of the three atomized metal powders produced was mixed and dispersed with the oxide powder by a ball mill in the present Example 6.

In the present Example 6, the cumulative rotation number of a ball mill for the magnetic metal powder (the Co powder) is the same as in Example 3, but the cumulative rotation numbers of a ball mill for the first non-magnetic metal powder (the 68Co-22Cr-10Pt alloy powder) and the second non-magnetic metal powder (the 5Co-95Pt alloy powder) are about 2.2 times and about 4.1 times those in Example 3, respectively. It is considered that this is the reason why the size of the metal phase in the present Example 6 was somewhat smaller compared with the size of the metal phase in Example 3.

Next, the produced powder mixture for pressure sintering was subjected to a hot press under the conditions of a sintering temperature of 1,120° C. and a pressure of 31 MPa for 60 minutes in an atmosphere of $5\times10^{-2}$ Pa or lower to produce a target with ϕ152.4 mm and a thickness of 7.0 mm. The relative density of the produced target was 98.47%.

The leakage magnetic flux from the produced target was evaluated as in Example 1. As shown in TABLE 28 below, the average leakage magnetic flux ratios was 40.8%.

TABLE 28

| | Source Field (G) | Reference Field (G) | Leakage magnetic flux density (G) | Leakage magnetic flux ratio (%) |
|---|---|---|---|---|
| 0° | 894 | 569 | 232 | 40.8 |
| 30° | 894 | 569 | 233 | 40.9 |
| 60° | 894 | 569 | 232 | 40.8 |
| 90° | 894 | 569 | 231 | 40.6 |
| 120° | 894 | 569 | 232 | 40.8 |
| Average leakage magnetic flux ratio (%) | | | | 40.8 |

(Discussion)

The average leakage magnetic flux ratio was measured for Examples 1 to 6, Comparative Examples 1 to 8, and Reference Examples 1 and 2. The measurement results are collectively shown in Table 29 below. However, the thicker the thickness of the target is, the lower the measured average leakage magnetic flux ratio is likely to be. The thickness of the target measured on the average leakage magnetic flux ratio was 5.0 mm in Examples 1 and 2 and Comparative Examples 1 to 4; the thickness of the target measured on the average leakage magnetic flux ratio in Reference Examples 1 and 2 was 6.5 mm; and the thickness of the target measured on the average leakage magnetic flux ratio was 7.0 mm in Examples 3 to 6 and Comparative Examples 5 to 8. Thus, it should be noted that there is a difference in the thickness of the target.

TABLE 29

| | Composition and shape of target | metal powder | particle size of Co powder (μm) | average size of Co phase (μm) | relative density (%) | Average leakage magnetic flux ratio (%) |
|---|---|---|---|---|---|---|
| Example 1 | 90(71Co—10Cr—14Pt—5Ru)—7$SiO_2$—3$Cr_2O_3$ ø 152.4 × 5.0 | 68Co—22Cr—10Pt (4,136,400), 5Co—95Pt (0), Co (0) | 45-106 | — | 99.86 | 72.8 |
| Example 2 | 90(71Co—10Cr—14Pt—5Ru)—7$SiO_2$—3$Cr_2O_3$ ø 152.4 × 5.0 | 68Co—22Cr—10Pt (4,136,400), 5Co—95Pt (1,308,960), Co (493,560) | 45-106 | 45 | 99.76 | 65.2 |
| Comparative Example 1 | 90(71Co—10Cr—14Pt—5Ru)—7$SiO_2$—3$Cr_2O_3$ ø 152.4 × 5.0 | 68Co—22Cr—10Pt (4,136,400), 50Co—50Pt (2,805,840), Co (0) | ≤106 | 40 | 99.78 | 60.9 |

TABLE 29-continued

| | Composition and shape of target | metal powder | particle size of Co powder (μm) | average size of Co phase (μm) | relative density (%) | Average leakage magnetic flux ratio (%) |
|---|---|---|---|---|---|---|
| Comparative Example 2 | 90(71Co—10Cr—14Pt—5Ru)—7SiO$_2$—3Cr$_2$O$_3$ ø 152.4 × 5.0 | 68Co—22Cr—10Pt (4,136,400), 50Co—50Pt (2,805,840), Co (493,560) | 45-106 | 38 | 98.98 | 59.9 |
| Comparative Example 3 | 90(71Co—10Cr—14Pt—5Ru)—7SiO$_2$—3Cr$_2$O$_3$ ø 152.4 × 5.0 | 68Co—22Cr—10Pt (4,136,400), 50Co—50Pt (2,805,840), Co (493,560) | ≤106 | 35 | 98.98 | 56.7 |
| Comparative Example 4 | 90(71Co—10Cr—14Pt—5Ru)—7SiO$_2$—3Cr$_2$O$_3$ ø 152.4 × 5.0 | 68Co—22Cr—10Pt (4,136,400), 50Co—50Pt (2,805,840), Co (817,560) | ≤106 | 23 | 99.23 | 55.4 |
| Reference Example 1 | 91(71.5Co—11Cr—17.5Pt)—3SiO$_2$—2TiO$_2$—4Cr$_2$O$_3$ ø 152.4 × 6.5 | 68Co—22Cr—10Pt (1,308,960), 50Co—50Pt (1,082,160), Co (0) | ≤106 | 29 | 98.54 | 47.0 |
| Reference Example 2 | 91(71.5Co—11Cr—17.5Pt)—3SiO$_2$—2TiO$_2$—4Cr$_2$O$_3$ ø 152.4 × 6.5 | 68Co—22Cr—10Pt (1,308,960), 50Co—50Pt (1,082,160), Co (1,069,560) | ≤106 | — | 98.7 | 44.4 |
| Example 3 | 91(73Co—11Cr—16Pt)—4SiO$_2$—2TiO$_2$—3Cr$_2$O$_3$ ø 152.4 × 7.0 | 68Co—22Cr—10Pt (1,082,160), 5Co—95Pt (385,560), Co (871.560) | ≤106 | — | 98.96 | 48.1 |
| Comparative Example 5 | 91(73Co—11Cr—16Pt)—4SiO$_2$—2TiO$_2$—3Cr$_2$O$_3$ ø 152.4 × 7.0 | 68Co—22Cr—10Pt (1,082,160), 5Co—95Pt (385,560), Co (3,300,840) | ≤106 | — | 98.65 | 39.9 |
| Comparative Example 6 | 91(73Co—11Cr—16Pt)—4SiO$_2$—2TiO$_2$—3Cr$_2$O$_3$ ø 152.4 × 7.0 | 68Co—22Cr—10Pt (1,082,160), 5Co—95Pt (547,560), Co (3,300,840) | ≤106 | — | 98.34 | 38.6 |
| Comparative Example 7 | 91(73Co—11Cr—16Pt)—4SiO$_2$—2TiO$_2$—3Cr$_2$O$_3$ ø 152.4 × 7.0 | 68Co—22Cr—10Pt (1,082,160), 5Co—95Pt (1,573,560), Co (3,300,840) | ≤106 | — | 98.23 | 35.5 |
| Comparative Example 8 | 91(73Co—11Cr—16Pt)—4SiO$_2$—2TiO$_2$—3Cr$_2$O$_3$ ø 152.4 × 7.0 | 68Co—22Cr—10Pt (2,390,040), 5Co—95Pt (1,573,560), Co (3,300,840) | ≤106 | — | 98.17 | 34.5 |
| Example 4 | 91(73Co—11Cr—16Pt)—4SiO$_2$—2TiO$_2$—3Cr$_2$O$_3$ ø 152.4 × 7.0 | 68Co—22Cr—10Pt (1,082,160), 5Co—95Pt (1,627,560), Co (871,560) | ≤106 | — | 98.35 | 43.4 |
| Example 5 | 91(73Co—11Cr—16Pt)—4SiO$_2$—2TiO$_2$—3Cr$_2$O$_3$ ø 152.4 × 7.0 | 68Co—22Cr—10Pt (2,473,200), 5Co—95Pt (385,560), Co (871,560) | ≤106 | — | 98.76 | 45.7 |
| Example 6 | 91(73Co—11Cr—16Pt)—4SiO$_2$—2TiO$_2$—3Cr$_2$O$_3$ ø 152.4 × 7.0 | 68Co—22Cr—10Pt (2,390,040), 5Co—95Pt (1,573,560), Co (871,560) | ≤106 | — | 98.47 | 40.8 |

Note
1) Values in parentheses of metal powders are ball mill cumulative rotation numbers.

Examples 1 and 2 (the composition of the whole target is 90(71Co-10Cr-14Pt-5Ru)-7SiO$_2$-3Cr$_2$O$_3$ in both) each include the magnetic phase (the Co phase) containing Co (the ferromagnetic metal element), and the plurality of non-magnetic phases that each contain Co (the ferromagnetic metal element) and that are different in constituent elements or the content ratio of constituent elements (the first non-magnetic phase (the 68Co-22Cr-10Pt alloy phase) and the second non-magnetic phase (the 5Co-95Pt alloy phase)). Furthermore, the first non-magnetic phase (the 68Co-22Cr-10Pt alloy phase) is more finely interdispersed with the oxide phase than the magnetic phase (the Co phase). (See FIG. 4 to FIG. 7.) Therefore, Examples 1 and 2 are within the scope of the present invention. In Examples 1 and 2, since Co is contained in both of the first non-magnetic phase and the second non-magnetic phase, Co is contained in two non-magnetic phases. Therefore, the volume fraction of the magnetic phase (the Co phase) can be reduced while maintaining the Co amount in the whole target at a certain level, to increase the average leakage magnetic flux ratio of the target. Examples 1 and 2 have a larger average leakage magnetic flux ratio of 72.8% and 65.2% respectively.

When comparing the average leakage magnetic flux ratio between Examples 1 and 2, the average leakage magnetic flux ratio is smaller by about 8% in Example 2 than Example 1. It is considered that this is because, in Example 2, the magnetic metal powder (the Co powder) and the second non-magnetic metal powder (the 5Co-95Pt powder) are mixed and dispersed with the oxide by a ball mill, so that the sizes of the Co phase and the 5Co-95Pt phase in the target are decreased, and thus the leakage magnetic flux ratio of Example 2 becomes smaller than that of Example 1. Therefore, it is considered that the larger magnetic phase (the larger Co phase) in the target, and the larger second non-magnetic phase (the larger 5Co-95Pt phase) other than the first non-magnetic phase (the 68Co-22Cr-10Pt alloy phase) that is finely interdispersed with the oxide phase are preferred in terms of increasing the leakage magnetic flux ratio of the target.

The composition of the whole target in each of Comparative Examples 1 to 4 is 90(71Co-10Cr-14Pt-5Ru)-7SiO$_2$-3Cr$_2$O$_3$, which is the same as those of Examples 1 and 2. However, the Co—Pt alloy phase has a large content ratio of Co of 50 at %, and thus the Co—Pt alloy phase becomes the magnetic phase. The non-magnetic phase is only the 68Co-22Cr-10Pt alloy phase (one non-magnetic phase). Therefore, Comparative Examples 1 to 4 are not within the scope of the present invention. For this reason, the volume fraction of the magnetic phase to the whole target is larger than Examples 1 and 2, and the average value among the average leakage magnetic flux ratios of Comparative Examples 1 to 4 is smaller by about 10% than the average value between the average leakage magnetic flux ratios of Examples 1 and 2. Therefore, it is considered that the provision of the plurality of non-magnetic phases each containing the ferromagnetic metal element is effective in improving the leakage magnetic flux ratio of the target.

In Comparative Examples 1 to 4, the compositions of the whole target and the compositions of each metal phase are the same as each other, but the average sizes of the second magnetic phase (the Co phase) are different from each other. Comparison of the average size of the Co phase and the average leakage magnetic flux ratio among Comparative Examples 1 to 4 demonstrates that the larger the average size of the Co phase is, the higher the average leakage magnetic flux ratio is. Therefore, it is considered that the larger average size of the Co phase is effective in improving the leakage magnetic flux ratio of the target.

The composition of the whole target in each of Reference Examples 1 and 2 is 91 (71.5Co-11Cr-17.5Pt)-3$SiO_2$-2$TiO_2$-4$Cr_2O_3$ Similarly to Comparative Examples 1 to 4, the Co—Pt alloy phase has a large content ratio of Co of 50 at %, and thus the Co—Pt alloy phase becomes the magnetic phase. A non-magnetic phase is only the 68Co-22Cr-10Pt alloy phase (one non-magnetic phase). Therefore, Reference Examples 1 and 2 are not within the scope of the present invention. For this reason, the volume fraction of the magnetic phase to the whole target is larger than Examples 1 and 2, and the average value between the average leakage magnetic flux ratios of Reference Examples 1 and 2 is smaller by about 23% than the average value between the average leakage magnetic flux ratios of Examples 1 and 2. Therefore, it is considered that the provision of the plurality of non-magnetic phases each containing the ferromagnetic metal element is effective in improving the leakage magnetic flux ratio of the target.

The average leakage magnetic flux ratios of the targets in Reference Examples 1 and 2 are 47.0% and 44.4%, respectively. These values are considerably smaller when compared not only to Examples 1 and 2 but also to Comparative Examples 1 to 4. It is considered that this is caused by the fact that the thickness of the target in Reference Examples 1 and 2 is 6.5 mm, which is thicker by 1.5 mm than the thickness (5.0 mm) of the target in Examples 1 and 2 and Comparative Examples 1 to 4. The content ratio of Co in the target in Examples 1 and 2 and Comparative Examples 1 to 4 is about 64 mol %, while the content ratio of Co in the target in Reference Examples 1 and 2 is about 65 mol %. Thus, the target in Reference Examples 1 and 2 has a larger content ratio of Co that is a ferromagnetic metal element. However, since the difference in the content ratio of Co is slight, it is considered that the difference in the thickness of the target has a larger effect on the leakage magnetic flux ratio.

In Reference Examples 1 and 2, the compositions of the whole target and the compositions of each metal phase are the same as each other, but the fact of whether or not the second magnetic metal powder (the Co powder) and the oxide powder are mixed by a ball mill varies. That is, the Co powder and the oxide powder are not mixed by a ball mill in Reference Example 1, while the Co powder and the oxide powder are mixed by a ball mill (cumulative rotation number: 1,069,560) in Reference Example 2. Thus, it is considered that the average size of the Co phase in the target of Reference Example 2 is smaller than the average size of the Co phase in the target of Reference Example 1. On the other hand, the average leakage magnetic flux ratio of Reference Example 2 is 44.4%, which is lower by about 3% than the average leakage magnetic flux ratio (47.0%) of Reference Example 1. Therefore, it is considered that the larger average size of the Co phase is effective in improving the leakage magnetic flux ratio of the target.

Examples 3 to 6 (the composition of the whole target is 91(73Co-11Cr-16Pt)-4$SiO_2$-2$TiO_2$-3$Cr_2O_3$ in each of Examples 3 to 6) each include the magnetic phase (the Co phase) containing Co (the ferromagnetic metal element), and the plurality of non-magnetic phases that each contain Co (the ferromagnetic metal element) and that are different in constituent elements or the content ratio of constituent elements (the first non-magnetic phase (the 68Co-22Cr-10Pt alloy phase) and the second non-magnetic phase (the 5Co-95Pt alloy phase)). Furthermore, the first non-magnetic phase (the 68Co-22Cr-10Pt alloy phase) is more finely interdispersed with the oxide phase than the magnetic phase (the Co phase). Therefore, Examples 3 to 6 are within the scope of the present invention.

The average leakage magnetic flux ratios of Examples 3 to 6 are within the range of 40% or more and 49% or less. The average value of these average leakage magnetic flux ratios is smaller by about 25% than the average value between the average leakage magnetic flux ratios of Examples 1 and 2, and is the value at the same level as those in Reference Examples 1 and 2. It is considered that this is because the thickness of the target in Examples 3 to 6 is 7.0 mm, which is thicker by 2.0 mm than the thickness (5.0 mm) of the target in Examples 1 and 2, and is thicker by 0.5 mm than the thickness (6.5 mm) of the target in Reference Examples 1 and 2.

In Comparative Examples 5 to 8, the cumulative rotation numbers of a ball mill for the magnetic metal powder (the Co powder) are about 3.8 times that in Example 3. Accordingly, it is considered that the sizes of the Co phases are decreased. On the other hand, the average leakage magnetic flux ratios of Comparative Examples 5 to 8 fall within the range of 34% or more and 40% or less, and the average value of these flux ratios is smaller by about 10% than the average leakage magnetic flux ratio (48.1%) of Example 3. Therefore, it is considered that the larger magnetic metal phase (the larger Co phase) is effective in improving the leakage magnetic flux ratio of the target.

In Comparative Examples 6 and 7, the cumulative rotation numbers of a ball mill for each of the first non-magnetic metal powder (the 68Co-22Cr-10Pt alloy powder) and the magnetic metal powder (the Co powder) are the same as that in Comparative Example 5, but the cumulative rotation numbers of a ball mill for the second non-magnetic metal powder (the 5Co-95Pt alloy powder) are about 1.4 times and about 4.1 times that in Comparative Example 5, respectively. On the other hand, the average leakage magnetic flux ratios of Comparative Examples 6 and 7 are 38.6% and 35.5%, respectively, which are lower by about 1% and about 4% respectively than the average leakage magnetic flux ratio (39.9%) of Comparative Example 5. Therefore, it is considered that the larger size of the second non-magnetic metal phase (the 5Co-95Pt alloy phase) is effective in improving the leakage magnetic flux ratio of the target.

In Example 4, the cumulative rotation number of a ball mill for each of the first non-magnetic metal powder (the 68Co-22Cr-10Pt alloy powder) and the magnetic metal powder (the Co powder) is the same as that in Example 3, but the cumulative rotation number of a ball mill for the second non-magnetic metal powder (the 5Co-95Pt alloy powder) is 4.2 times that in Example 3. Thus, it is considered that the second non-magnetic metal phase (the 5Co-95Pt alloy phase) is more finely interdispersed with the oxide phase in Example 4 than in Example 3. On the other hand, the average leakage magnetic flux ratio of Example 4 is 43.4%, which is lower by about 5% than the average leakage magnetic flux ratio (48.1%) of Example 3. Therefore, it is considered that the larger size of the second non-magnetic metal phase (the 5Co-95Pt alloy phase) is effective in improving the leakage magnetic flux ratio of the target.

However, the reduction amount in the average leakage magnetic flux ratio when the second non-magnetic metal phase (the 5Co-95Pt alloy phase) is decreased in size is smaller than the reduction amount in the average leakage magnetic flux ratio when the magnetic metal phase (the Co phase) is decreased in size. Therefore, it is considered that the larger magnetic metal phase (the larger Co phase) is more effective than the larger second non-magnetic metal phase (the larger 5Co-95Pt alloy phase) in improving the average leakage magnetic flux ratio.

In Example 5, the cumulative rotation number of a ball mill for each of the second non-magnetic metal powder (the 5Co-95Pt alloy powder) and the magnetic metal powder (the Co powder) is the same as that in Example 3, but the cumulative rotation number of a ball mill for the first non-magnetic metal powder (the 68Co-22Cr-10Pt alloy powder) is about 2.3 times that in Example 3. On the other hand, the average leakage magnetic flux ratio of Example 5 is 45.7%, which is lower by about 2% than the average leakage magnetic flux ratio (48.1%) of Example 3. Therefore, it is considered that the larger size of the first non-magnetic metal phase (the 68Co-22Cr-10Pt alloy phase) is also effective in improving the leakage magnetic flux ratio of the target.

In Comparative Example 8, the cumulative rotation number of a ball mill for each of the second non-magnetic metal powder (the 5Co-95Pt alloy powder) and the magnetic metal powder (the Co powder) is the same as that in Comparative Example 7, but the cumulative rotation number of a ball mill for the first non-magnetic metal powder (the 68Co-22Cr-10Pt alloy powder) is about 2.2 times that in Comparative Example 7. On the other hand, the average leakage magnetic flux ratio of Comparative Example 8 is 34.5%, which is lower by about 1% than the average leakage magnetic flux ratio (35.5%) of Comparative Example 7. Therefore, it is considered that the larger size of the first non-magnetic metal phase (the 68Co-22Cr-10Pt alloy phase) is also effective in improving the leakage magnetic flux ratio of the target.

However, the reduction amount in the average leakage magnetic flux ratio when the first non-magnetic metal phase (the 68Co-22Cr-10Pt alloy phase) is decreased in size is smaller than the reduction amount in the average leakage magnetic flux ratio when the second magnetic metal phase (the 5Co-95Pt phase) is decreased in size. Therefore, it is considered that the larger second non-magnetic metal phase (the larger 5Co-95Pt phase) is more effective than the larger first non-magnetic metal phase (the larger 68Co-22Cr-10Pt alloy phase) in improving the average leakage magnetic flux ratio.

In Example 6, the cumulative rotation number of a ball mill for the magnetic metal powder (the Co powder) is the same as that in Example 3, but the cumulative rotation number of a ball mill for the first non-magnetic metal powder (the 68Co-22Cr-10Pt alloy powder) is about 2.2 times that in Example 3, and the cumulative rotation number of a ball mill for the second non-magnetic metal powder (the 5Co-95Pt alloy powder) is about 4.1 times that in Example 3. On the other hand, the average leakage magnetic flux ratio of Example 6 is 40.8%, which is lower by about 7% than the average leakage magnetic flux ratio (48.1%) of Example 3. It is considered that this is because the sizes of the first non-magnetic metal phase (the 68Co-22Cr-10Pt alloy phase) and the second non-magnetic metal phase (the 5Co-95Pt alloy phase) were decreased compared with Example 3.

Finally, the dispersion state between the 68Co-22Cr-10Pt alloy phase and the oxide phase in the target will be also mentioned.

In Examples 1 and 2 and Comparative Examples 1 to 4, the 68Co-22Cr-10Pt alloy powder, that is the non-magnetic metal powder, and the oxide powder are mixed by a ball mill with a cumulative rotation number of up to 4,136,400. Accordingly, it is considered that the 68Co-22Cr-10Pt alloy phase and the oxide phase are finely interdispersed with each other in the obtained target. Furthermore, the results from actual observations of the obtained sintered body with a metallurgical microscope (FIG. 4 to FIG. 15) also show that the 68Co-22Cr-10Pt alloy phase and the oxide phase are finely interdispersed with each other. In Reference Examples 1 and 2, the 68Co-22Cr-10Pt alloy powder, that is the non-magnetic metal powder, and the oxide powder are mixed by a ball mill with a cumulative rotation number of up to 1,308,960. Accordingly, it is considered that the 68Co-22Cr-10Pt alloy phase and the oxide phase are finely interdispersed with each other in the obtained target. Furthermore, the results from actual observations of the obtained sintered body with a metallurgical microscope (FIG. 16 to FIG. 19) also show that the 68Co-22Cr-10Pt alloy phase and the oxide phase are finely interdispersed with each other. In Examples 3 to 6 and Comparative Examples 5 to 8, the 68Co-22Cr-10Pt alloy powder, that is the non-magnetic metal powder, and the oxide powder are mixed by a ball mill with a cumulative rotation number of 1,082,160 or more. Accordingly, it is considered that the 68Co-22Cr-10Pt alloy phase and the oxide phase are finely interdispersed with each other in the obtained target. Furthermore, the results from actual observations of the obtained sintered body with a metallurgical microscope (FIG. 20 to FIG. 35) also show that the 68Co-22Cr-10Pt alloy phase and the oxide phase are finely interdispersed with each other.

Thus, the 68Co-22Cr-10Pt alloy phase and the oxide phase are finely interdispersed with each other, not only in Examples 1 to 6 which are within the scope of the present invention, but also in Comparative Examples 1 to 8 and Reference Examples 1 and 2 which are not within the scope of the present invention. Therefore, it is considered that actual sputtering with the target of any of Examples 1 to 6, Comparative Examples 1 to 8 and Reference Examples 1 and 2 is unlikely to cause failure such as nodules and particles.

INDUSTRIAL APPLICABILITY

The target according to the present invention can be suitably used as a magnetron sputtering target. The manufacturing method according to the present invention can be suitably used as a method for manufacturing a magnetron sputtering target.

REFERENCE SIGNS LIST

10 target
12 magnetic phase
14 first non-magnetic phase
16 second non-magnetic phase
18 oxide phase

The invention claimed is:

1. A magnetron sputtering target having a ferromagnetic metal element, the magnetron sputtering target including a sintered body that comprises:
    a magnetic phase containing the ferromagnetic metal element;
    a plurality of non-magnetic phases that each contain the ferromagnetic metal element and that are different in constituent elements or a content ratio of constituent elements; and
    an oxide phase,
    wherein an average size of at least one of the plurality of non-magnetic phases, which is interspersed with the oxide phase, is smaller than an average size of the magnetic phase.

2. The magnetron sputtering target according to claim 1, wherein an average size of one of the plurality of non-magnetic phases, which is interspersed with the oxide phase, is smaller than an average size of another of the plurality of non-magnetic phases.

3. The magnetron sputtering target according to claim 1, wherein the magnetic phase has an average phase size of 40 μm or larger and 80 μm or smaller.

4. The magnetron sputtering target according to claim 1, wherein the plurality of non-magnetic phases are two non-magnetic phases.

5. The magnetron sputtering target according to claim 1, wherein the ferromagnetic metal element is Co.

6. The magnetron sputtering target according to claim 5, wherein the magnetic phase is a Co—Cr alloy phase in which the ratio of an amount of Co is 85 at % or more.

7. The magnetron sputtering target according to claim 5, wherein the magnetic phase is composed only of Co.

8. The magnetron sputtering target according to claim 5, wherein at least one of the non-magnetic phases is a Co—Cr alloy phase in which the ratio of an amount of Co is more than 0 at % and 75 at % or less or a Co—Cr—Pt alloy phase in which the ratio of an amount of Co is more than 0 at % and 73 at % or less.

9. The magnetron sputtering target according to claim 5, wherein at least one of the non-magnetic phases is a Co—Pt alloy phase in which the ratio of an amount of Co is more than 0 at % and 12 at % or less.

10. The magnetron sputtering target according to claim 1, wherein the oxide phase contains at least one of $SiO_2$, $TiO_2$, $Ti_2O_3$, $Ta_2O_5$, $Cr_2O_3$, CoO, $Co_3O_4$, $B_2O_3$, $Fe_2O_3$, CuO, $Y_2O_3$, MgO, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

11. A manufacturing method of a magnetron sputtering target, the method comprising:
    mixing and dispersing:
        (i) a first non-magnetic metal powder containing a ferromagnetic metal element, and
        (ii) an oxide powder
        to obtain a non-magnetic powder mixture, wherein the mixing and dispersing is performed with a ball mill until a cumulative rotation number of 1,000,000 or more of the ball mill is reached during the mixing and dispersing; and
    mixing and dispersing:
        (i) the obtained non-magnetic powder mixture,
        (ii) a magnetic metal powder containing the ferromagnetic metal element, and
        (iii) a second non-magnetic metal powder containing the ferromagnetic metal element, the second non-magnetic metal powder being different in constituent elements or a content ratio of constituent elements from the first non-magnetic metal powder
        to obtain a powder mixture for pressure sintering,
    wherein:
        the mixing and dispersing to obtain the powder mixture for pressure sintering is terminated before each particle size decreases; and
        the powder mixture for pressure sintering has particle sizes of its respective constituent components so as to provide, in a sintered body made from the powder mixture, an average size of a phase comprising the first non-magnetic metal powder that is smaller than an average size of a phase comprising the magnetic metal powder.

12. A manufacturing method of a magnetron sputtering target, the method comprising:
    mixing and dispersing:
        (i) a first non-magnetic metal powder containing a ferromagnetic metal element, and
        (ii) a first oxide powder
        to obtain a non-magnetic powder mixture, wherein the mixing and dispersing is performed with a ball mill until a cumulative rotation number of 1,000,000 or more of the ball mill is reached during the mixing and dispersing; and
    mixing and dispersing:
        (i) the obtained non-magnetic powder mixture,
        (ii) a magnetic metal powder containing the ferromagnetic metal element,
        (iii) a second non-magnetic metal powder containing the ferromagnetic metal element, the second non-magnetic metal powder being different in constituent elements or a content ratio of constituent elements from the first non-magnetic metal powder, and
        (iv) a second oxide powder,
        to obtain a powder mixture for pressure sintering,
    wherein:
        the mixing and dispersing to obtain the powder mixture for pressure sintering is terminated before each particle size decreases; and
        the powder mixture for pressure sintering has particle sizes of its respective constituent components so as to provide, in a sintered body made from the powder mixture, an average size of a phase comprising the first non-magnetic metal powder that is smaller than an average size of a phase comprising the magnetic metal powder.

13. The manufacturing method of a magnetron sputtering target according to claim 11, wherein two types of non-magnetic metal powders are used.

14. The manufacturing method of a magnetron sputtering target according to claim 11, wherein the ferromagnetic metal element is Co.

15. The manufacturing method of a magnetron sputtering target according to claim 14, wherein the magnetic metal powder contains Co and Cr as main components, and the ratio of an amount of Co contained in the magnetic metal powder is 85 at % or more.

16. The manufacturing method of a magnetron sputtering target according to claim 14, wherein the magnetic metal powder is composed only of Co.

17. The manufacturing method of a magnetron sputtering target according to claim 14, wherein at least one of the plurality of non-magnetic metal powders is a Co—Cr alloy in which the ratio of an amount of Co is more than 0 at % and 75 at % or less or a Co—Cr—Pt alloy in which the ratio of an amount of Co is more than 0 at % and 73 at % or less.

18. The manufacturing method of a magnetron sputtering target according to claim 14, wherein at least one of the plurality of non-magnetic metal powders is a Co—Pt alloy in which the ratio of an amount of Co is more than 0 at % and 12 at % or less.

19. A magnetron sputtering target obtained by the manufacturing method according to claim 11.

20. The magnetron sputtering target according to claim 2, wherein the magnetic phase has an average phase size of 40 µm or larger and 80 µm or smaller.

21. The magnetron sputtering target according to claim 2, wherein the plurality of non-magnetic phases are two non-magnetic phases.

22. The magnetron sputtering target according to claim 2, wherein the ferromagnetic metal element is Co.

23. The magnetron sputtering target according to claim 22, wherein the magnetic phase is a Co—Cr alloy phase in which the ratio of an amount of Co is 85 at % or more.

24. The magnetron sputtering target according to claim 22, wherein the magnetic phase is composed only of Co.

25. The magnetron sputtering target according to claim 22, wherein at least one of the non-magnetic phases is a Co—Cr alloy phase in which the ratio of an amount of Co is more than 0 at % and 75 at % or less or a Co—Cr—Pt alloy phase in which the ratio of an amount of Co is more than 0 at % and 73 at % or less.

26. The magnetron sputtering target according to claim 22, wherein at least one of the non-magnetic phases is a Co—Pt alloy phase in which the ratio of an amount of Co is more than 0 at % and 12 at % or less.

27. The magnetron sputtering target according to claim 2, wherein the oxide phase contains at least one of $SiO_2$, $TiO_2$, $Ti_2O_3$, $Ta_2O_5$, $Cr_2O_3$, $CoO$, $Co_3O_4$, $B_2O_3$, $Fe_2O_3$, $CuO$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

28. The magnetron sputtering target according to claim 5, wherein the oxide phase contains at least one of $SiO_2$, $TiO_2$, $Ti_2O_3$, $Ta_2O_5$, $Cr_2O_3$, $CoO$, $Co_3O_4$, $B_2O_3$, $Fe_2O_3$, $CuO$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

29. The magnetron sputtering target according to claim 22, wherein the oxide phase contains at least one of $SiO_2$, $TiO_2$, $Ti_2O_3$, $Ta_2O_5$, $Cr_2O_3$, $CoO$, $Co_3O_4$, $B_2O_3$, $Fe_2O_3$, $CuO$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

30. The manufacturing method of a magnetron sputtering target according to claim 12, wherein two types of non-magnetic metal powders are used.

31. The manufacturing method of a magnetron sputtering target according to claim 12, wherein the ferromagnetic metal element is Co.

32. The manufacturing method of a magnetron sputtering target according to claim 31, wherein the magnetic metal powder contains Co and Cr as main components, and the ratio of an amount of Co contained in the magnetic metal powder is 85 at % or more.

33. The manufacturing method of a magnetron sputtering target according to claim 31, wherein the magnetic metal powder is composed only of Co.

34. The manufacturing method of a magnetron sputtering target according to claim 31, wherein at least one of the plurality of non-magnetic metal powders is a Co—Cr alloy in which the ratio of an amount of Co is more than 0 at % and 75 at % or less or a Co—Cr—Pt alloy in which the ratio of an amount of Co is more than 0 at % and 73 at % or less.

35. The manufacturing method of a magnetron sputtering target according to claim 31, wherein at least one of the plurality of non-magnetic metal powders is a Co—Pt alloy in which the ratio of an amount of Co is more than 0 at % and 12 at % or less.

36. A magnetron sputtering target obtained by the manufacturing method according to claim 12.

37. The manufacturing method of a magnetron sputtering target according to claim 11, wherein the magnetic metal powder is not subjected to mixing by a ball mill.

38. The manufacturing method of a magnetron sputtering target according to claim 12, wherein the magnetic metal powder is not subjected to mixing by a ball mill.

* * * * *